US012610482B2

(12) United States Patent
David et al.

(10) Patent No.: US 12,610,482 B2
(45) Date of Patent: Apr. 21, 2026

(54) SYSTEMS AND METHODS FOR AUTONOMOUS INTERACTION OF AN INDUSTRIAL ROBOT WITH AN INDUSTRIAL MACHINE

(71) Applicant: ROCKWELL AUTOMATION TECHNOLOGIES, INC., Mayfield Heights, OH (US)

(72) Inventors: Chloe David, Milwaukee, WI (US); Alexander G. Brynildsen, Milwaukee, WI (US); Corey A. Peterson, Grafton, WI (US); Robert Dilgard, Shorewood, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 142 days.

(21) Appl. No.: 18/751,709

(22) Filed: Jun. 24, 2024

(65) Prior Publication Data

US 2025/0393142 A1 Dec. 25, 2025

(51) Int. Cl.
*B25J 9/00* (2006.01)
*H05K 5/02* (2006.01)

(52) U.S. Cl.
CPC .......... *H05K 5/0217* (2013.01); *B25J 9/0096* (2013.01); *H05K 5/0247* (2013.01)

(58) Field of Classification Search
None
See application file for complete search history.

(56) References Cited

U.S. PATENT DOCUMENTS 4,004,113 A      1/1977   Ericson
4,728,757 A  *   3/1988   Buxton ................ H02B 11/133
                                              200/50.21
(Continued)

FOREIGN PATENT DOCUMENTS

EP          3336553 B1     5/2020
EP          3971001 B1     1/2024
(Continued)

OTHER PUBLICATIONS

European Patent Office, "Communication pursuant to Rule 62 EPC, Extended Search Report", application No. 25184237.3 EPO, issued on Nov. 3, 2025 10 pages.
(Continued)

*Primary Examiner* — Xanthia C Relford

(57) ABSTRACT

A motor control cabinet (MCC), implemented in a motor control center, on which an operation is performable by an industrial robot (IR), comprising: a bucket placeable in a section of the MCC, the bucket is configured to contain industrial device(s) and is movable along an axis relative to the section; a first interfacing device (ID) associated with the bucket, the first ID is associated with a first operation and a second operation distinct from the first operation, the first ID is operable by the IR to perform the first operation or the second operation on the bucket; and a second ID associated with the bucket, the second ID is associated with a third operation and operable by the IR to perform the third operation on the bucket, an interface of the second ID and an interface of the first ID are compatible with a same end effector of the IR.

20 Claims, 29 Drawing Sheets

(56) References Cited

U.S. PATENT DOCUMENTS

| | | | | |
|---|---|---|---|---|
| 5,625,531 A * | 4/1997 | Padilla | .................... | H02B 1/26 |
| | | | | 361/825 |
| 6,315,512 B1 * | 11/2001 | Tabrizi | ............. | H01L 21/67781 |
| | | | | 414/217 |
| 7,000,911 B2 * | 2/2006 | McCormick | ............. | B25B 5/12 |
| | | | | 269/239 |
| 9,044,864 B2 * | 6/2015 | Manes | .................... | B25J 17/02 |
| 9,531,169 B2 * | 12/2016 | Oneufer | .................. | H02B 1/46 |
| 9,597,801 B2 * | 3/2017 | Morrill | .................... | B25J 5/02 |
| 9,758,305 B2 * | 9/2017 | Johnson | .............. | G05D 1/0276 |
| 10,935,980 B2 | 3/2021 | Mukherjee | | |
| 2007/0094535 A1 | 4/2007 | Prasee | | |
| 2008/0022673 A1 * | 1/2008 | Morris | ................... | F02D 29/06 |
| | | | | 60/431 |
| 2008/0023211 A1 * | 1/2008 | Yee | ........................ | H02P 31/00 |
| | | | | 174/50.52 |
| 2013/0231779 A1 | 9/2013 | Purkayastha | | |
| 2015/0103472 A1 * | 4/2015 | Oneufer | .................. | H02B 1/00 |
| | | | | 361/605 |
| 2015/0255966 A1 * | 9/2015 | Oneufer | .................. | H02B 1/32 |
| | | | | 361/631 |
| 2015/0382492 A1 * | 12/2015 | Oneufer | ............... | H05K 5/0226 |
| | | | | 312/295 |
| 2018/0083426 A1 * | 3/2018 | Ali | ........................ | H02B 11/133 |
| 2018/0083513 A1 * | 3/2018 | Pharne | ................... | H02K 11/30 |
| 2018/0152007 A1 * | 5/2018 | Kroushl | ................. | H02B 1/306 |
| 2019/0190240 A1 * | 6/2019 | Kroushl | ............... | A47B 46/005 |
| 2020/0101612 A1 | 4/2020 | Peterson | | |
| 2020/0328579 A1 | 10/2020 | Kroushl | | |
| 2023/0294918 A1 * | 9/2023 | Zheng | .................... | B25J 11/00 |
| 2024/0076904 A1 * | 3/2024 | Curry | ................. | E05B 47/0012 |

FOREIGN PATENT DOCUMENTS

| | | | |
|---|---|---|---|
| JP | 5310668 B2 | 10/2013 | |
| WO | 2020125972 A1 | 6/2020 | |
| WO | 2023108293 A1 | 6/2023 | |

OTHER PUBLICATIONS

European Patent Office, "Communication pursuant to Rule 62 EPC, Extended Search Report", application No. 25184265.4 EPO, issued on Oct. 28, 2025 9 pages.

* cited by examiner

SYSTEMS AND METHODS FOR AUTONOMOUS INTERACTION OF AN INDUSTRIAL ROBOT WITH AN INDUSTRIAL MACHINE

BACKGROUND

The present disclosure relates to interaction with an industrial machine. In a more particular example, the disclosure relates to technologies for enabling and facilitating autonomous interaction of an industrial robot with an industrial machine.

BRIEF DESCRIPTION

The following presents a simplified summary in order to provide a basic understanding of some aspects described herein. This summary is not an extensive overview nor is intended to identify key/critical elements or to delineate the scope of the various aspects described herein. The sole purpose of this summary is to present some concepts in a simplified form as a prelude to the more detailed description that is presented later.

In some embodiments, a motor control cabinet, implemented in a motor control center, on which an operation is performable by an industrial robot is provided. The motor control cabinet comprises: a bucket placeable in a section of the motor control cabinet, wherein the bucket is configured to contain one or more industrial devices and is movable along an axis relative to the section; a first interfacing device associated with the bucket, wherein the first interfacing device is associated with a first operation and a second operation distinct from the first operation, and the first interfacing device is operable by the industrial robot to perform the first operation or the second operation on the bucket; and a second interfacing device associated with the bucket, wherein the second interfacing device is associated with a third operation and operable by the industrial robot to perform the third operation on the bucket, and an interface of the second interfacing device and an interface of the first interfacing device are compatible with a same end effector of the industrial robot.

In some embodiments, a system comprising an industrial robot and a motor control cabinet is provided. The motor control cabinet, implemented in a motor control center, on which an operation is performable by the industrial robot includes: a bucket placeable in a section of the motor control cabinet, wherein the bucket is configured to contain one or more industrial devices and is movable along an axis relative to the section; a first interfacing device associated with the bucket, wherein the first interfacing device is associated with a first operation and a second operation distinct from the first operation, and the first interfacing device is operable by the industrial robot to perform the first operation or the second operation on the bucket; and a second interfacing device associated with the bucket, wherein the second interfacing device is associated with a third operation and operable by the industrial robot to perform the third operation on the bucket, and an interface of the second interfacing device and an interface of the first interfacing device are compatible with a same end effector of the industrial robot.

To the accomplishment of the foregoing and related ends, certain illustrative aspects are described herein in connection with the following description and the accompanying drawings. These aspects are indicative of various ways which can be practiced, all of which are intended to be covered herein. Other advantages and novel features may become apparent from the following detailed description when considered in conjunction with the drawings.

BRIEF DESCRIPTION OF THE DRAWINGS

The accompanying drawings illustrate various embodiments and are a part of the specification. The illustrated embodiments are merely examples and do not limit the scope of the disclosure. Throughout the drawings, identical or similar reference numbers designate identical or similar elements.

DETAILED DESCRIPTION

Figure 1:
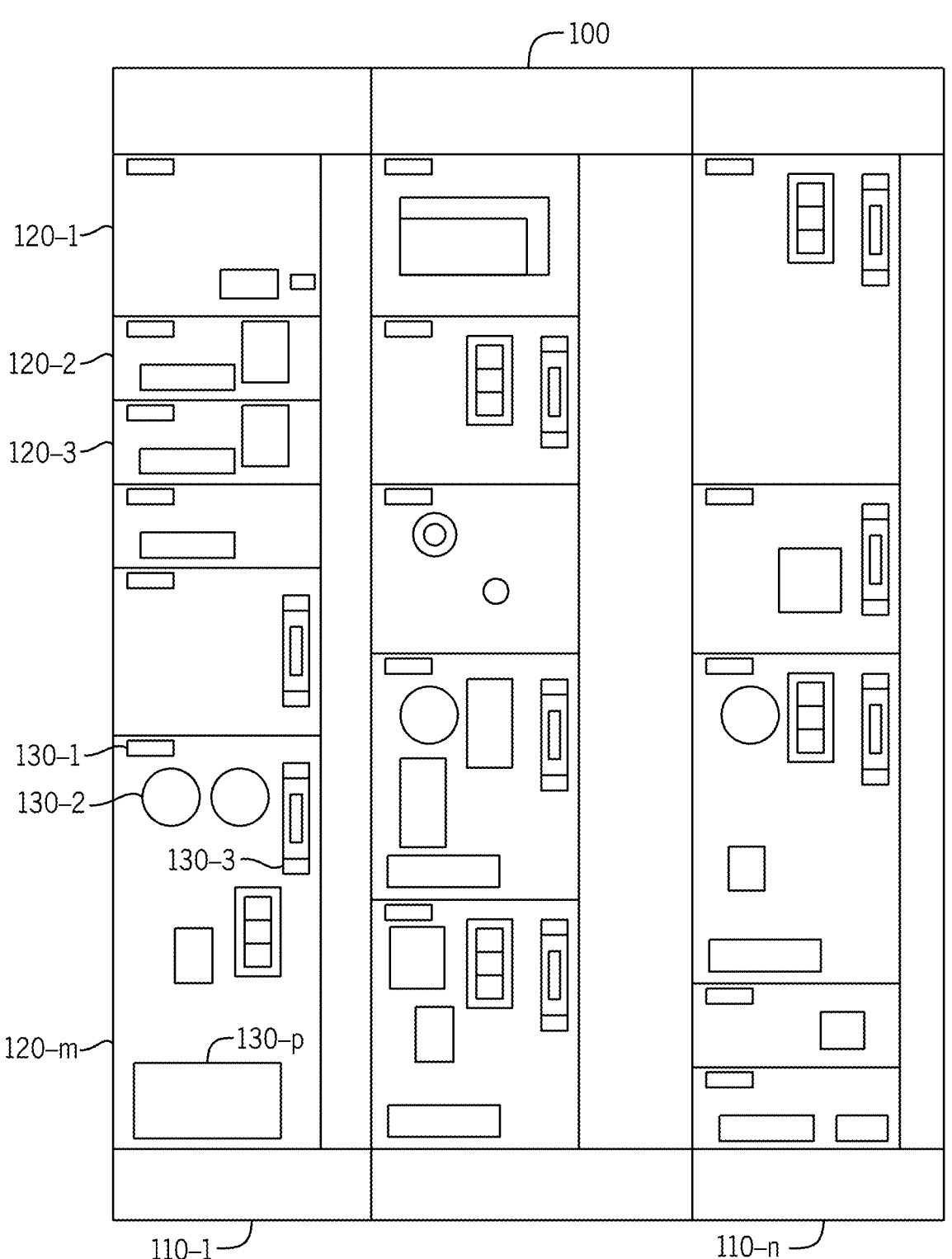
FIG. 1 illustrates an example motor control cabinet.

The present disclosure is now described with reference to the drawings. In the following description, specific details may be set forth for purposes of explanation. It should be understood that the present disclosure may be implemented without these specific details.

In this present disclosure, when elements of various embodiments are introduced, the articles "a," "an," "the," and "said" are intended to mean that there are one or more of the elements. The terms "comprising," "including," and "having" are intended to be inclusive and are intended to mean that there may be additional elements other than the listed elements. One or more embodiments of the present disclosure will be described below. In an effort to provide a concise description of these embodiments, all features of an actual implementation may not be described in the specification. It should be understood that in the development of any such actual implementation, as in any engineering or design project, numerous implementation-specific decisions may be made to achieve specific goals, such as compliance with system-related and business-related constraints, which may vary from one implementation to another. Moreover, it should be understood that such a development effort may be complex and time consuming, but would nevertheless be a routine undertaking of design, fabrication, and manufacture for those of ordinary skill having the benefit of this present disclosure.

Various aspects or features will be presented in terms of systems that may include a number of devices, components, modules, and the like. It should be understood that various systems may include additional devices, components, modules, etc. and/or may not include all of the devices, components, modules, etc. that are discussed with reference to the figures. A combination of these approaches may also be used.

Systems and methods for autonomous interaction of an industrial robot with an industrial machine are described herein. Today, robotic devices such as industrial robots may be used in an industrial environment to address a shortage of human workers and/or to avoid exposing human workers to safety hazards in interacting with industrial machines (e.g., industrial machines that have heavy components and/or sharp components, industrial machines that operate at high voltage, industrial machines that potentially generate arc flash during operation, etc.). However, industrial machines are often designed to be interacted with by a human worker and not by an industrial robot. Therefore, the interaction with an industrial machine usually requires an industrial robot that has multiple end effectors in which an end effector of the industrial robot is capable of performing specific actions to manipulate a specific component of the industrial machine. In addition, the interaction with the industrial machine usually requires the industrial robot to have a high number of axes of movement to avoid collision, a high payload capacity to provide support for a component of the industrial machine when moving the component of the industrial machine, etc. Thus, the industrial machine is generally incompatible with a typical robot and often requires an industrial robot that is specifically designed or customized to interact with the industrial machine. As a result, using the industrial robots to perform operations on the industrial machines is usually inflexible and expensive due to the need of specialized robots for different industrial machines.

Systems and methods described herein may implement an industrial machine or an industrial device such as a motor control cabinet in a motor control center in which an operation on the motor control cabinet is performable by an industrial robot. For example, the motor control cabinet may include one or more components and/or device features that are compatible with the industrial robot and/or capable of facilitating the industrial robot in interacting with the motor control cabinet. Therefore, the industrial robot may autonomously perform various operations on the motor control cabinet (e.g., disconnecting power to a bucket of the motor control cabinet, switching a bucket of the motor control cabinet to a different operation mode, unlocking a bucket latch of a bucket in a section of the motor control cabinet, removing a bucket from a section of the motor control cabinet, etc.) even if the industrial robot is a typical robot or a standard robot that is not specifically adapted to the motor control cabinet.

For example, as described herein, the motor control cabinet may include a bucket placeable in a section of the motor control cabinet, in which the bucket may be configured to contain one or more industrial devices and may be movable along an axis relative to the section of the motor control cabinet. Because the bucket may move along the axis between its opened position and its closed position in a translation motion, the industrial robot may move the bucket to the opened position to gain physical access to the objects stored in the bucket or move the bucket to the closed position to prevent physical access to the objects stored in the bucket with one degree of freedom (DOF). Accordingly, a number of DOF for the industrial robot to move the bucket to the opened position to open the bucket or to move the bucket to the closed position to close the bucket may be minimized as compared to other implementations in which the objects may be stored behind a hinged door and the industrial robot may open or close the hinged door that moves between its opened position and its closed position in a swing motion. As the number of DOF required for the industrial robot to move the bucket between the opened position of the bucket and the closed position of the bucket is minimized, the number of axes of movement associated with the industrial robot may be reduced. As a result, the structure and/or the configuration of the industrial robot may be simplified and the operations of the industrial robot may also be simplified.

As another example, the motor control cabinet may include a first interfacing device associated with the bucket, in which the first interfacing device is associated with a first operation and a second operation distinct from the first operation. As described herein, the first interfacing device may be operable by the industrial robot to perform the first operation or the second operation on the bucket. Accordingly, the industrial robot may interact with the same interfacing device to perform different operations on the bucket, and thus a number of interfacing devices to be operated by the industrial robot on the motor control cabinet may be reduced.

As another example, the motor control cabinet may include a second interfacing device associated with the bucket, in which the second interfacing device is associated with a third operation and is operable by the industrial robot to perform the third operation on the bucket. As described herein, an interface of the second interfacing device and an interface of the first interfacing device may be compatible with a same end effector of the industrial robot. Accordingly, the industrial robot may use the same end effector to operate the first interfacing device and the second interfacing device without switching between different end effectors. As a result, the structure and/or the configuration of the industrial robot may be simplified and the operations of the industrial robot may also be simplified.

It should be understood that the components and/or device features described above are merely example aspects of the motor control cabinet and other aspects may also be implemented on the motor control cabinet as described herein.

The systems and methods described herein may be advantageous in a number of technical respects. For example, as described above, the industrial machine such as the motor control cabinet may include one or more components and/or device features that are compatible with the industrial robot and/or capable of facilitating the industrial robot in performing various operations on the motor control cabinet. In particular, the components and/or device features implemented on the motor control cabinet may reduce a number of DOF required to perform a particular operation on the motor control cabinet, reduce reaction forces and torques to be provided by the industrial robot, increase a tolerance for misalignment to reduce an accuracy requirement for the industrial robot in interacting with the motor control cabinet, reduce a number of actions required to complete a particular operation on the motor control cabinet (e.g., rotating a bucket latch instead of simultaneously pressing and rotating the bucket latch to unlock the bucket latch of a bucket in the motor control cabinet), etc. As a result of these implementations, the motor control cabinet may be compatible with the industrial robot and various operations may be autonomously performed on the motor control cabinet by the industrial robot, even if the industrial robot is a typical robot or a standard robot that has a relatively low level of accuracy and is not specifically adapted to the motor control cabinet. Accordingly, the industrial robot may be used in place of human workers to perform different operations (e.g., maintenance operations, etc.) on the motor control cabinet, thereby addressing the shortage of human workers and eliminating a risk of exposing human workers to safety hazards in interacting with the motor control cabinet. In addition, as the industrial robot may be used to interact with the motor control cabinet without the need to specifically design or customize the industrial robot based on the motor control cabinet, the cost of using the industrial robot to perform the operations on the motor control cabinet may be decreased and the flexibility in using the industrial robot to perform the operations on the motor control cabinet may be increased.

It should be understood that while the implementations in the present disclosure are described in the context of the motor control cabinet, these implementations may also be applicable to other industrial machines to facilitate the interaction of the industrial robot with these industrial machines. Accordingly, the operations on these industrial machines may be autonomously performed by the industrial robot.

Various illustrative embodiments will now be described in detail with reference to the figures. It should be understood that the illustrative embodiments described below are provided as examples and that other examples not explicitly described herein may also be captured by the scope of the claims set forth below. The systems and methods described herein may provide any of the benefits mentioned above, as well as various additional and/or alternative benefits that will be described and/or made apparent below.

FIG. 1 illustrates an example industrial machine in which one or more operations on the industrial machine are performable by an industrial robot. For example, FIG. 1 depicts an example motor control cabinet (MCC) 100 that is implemented in a motor control center of an industrial system to control multiple electric motors of the industrial system at a central location. As depicted in FIG. 1, the MCC 100 may include one or more sections 110-1 . . . 110-n (commonly referred to herein as sections 110). Each section 110 may be isolated from other sections 110 and may contain one or more industrial devices (e.g., motor starters, circuit breakers, programmable logic controllers (PLCs), etc.) that are used to manage operations of one or more electric motors in the industrial system.

In some embodiments, a section 110 of the MCC 100 may be divided into one or more compartments 120-1 . . . 120-m (commonly referred to herein as compartments 120) as depicted in FIG. 1. Each compartment 120 may include one or more interfacing devices 130-1 . . . 130-p (commonly referred to herein as interfacing devices 130) that are positioned on a front surface of the compartment 120 or inside the compartment 120. The interfacing devices 130 associated with the compartment 120 may include one or more switches, one or more buttons, one or more handles, one or more levers, and/or other types of interfacing devices and may be operated or manipulated to perform various operations on the compartment 120. Non-limiting examples of the operations that are performable on the compartment 120 using the interfacing devices 130 include, but are not limited to, disconnecting power to the compartment 120, unlocking a latch of the compartment 120, opening or closing a door of the compartment 120, switching an operation mode of the compartment 120, etc. Other types of operations are also possible and contemplated.

In some embodiments, a compartment 120 in the section 110 of the MCC 100 may be implemented in the form of a bucket that is placeable in the section 110. The bucket may be configured to contain one or more objects such as one or more industrial devices and may be movable along an axis relative to the section 110. As an example, the compartment 120 may not be implemented with a front door coupled to a housing body via a hinge to create an enclosed space for storing various objects (e.g., industrial devices). In this implementation, the front door may move between its closed position and its opened position in a swing motion, in which the objects stored in the compartment 120 may be inaccessible when the front door is at its closed position and may be accessible when the front door is at its opened position. Instead, the compartment 120 may be implemented with a front panel permanently attached to other panels to form a bucket that is similar to a cabinet drawer in which various objects (e.g., industrial devices) may be stored and the bucket may slide along an axis relative to the section 110 between its closed position and its opened position. Accordingly, the bucket may move along the axis between its closed position and its opened position in a translation motion, in which the objects stored in the bucket may be inaccessible when the bucket is at its closed position and may be accessible when the bucket is at its opened position. In some embodiments, the bucket may have a front surface in which the front surface of the bucket may be located at a front side of the MCC 100 when the bucket is placed in the section 110 of the MCC 100. Similarly, the section 110 of the MCC 100 may have a front surface located at the front side of the MCC 100.

Figure 2A:
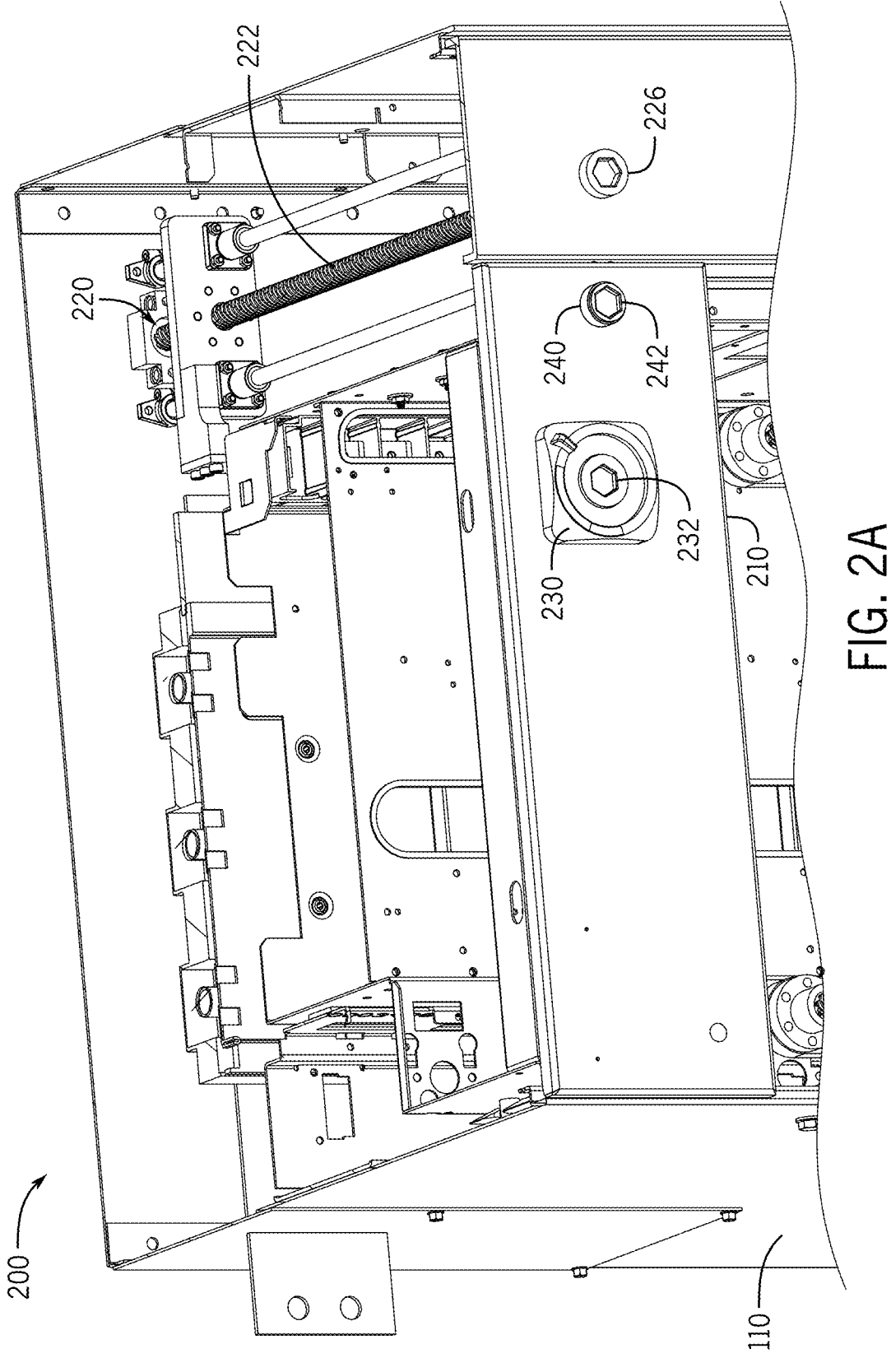
FIGS. 2A and 2B illustrate an example bucket of a motor control cabinet.
Figure 2B:
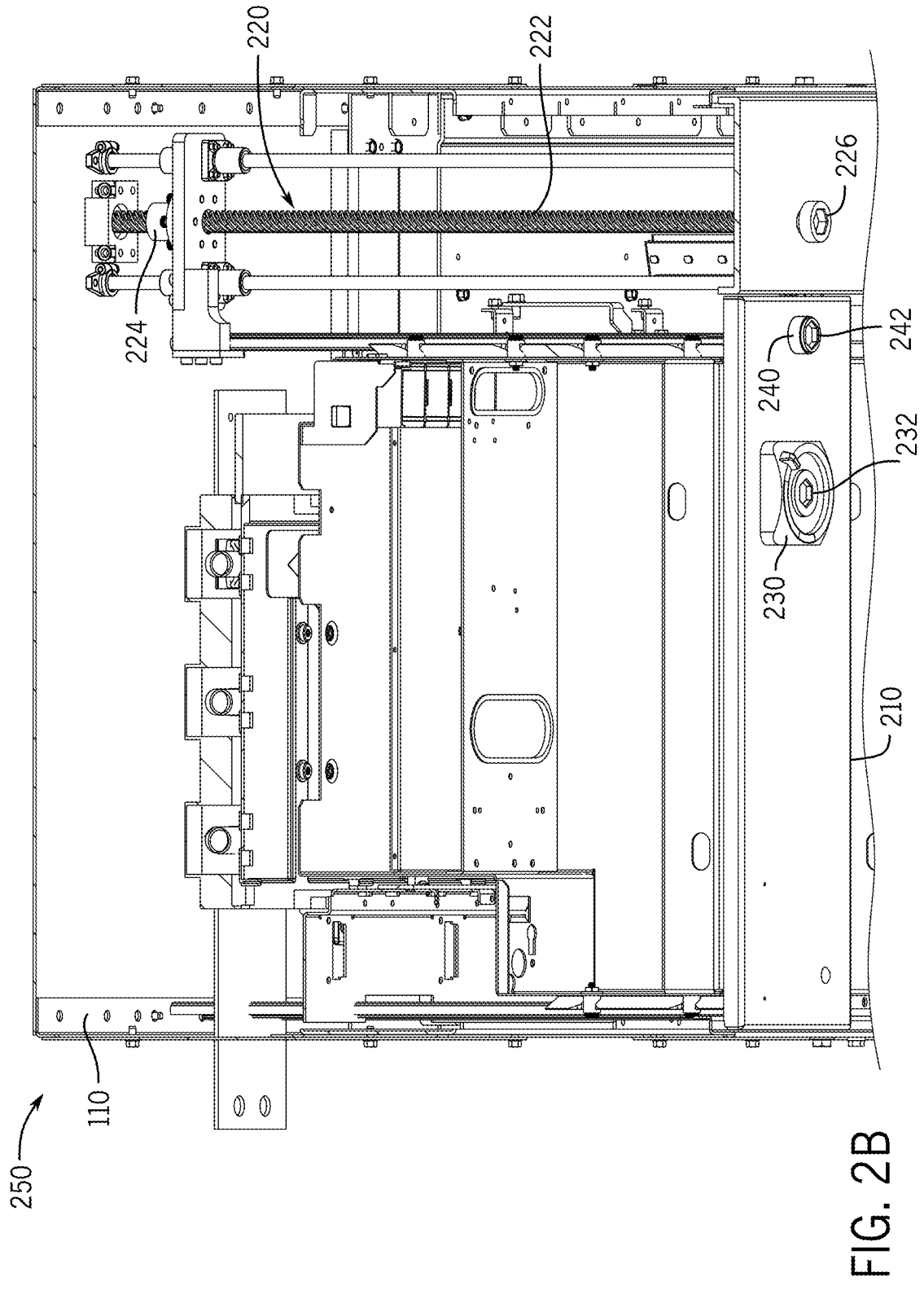

An example bucket 210 associated with the section 110 of the MCC 100 is illustrated in FIGS. 2A and 2B. As depicted in diagrams 200 and 250 of FIGS. 2A and 2B, the bucket 210 may be placeable in the section 110 and may be coupled to a leadscrew 220. The leadscrew 220 may include a screw shaft 222 coupled to a nut 224 and the nut 224 may be securely attached to the bucket 210 as depicted in FIG. 2B. In some embodiments, the screw shaft 222 may include a screw head 226 at a distal end of the screw shaft 222. As depicted in FIGS. 2A and 2B, the leadscrew 220 may be positioned within the section 110 with the screw head 226 of the screw shaft 222 being disposed at the front surface of the section 110. In some embodiments, the screw head 226 may be used as an interfacing device 130 that an industrial robot may operate or manipulate. For example, the industrial robot may couple its end effector (or a tool device such as a screwdriver) that is compatible with the screw head 226 to the screw head 226, and rotate the end effector to rotate the screw head 226 and the screw shaft 222 in the same rotation direction as the end effector. Due to the rotation of the screw shaft 222, the nut 224 coupled to the screw shaft 222 may translate along the screw shaft 222 in a forward direction or a backward direction depending on the rotation direction (e.g., a clockwise direction or a counterclockwise direction) of the screw shaft 222. As the nut 224 moves along the screw shaft 222 in the translation motion, the nut 224 may move the bucket 210 that is securely attached to the nut 224 in the same direction (e.g., the forward direction or the backward direction). Accordingly, by rotating the screw head 226 to rotate the screw shaft 222 of the leadscrew 220, the industrial robot may cause the bucket 210 to move forward or backward relative to the section 110 in the translation motion along an axis, in which the axis may be parallel to the screw shaft 222 of the leadscrew 220 and perpendicular to a vertical edge of the section 110. Thus, the industrial robot may move the bucket 210 along the axis relative to the section 110 with one degree of freedom (DOF).

In some embodiments, instead of operating the leadscrew 220 to move the bucket 210 along the axis relative to the section 110 as described above, the industrial robot may securely couple its end effector (or a tool device) to the bucket 210 and move the end effector in a translation motion to move the bucket 210 along the axis relative to the section 110. For example, the industrial robot may use an end effector that includes a magnet and securely attach the end effector to the front surface of the bucket 210 using a magnetic force. Additionally or alternatively, the industrial robot may use an end effector to grasp and latch on a handle located on the front surface of the bucket 210. After the end effector is securely coupled to the bucket 210, the industrial robot may move the end effector forward or backward in a straight movement to move the bucket 210 along the axis relative to the section 110 in the translation motion. Thus, the industrial robot may move the bucket 210 along the axis relative to the section 110 with one DOF.

Thus, as described above, with the compartment 120 associated with the section 110 of the MCC 100 being implemented in the form of a bucket such as the bucket 210, the industrial robot may move the bucket 210 along the axis relative to the section 110 in the translation motion with one DOF. Accordingly, the number of DOF for the industrial robot to move the bucket 210 between the closed position of the bucket 210 and the opened position of the bucket 210 in the translation motion may be minimized, as compared to the implementation in which the compartment 120 includes the front door that moves around the hinge and multiple DOF are required for the industrial robot to move the front door between the closed position of the front door and the opened position of the front door in the swing motion. By implementing the compartment 120 in the form of a bucket such as the bucket 210 to reduce the number of DOF required to open or close the bucket 210, the number of axes of movement associated with the industrial robot may be reduced. As a result, the structure and/or the configuration of the industrial robot may be simplified and the operations of the industrial robot may also be simplified.

Figure 3A:
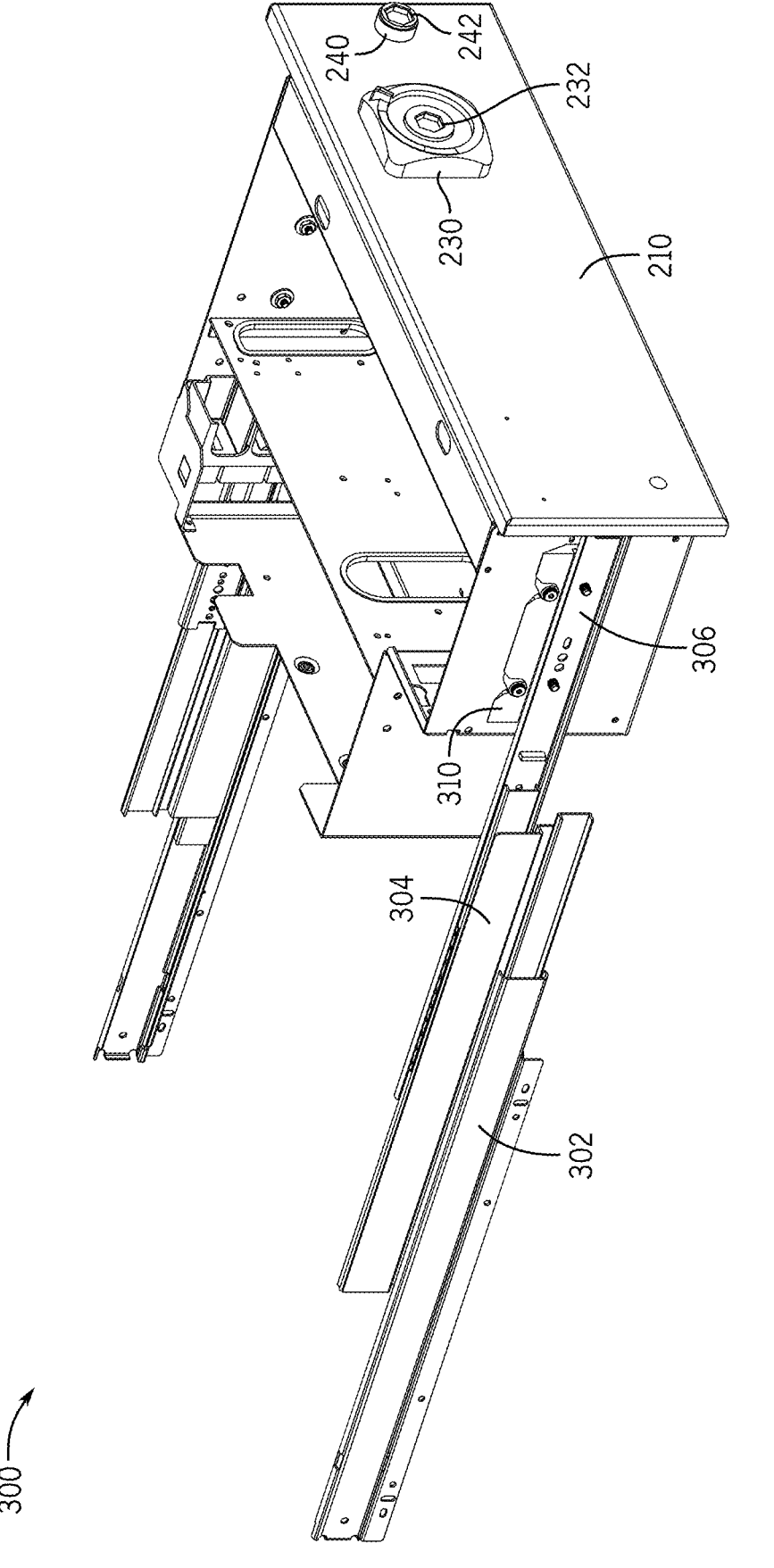
FIGS. 3A and 3B illustrate an example bucket and example slider bearings of a motor control cabinet.
Figure 3B:
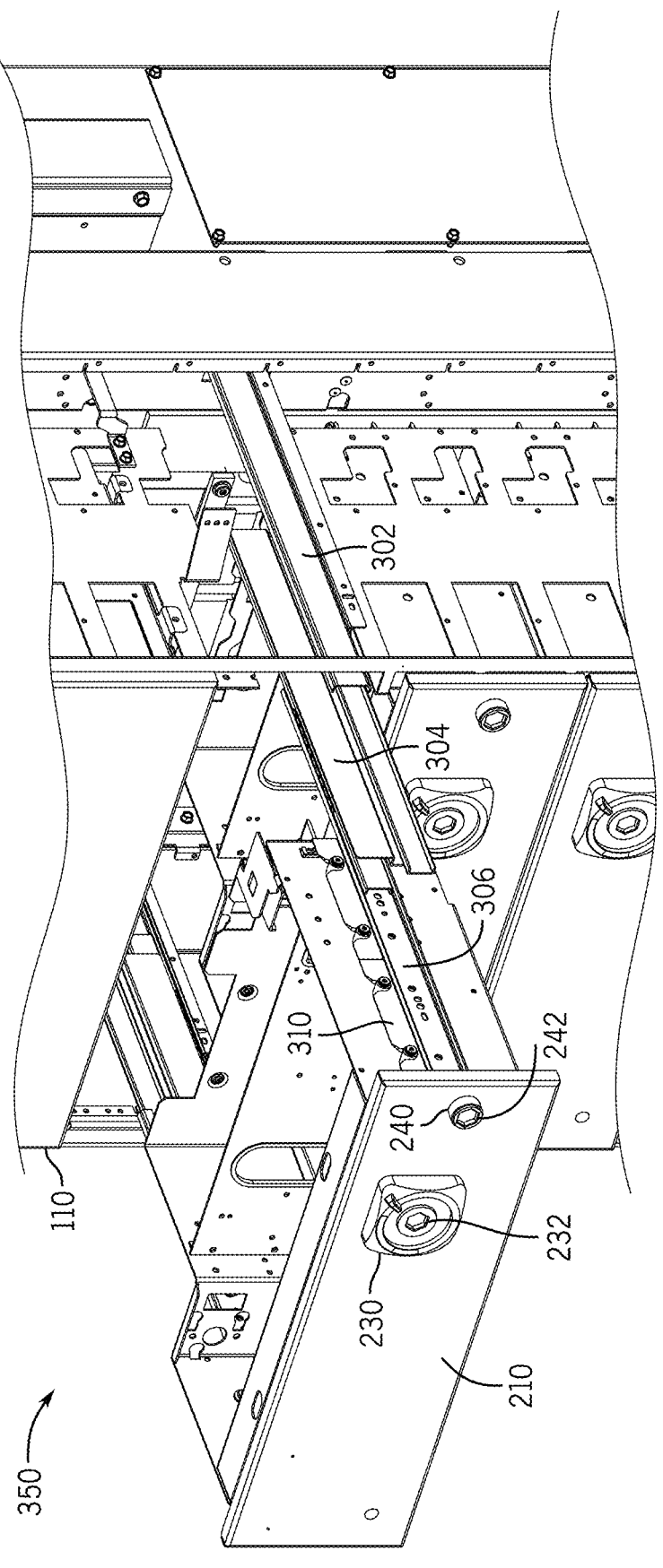

In some embodiments, to facilitate the translation motion of the bucket 210 along the axis relative to the section 110 when the industrial robot moves the bucket 210 and to provide support for the bucket 210 when at least a portion of the bucket 210 is located outside the section 110, the MCC 100 may include one or more slider bearings. Example slider bearings implemented in the MCC 100 are illustrated in FIGS. 3A and 3B. As depicted in diagrams 300 and 350 of FIGS. 3A and 3B, the MCC 100 may include a first slider bearing and a second slider bearing. In some embodiments, the first slider bearing may include a first slide 302 that is securely mounted to the section 110 of the MCC 100. For example, the first slide 302 of the first slider bearing may be securely attached to a wall of the section 110. The first slider bearing may also include a second slide 304 that is slidable along the first slide 302 of the first slider bearing. In some embodiments, the second slider bearing may include the second slide 304 of the first slider bearing and a third slide 306 that is slidable along the second slide 304 of the first slider bearing. Thus, the first slider bearing and the second slider bearing may have the second slide 304 in common. As depicted in FIGS. 3A and 3B, the third slide 306 of the second slider bearing may include a bucket receiving extension 310 that is configured to receive the bucket 210.

In some embodiments, in addition to the first slider bearing and the second slider bearing, the MCC 100 may also include a third slider bearing and a fourth slider bearing that are respectively similar to the first slider bearing and the second slider bearing. In particular, the third slider bearing may include a first slide that is similar to the first slide 302 of the first slider bearing and the first slide may be securely mounted to the section 110 of the MCC 100. For example, the first slide of the third slider bearing may be securely attached to an opposite wall of the section 110. The third slider bearing may also include a second slide that is similar to the second slide 304 of the first slider bearing and the second slide may be slidable along the first slide of the third slider bearing. In some embodiments, similar to the second slider bearing, the fourth slider bearing may include the second slide of the third slider bearing and a third slide that is slidable along the second slide of the third slider bearing. Thus, the third slider bearing and the fourth slider bearing may have the second slide in common. In some embodiments, the third slide of the fourth slider bearing may be similar to the third slide 306 of the second slider bearing and may include an additional bucket receiving extension 310 that is configured to receive the bucket 210. The first slide, the second slide, and the third slide of the third slider bearing and the fourth slider bearing may be referred to herein as the first slide 302, the second slide 304, and the third slide 306 of the third slider bearing and the fourth slider bearing. The bucket receiving extension 310 implemented on the third slide 306 of the second slider bearing may be referred herein to as the bucket receiving extension 310 of the second slider bearing, and the additional bucket receiving extension 310 implemented on the third slide 306 of the fourth slider bearing may be referred to herein as the additional bucket receiving extension 310 of the fourth slider bearing.

In some embodiments, when the bucket 210 is placed in the bucket receiving extension 310 implemented on the third slide 306 of the second slider bearing and in the additional bucket receiving extension 310 implemented on the third slide 306 of the fourth slider bearing, the first slider bearing and the second slider bearing may be located on a first side of the bucket 210 while the third slider bearing and the fourth slider bearing may be located on a second side of the bucket 210 as depicted in FIGS. 3A and 3B. As described above, the first slider bearing and the second slider bearing may couple to one another via the second slide 304 that is in common between the first slider bearing and the second slider bearing, and the first slider bearing may include the first slide 302 that is securely attached to the wall of the section 110. Similarly, the third slider bearing and the fourth slider bearing may couple to one another via the second slide 304 that is in common between the third slider bearing and the fourth slider bearing, and the third slider bearing may include the first slide 302 that is securely attached to the opposite wall of the section 110. Accordingly, when the bucket 210 is placed in the bucket receiving extension 310 implemented on the third slide 306 of the second slider bearing and in the additional bucket receiving extension 310 implemented on the third slide 306 of the fourth slider bearing, the first slider bearing and the second slider bearing located on the first side of the bucket 210 together with the third slider bearing and the fourth slider bearing located on the second side of the bucket 210 may provide support to the bucket 210 when at least a portion of the bucket 210 is located outside of the section 110. This implementation is advantageous, because it eliminates the need for the industrial robot to support a portion of the weight of the bucket 210 or the entire weight of the bucket 210 when the industrial robot moves the bucket 210 relative to the section 110 and a portion of the bucket 210 or the entire bucket 210 is located outside of the section 110.

As described above, the bucket 210 may be placed in the bucket receiving extension 310 implemented on the third slide 306 of the second slider bearing and in the additional bucket receiving extension 310 implemented on the third slide 306 of the fourth slider bearing, and the industrial robot may couple its end effector (or a tool device) to the bucket 210 and move the bucket 210 along the axis relative to the section 110. For example, the industrial robot may move the bucket 210 forward or backward relative to the section 110. When the industrial robot moves the bucket 210 forward relative to the section 110, the industrial robot may move the bucket 210 away from the section 110. When the industrial robot moves the bucket 210 backward relative to the section 110, the industrial robot may move the bucket 210 towards the section 110.

In some embodiments, when the industrial robot moves the bucket 210 forward relative to the section 110, with regards to the first slider bearing and the second slider bearing, the forward movement of the bucket 210 may cause the third slide 306 that includes the bucket receiving extension 310 in which the bucket 210 is placed to slide forward relative to the second slide 304. When the third slide 306 reaches its sliding threshold and no longer slides forward, the forward movement of the bucket 210 may cause the second slide 304 to slide forward relative to the first slide 302. Similarly, when the industrial robot moves the bucket 210 backward relative to the section 110, with regards to the first slider bearing and the second slider bearing, the backward movement of the bucket 210 may cause the third slide 306 that includes the bucket receiving extension 310 in which the bucket 210 is placed to slide backward relative to the second slide 304. When the third slide 306 reaches its sliding threshold and no longer slides backward, the backward movement of the bucket 210 may cause the second slide 304 to slide backward relative to the first slide 302.

In some embodiments, when the industrial robot moves the bucket 210 forward or backward relative to the section 110, the third slider bearing and the fourth slider bearing may operate in a manner similar to the manner in which the first slider bearing and the second slider bearing operate as described above. In some embodiments, the sliding of the slides that are associated with the first slider bearing and the second slider bearing and the sliding of the slides that are associated with the third slider bearing and the fourth slider bearing as described above may eliminate the need for the industrial robot to guide the bucket 210 with a specific angle to avoid the bucket 210 being stuck when the industrial robot moves the bucket 210 relative to the section 110. As a result, the operations of the industrial robot to move the bucket 210 forward or backward relative to the section 110 may be simplified.

Figure 4:
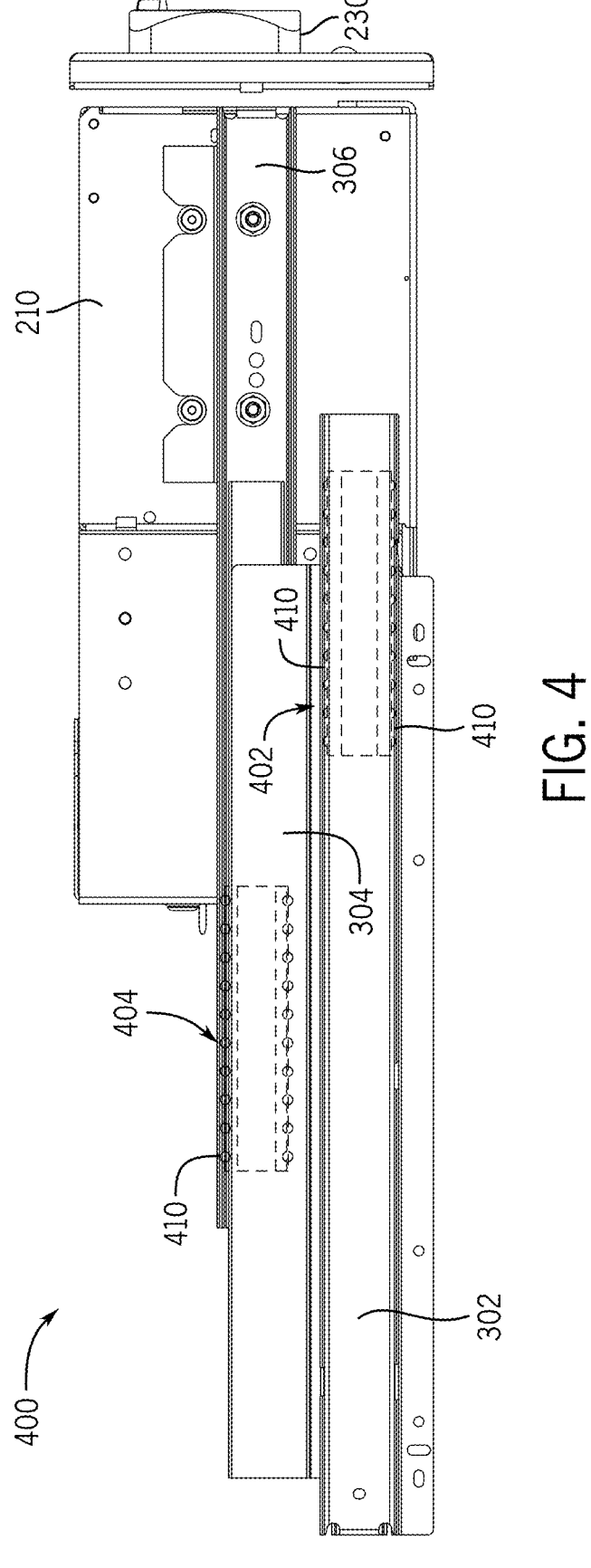
FIG. 4 illustrates example slider bearings of a motor control cabinet with a cross-section view of a portion of each slider bearing.

In some embodiments, the first slider bearing and the second slider bearing may include one or more roller bearings. For example, FIG. 4 shows a diagram 400 illustrating the first slider bearing and the second slider bearing with a cross-section view of a portion 402 of the first slider bearing and a cross-section view of a portion 404 of the second slider bearing. As depicted in FIG. 4, the first slider bearing may include one or more roller bearings 410 positioned between the first slide 302 and the second slide 304 of the first slider bearing. The one or more roller bearings 410 may be in physical contact with the first slide 302 and the second slide 304 of the first slider bearing to reduce friction when the industrial robot moves the bucket 210 and the first slide 302 and the second slide 304 move relative to one another. Similarly, the second slider bearing may include one or more additional roller bearings 410 positioned between the second slide 304 and the third slide 306 of the second slider bearing. The one or more additional roller bearings 410 may be in physical contact with the second slide 304 and the third slide 306 of the second slider bearing to reduce friction when the industrial robot moves the bucket 210 and the second slide 304 and the third slide 306 move relative to one another. As a result, the reaction force provided by the industrial robot to move the bucket 210 forward or backward relative to the section 110 may be reduced. In some embodiments, instead of or in addition to the roller bearings 410, the first slider bearing and the second slider bearing may include one or more ball bearings and/or other types of mechanical bearings that are capable of reducing friction. In some embodiments, similar to the first slider bearing and the second slider bearing, the third slider bearing and the fourth slider bearing may also include the roller bearings, the ball bearings, and/or other types of mechanical bearings that are capable of reducing friction as described above.

In some embodiments, other implementations may also apply to the MCC 100 to reduce the weight and/or optimize the center of gravity for the bucket 210 and/or other components of the MCC 100. For example, the bucket 210 associated with the MCC 100 may be made of lightweight material to reduce the weight of the bucket 210. As a result, the reaction forces and/or torques provided by the industrial robot to support the bucket 210 or to transport the bucket 210 between various locations may be reduced.

In some embodiments, to transport the bucket 210 that is in the section 110 of the MCC 100 to a different location, the industrial robot may couple its end effector (or a tool device) to the bucket 210 and move the bucket 210 forward relative to the section 110 to a position outside of the section 110 in the manner described above. At this position, the bucket 210 that is placed in the bucket receiving extension 310 of the second slider bearing and the additional bucket receiving extension 310 of the fourth slider bearing may be located partially or entirely outside of the section 110 and may be supported by the first slider bearing and the second slider bearing and by the third slider bearing and the fourth slider bearing. Thus, the weight of the bucket 210 may be supported by these slider bearings and not by the industrial robot. In some embodiments, when the bucket 210 is located partially or entirely outside of the section 110 and is supported by these slider bearings, the industrial robot may remove the bucket 210 from the bucket receiving extension 310 and the additional bucket receiving extension 310. For example, the industrial robot may lift the bucket 210 up to remove the bucket 210 from the bucket receiving extension 310 and the additional bucket receiving extension 310 using a forklift device. The industrial robot may then transport the bucket 210 to a different location.

Similarly, to place the bucket 210 in the section 110 of the MCC 100, the industrial robot may use the forklift device to lower the bucket 210 down into the bucket receiving extension 310 and the additional bucket receiving extension 310 at the position outside of the section 110. Once the bucket 210 is placed in the bucket receiving extension 310 and the additional bucket receiving extension 310, the bucket 210 may be supported by the first slider bearing and the second slider bearing and by the third slider bearing and the fourth slider bearing. At this point, the bucket 210 may be located partially or entirely outside of the section 110 and the industrial robot may couple its end effector (or a tool device) to the bucket 210 and move the bucket 210 backward relative to the section 110 in the manner described above to place the bucket 210 in the section 110.

Figure 5A:
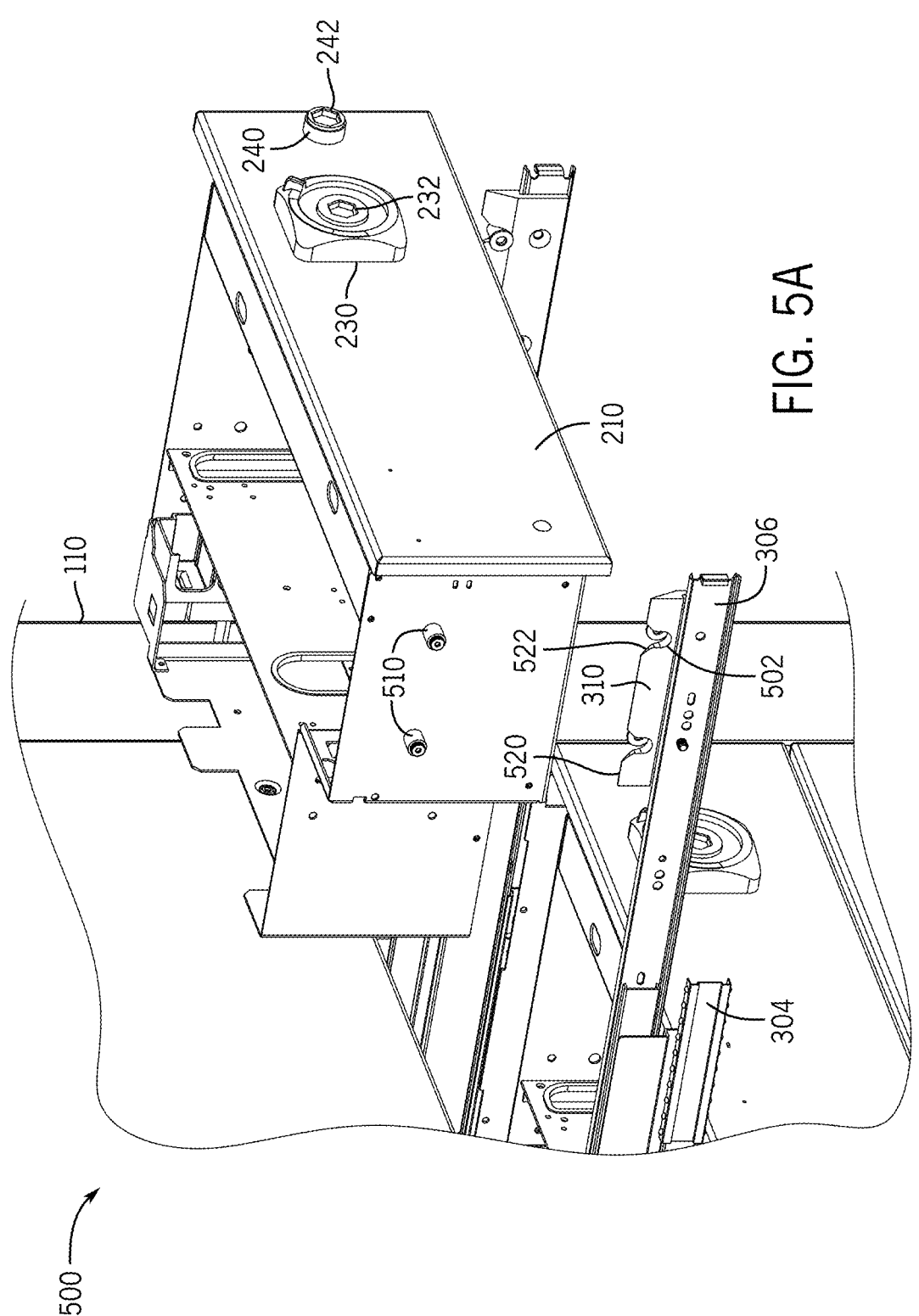
FIG. 5A illustrates an example bucket receiving panel and an example bucket from a first perspective when the bucket is not placed in the bucket receiving panel.
Figure 5B:
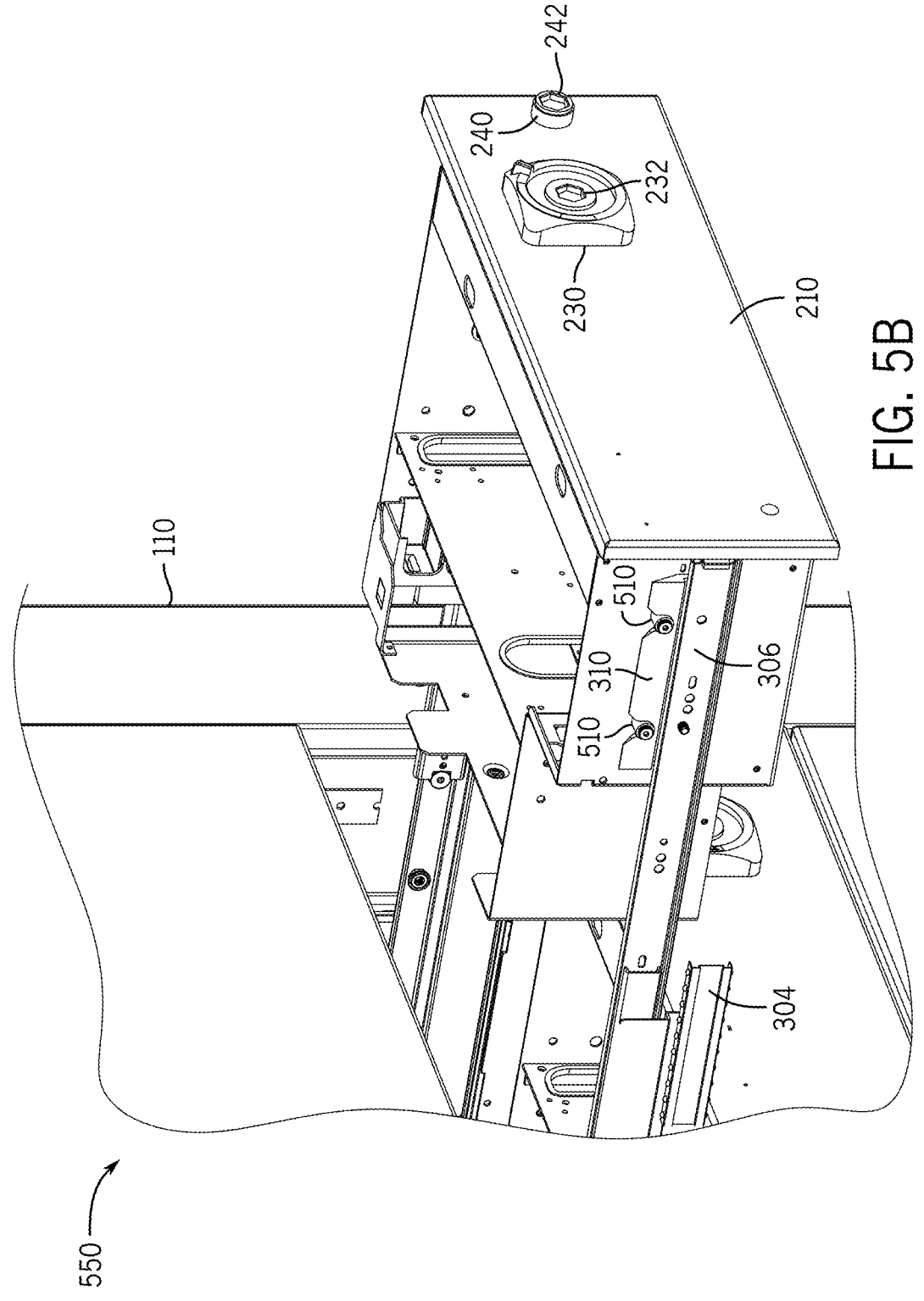
FIG. 5B illustrates an example bucket receiving panel and an example bucket from a first perspective when the bucket is placed in the bucket receiving panel.

FIGS. 5A and 5B illustrate the bucket 210 and an example bucket receiving extension 310. As depicted in diagrams 500 and 550 of FIGS. 5A and 5B, the bucket 210 may include one or more protrusions 510 positioned on the first side of the bucket 210. The bucket receiving extension 310 may include one or more slots 502 in which each slot 502 is corresponding to a protrusion 510 on the first side of the bucket 210 and is configured to receive the protrusion 510 of the bucket 210 when the bucket 210 is placed in the bucket receiving extension 310. In some embodiments, each slot 502 of the bucket receiving extension 310 may include an alignment feature that is configured to increase a tolerance for misalignment between the protrusion 510 and the slot 502 corresponding to the protrusion 510 when the bucket 210 is placed in the bucket receiving extension 310. For example, as depicted in FIG. 5A, the alignment feature implemented for the slot 502 may include one or more of a chamfer 520 and a fillet 522 created at a corner between an upper edge of the bucket receiving extension 310 and a vertical edge of the slot 502.

In some embodiments, when the industrial robot places the bucket 210 in the bucket receiving extension 310, a protrusion 510 of the bucket 210 may be misaligned with a slot 502 corresponding to the protrusion 510 due to the inaccuracy in the operations of the industrial robot and the protrusion 510 of the bucket 210 may be in contact with the alignment feature of the slot 502 on the bucket receiving extension 310. In some embodiments, when the protrusion 510 of the bucket 210 is in contact with the alignment feature of the slot 502 on the bucket receiving extension 310, the alignment feature (e.g., the chamfer 520 and/or the fillet 522) of the slot 502 may guide the protrusion 510 of the bucket 210 to a position within the slot 502 of the bucket receiving extension 310, thereby correcting the misalignment between the protrusion 510 of the bucket 210 and the slot 502 of the bucket receiving extension 310. This implementation is advantageous, because it increases the tolerance for misalignment between the protrusion 510 of the bucket 210 and the corresponding slot 502 on the bucket receiving extension 310 when the industrial robot places the bucket 210 in the bucket receiving extension 310. As a result, the accuracy requirement for the industrial robot in placing the bucket 210 in the bucket receiving extension 310 may be reduced. FIG. 5B illustrates the bucket 210 when the bucket 210 is placed in the bucket receiving extension 310 with the protrusions 510 of the bucket 210 located in the corresponding slots 502 of the bucket receiving extension 310.

In some embodiments, similar to the one or more protrusions 510 positioned on the first side of the bucket 210, the bucket 210 may include one or more protrusions 510 positioned on the second side of the bucket 210. The second side of the bucket 210 may be opposite to the first side of the bucket 210. In some embodiments, similar to the bucket receiving extension 310 of the second slider bearing as described above, the additional bucket receiving extension 310 of the fourth slider bearing may include one or more slots 502 that are configured to receive the one or more protrusions 510 positioned on the second side of the bucket 210. Thus, the bucket receiving extension 310 of the second slider bearing may include the slots 502 that are configured to receive the protrusions 510 positioned on the first side of the bucket 210, and the additional bucket receiving extension 310 of the fourth slider bearing may include the slots 502 that are configured to receive the protrusions 510 positioned on the second side of the bucket 210. In some embodiments, each slot 502 of the additional bucket receiving extension 310 may include an alignment feature (e.g., a chamfer and/or a fillet) that is similar to the alignment feature implemented for each slot 502 of the bucket receiving extension 310. The alignment feature implemented for each slot 502 of the additional bucket receiving extension 310 may operate in a manner similar to the manner in which the alignment feature implemented for each slot 502 of the bucket receiving extension 310 operates as described above.

Figure 6A:
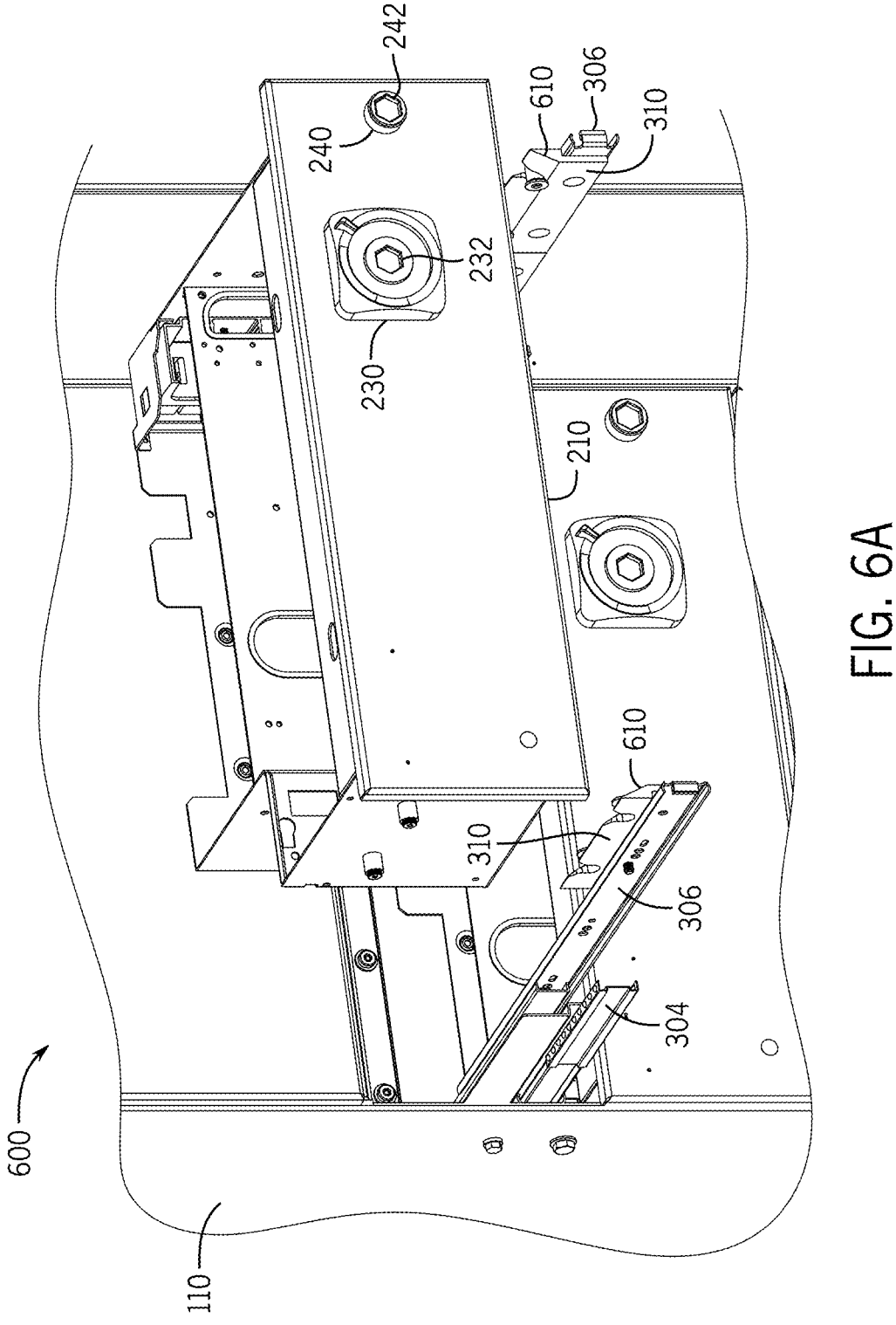
FIG. 6A illustrates example bucket receiving panels and an example bucket from a second perspective when the bucket is not placed in the bucket receiving panels.

In some embodiments, in addition to the alignment feature implemented for the slot 502, the bucket receiving extension 310 may include a different alignment feature that is configured to increase a tolerance for misalignment between the bucket 210 and a gap between the bucket receiving extension 310 and the additional bucket receiving extension 310. An example of the different alignment feature implemented on the bucket receiving extension 310 is illustrated in FIG. 6A. As depicted in a diagram 600 of FIG. 6A, the different alignment feature may include a chamfer 610 created on an inner edge of the bucket receiving extension 310. The additional bucket receiving extension 310 may also include a similar alignment feature created on an inner edge of the additional bucket receiving extension 310. As depicted in FIG. 6A, the inner edge of the bucket receiving extension 310 and the inner edge of the additional bucket receiving extension 310 may be opposite to one another.

Figure 6B:
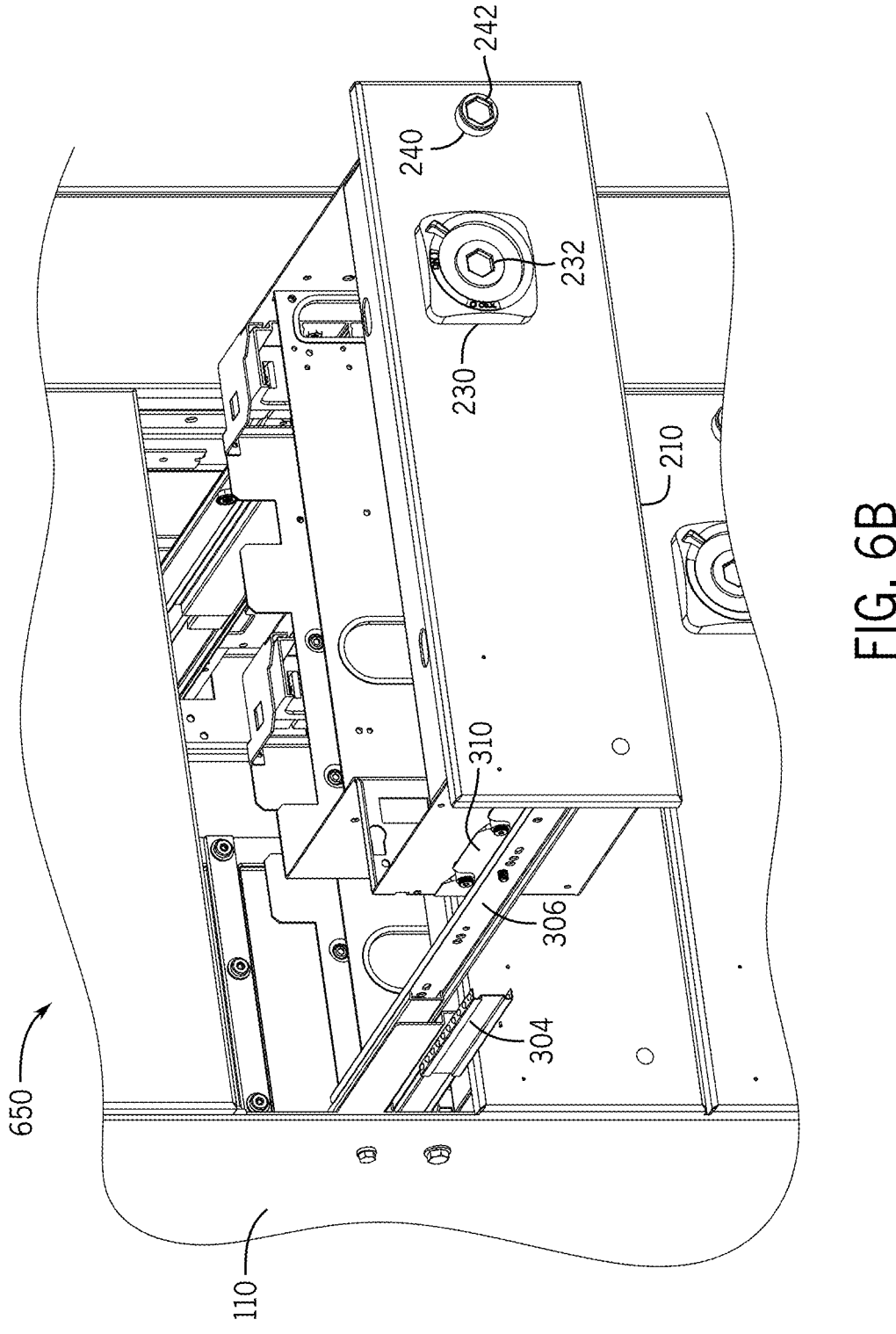
FIG. 6B illustrates example bucket receiving panels and an example bucket from a second perspective when the bucket is placed in the bucket receiving panels.

In some embodiments, when the industrial robot places the bucket 210 in the bucket receiving extension 310 and the additional bucket receiving extension 310, the bucket 210 may be misaligned with the gap between the bucket receiving extension 310 and the additional bucket receiving extension 310 due to the inaccuracy in the operations of the industrial robot and the bucket 210 may be in contact with the different alignment feature of the bucket receiving extension 310. In some embodiments, when the bucket 210 is in contact with the different alignment feature of the bucket receiving extension 310, the different alignment feature (e.g., the chamfer 610) of the bucket receiving extension 310 may guide the bucket 210 to a position between the bucket receiving extension 310 and the additional bucket receiving extension 310 to fit the bucket 210 in the gap between the bucket receiving extension 310 and the additional bucket receiving extension 310, thereby correcting the misalignment between the bucket 210 and the gap between the bucket receiving extension 310 and the additional bucket receiving extension 310. This implementation is advantageous, because it increases the tolerance for misalignment between the bucket 210 and the gap between the bucket receiving extension 310 and the additional bucket receiving extension 310 when the industrial robot places the bucket 210 in the bucket receiving extension 310 and the additional bucket receiving extension 310. As a result, the accuracy requirement for the industrial robot in placing the bucket 210 in the bucket receiving extension 310 and the additional bucket receiving extension 310 may be reduced. As described above, the additional bucket receiving extension 310 may also include the different alignment feature (e.g., a chamfer 610) that is similar to the different alignment feature implemented for the bucket receiving extension 310. The different alignment feature implemented for the additional bucket receiving extension 310 may operate in a manner similar to the manner in which the different alignment feature implemented for the bucket receiving extension 310 operates as described above. FIG. 6B shows a diagram 650 illustrating the bucket 210 when the bucket 210 is placed in the bucket receiving extension 310 and the additional bucket receiving extension 310 and the bucket 210 is located in the gap between the bucket receiving extension 310 and the additional bucket receiving extension 310.

In some embodiments, the MCC 100 may include one or more interfacing devices 130 associated with the bucket 210. An interfacing device 130 among the interfacing devices 130 associated with the bucket 210 may be implemented on the front surface of the bucket 210, in a space within the bucket 210, and/or on the section 110 in which the bucket 210 is placeable, etc. In some embodiments, the industrial robot may operate or manipulate the interfacing devices 130 associated with the bucket 210 to perform various operations on the bucket 210.

In some embodiments, among the interfacing devices 130 associated with the bucket 210, the MCC 100 may include a first interfacing device associated with the bucket 210 such as a first interfacing device 230 of the bucket 210 as depicted in FIGS. 2A-7. In some embodiments, the first interfacing device 230 of the bucket 210 may be associated with a first operation and a second operation that is distinct from the first operation. The first interfacing device 230 may be operable by the industrial robot to perform the first operation or the second operation on the bucket 210. For example, the first interfacing device 230 may include a first device state corresponding to the first operation and a second device state corresponding to the second operation. The industrial robot may operate or manipulate the first interfacing device 230 to switch the first interfacing device 230 to the first device state or to the second device state. When the first interfacing device 230 is in the first device state, the first operation may be performed on the bucket 210. When the first interfacing device 230 is in the second device state, the second operation may be performed on the bucket 210.

To illustrate, the first interfacing device 230 of the bucket 210 may include an interface 232. As depicted in FIGS. 2A-3B and FIGS. 5A-7, the interface 232 of the first interfacing device 230 (also referred to herein as the interface of the first interfacing device 230 for simplification) may be implemented in the form of a socket that has a predefined geometry to receive an end effector (or a tool device) of the industrial robot. Non-limiting examples of the predefined geometry include, but are not limited to, a hexagon shape, a square shape, a cross shape, etc. Other implementations of the interface of the first interfacing device 230 are also possible and contemplated.

In some embodiments, when the end effector (or the tool device) of the industrial robot is coupled to the first interfacing device 230 at the interface of the first interfacing device 230, the interface of the first interfacing device 230 may be rotatable by the end effector of the industrial robot to switch the first interfacing device 230 between different device states of the first interfacing device 230, thereby causing different operations to be performed on the bucket 210. For example, the first interfacing device 230 may include the first device state that corresponds to the first operation to disconnect power to the bucket 210. The first interfacing device 230 may also include the second device state that corresponds to the second operation to switch the bucket 210 to a predefined mode (e.g., a test mode in which the power to the bucket 210 is cut off while the data communication with the bucket 210 remains on). In some embodiments, the first interfacing device 230 may include other device states that correspond to the operations to switch the bucket 210 to other predefined modes (e.g., a disconnected mode in which the power to the bucket 210 and the data communication with the bucket 210 are both cut off, a released mode in which the bucket 210 is no longer secured to the section 110 and may be removed from the section 110, etc.). In addition to these device states, the first interfacing device 230 may also include other device states corresponding to other operations that may be performed on the bucket 210.

In this example, the industrial robot may couple its end effector (or the tool device) to the first interfacing device 230 at the interface of the first interfacing device 230, and rotate the interface of the first interfacing device 230 in a predefined direction (e.g., the counterclockwise direction) to align a predefined point on the interface of the first interfacing device 230 with a first target point of the first interfacing device 230. In some embodiments, the first target point of the first interfacing device 230 may be located at a first angle (e.g., 30°) relative to a reference point specified for the first interfacing device 230 and may be associated with the first device state of the first interfacing device 230. Thus, by rotating the interface of the first interfacing device 230 in the predefined direction to align the predefined point on the interface of the first interfacing device 230 with the first target point of the first interfacing device 230, the industrial robot may switch the first interfacing device 230 to the first device state, thereby causing the first operation of disconnecting power to the bucket 210 to be performed.

After the first operation of disconnecting power to the bucket 210 is performed, the industrial robot may rotate the interface of the first interfacing device 230 in the predefined direction (e.g., the counterclockwise direction) to align the predefined point on the interface of the first interfacing device 230 with a second target point of the first interfacing device 230. In some embodiments, the second target point of the first interfacing device 230 may be located at a second angle (e.g., 45°) relative to the reference point specified for the first interfacing device 230 and may be associated with the second device state of the first interfacing device 230. Thus, by rotating the interface of the first interfacing device 230 in the predefined direction to align the predefined point on the interface of the first interfacing device 230 with the second target point of the first interfacing device 230, the industrial robot may switch the first interfacing device 230 to the second device state, thereby causing the second operation of switching the bucket 210 to the predefined mode (e.g., the test mode) to be performed. Other implementations to operate the first interfacing device 230 and switch the first interfacing device 230 to the first device state or the second device state of the first interfacing device 230 are also possible and contemplated.

Thus, as described above, the industrial robot may operate the same interfacing device 130 such as the first interfacing device 230 of the bucket 210 to perform different operations on the bucket 210. Each operation among these different operations may be performed on the bucket 210 when the industrial robot operates the interfacing device 130 to switch the interfacing device 130 to a device state corresponding to that operation as described above. This implementation is advantageous, because it reduces the number of interfacing devices 130 that the industrial robot may operate or manipulate to perform various operations on the bucket 210 and also reduces the number of end effectors (or tool devices) that the industrial robot may use to interact with the bucket 210. In some embodiments, among the first operation and the second operation that are associated with the first interfacing device 230, the second operation may be performable after the first operation is performed. For example, among the first operation corresponding to the first device state of the first interfacing device 230 and the second operation corresponding to the second device state of the first interfacing device 230, the second operation of switching the bucket 210 to the predefined mode (e.g., the test mode) may only be performed after the first operation of disconnecting power to the bucket 210 is performed and cannot be performed before the first operation of disconnecting power to the bucket 210 is performed.

In some embodiments, the first interfacing device 230 may be positioned on the front surface of the bucket 210 as depicted in FIGS. 2A-7. As described herein, the front surface of the bucket 210 may be located at the front side of the MCC 100 when the bucket 210 is placed in the section 110 of the MCC 100. As the first interfacing device 230 is positioned on the front surface of the bucket 210, the industrial robot may operate or manipulate the first interfacing device 230 to perform one or more operations on the bucket 210 without the need to get access to the space inside the bucket 210, and thus the number of tasks to be completed by the industrial robot to interact with the first interfacing device 230 may be reduced. In some embodiments, in addition to one or more interfacing devices 130 positioned on the front surface of the bucket 210 such as the first interfacing device 230 described above, the bucket 210 may include other interfacing devices 130 positioned inside the bucket 210 that may be operated or manipulated by the industrial robot after the industrial robot moves the bucket 210 to the opened position of the bucket 210 to get access to the space inside the bucket 210.

In some embodiments, the interface of the first interfacing device 230 may be configured to minimize a number of DOF for the industrial robot to couple to the first interfacing device 230 and operate the first interfacing device 230 in interacting with the first interfacing device 230. For example, as described above, the interface of the first interfacing device 230 may be implemented in the form of the socket that has the predefined geometry (e.g., the hexagon shape). The industrial robot may insert the end effector (or the tool device) of the industrial robot to the socket in a straight movement to couple the end effector to the interface of the first interfacing device 230. The industrial robot may then rotate the end effector to rotate the interface of the first interfacing device 230, thereby switching the first interfacing device 230 to different device states as described herein. Thus, with the interface of the first interfacing device 230 being implemented in this manner, the number of DOF for the industrial robot to couple to the first interfacing device 230 and operate the first interfacing device 230 may be reduced to 2 DOF, as compared to a higher number of DOF required for the industrial robot to couple to an interfacing device 130 and operate the interfacing device 130 when an interface of the interfacing device 130 is implemented in the form of a handle and the industrial robot needs to grasp and turn the handle. As the number of DOF required for the industrial robot to couple to the first interfacing device 230 and operate the first interfacing device 230 is reduced, the number of axes of movement associated with the industrial robot may be reduced. As a result, the structure and/or the configuration of the industrial robot may be simplified and the operations of the industrial robot may also be simplified.

In some embodiments, the interface of the first interfacing device 230 may include an alignment feature, in which the alignment feature is configured to increase a tolerance for misalignment between the end effector of the industrial robot and the interface of the first interfacing device 230 when the industrial robot couples the end effector of the industrial robot to the first interfacing device 230 at the interface of the first interfacing device 230. In some embodiments, the alignment feature implemented for the interface of the first interfacing device 230 may include one or more of a chamfer and a fillet created on an edge of the interface of the first interfacing device 230. For example, as depicted in FIGS. 2A-3B and FIGS. 5A-7, the interface 232 of the first interfacing device 230 may be implemented in the form of the socket that has the hexagon shape and may include a chamfer created on each edge of the socket as depicted in FIGS. 2A-3B and FIGS. 5A-7.

In some embodiments, when the industrial robot couples the end effector (or the tool device) of the industrial robot to the first interfacing device 230, the end effector of the industrial robot may be misaligned with the interface of the first interfacing device 230 due to the inaccuracy in the operations of the industrial robot and the end effector of the industrial robot may be in contact with the alignment feature of the interface of the first interfacing device 230. In some embodiments, when the end effector of the industrial robot is in contact with the alignment feature of the interface of the first interfacing device 230, the alignment feature (e.g., the chamfer) of the interface of the first interfacing device 230 may guide the end effector of the industrial robot to a position within the interface of the first interfacing device 230 to fit the end effector of the industrial robot in the interface of the first interfacing device 230, thereby correcting the misalignment between the end effector of the industrial robot and the interface of the first interfacing device 230. This implementation is advantageous, because it increases the tolerance for misalignment between the end effector of the industrial robot and the interface of the first interfacing device 230 when the industrial robot couples the end effector of the industrial robot to the first interfacing device 230. As a result, the accuracy requirement for the industrial robot in interacting with the first interfacing device 230 may be reduced. In some embodiments, similar to the alignment feature implemented for the interface of the first interfacing device 230, the MCC 100 may include various alignment features (e.g., chamfers, fillets, and/or combinations thereof, etc.) that are implemented for different slots, fastening holes, openings, gaps, and/or other parts included in the MCC 100 or the components of the MCC 100.

In some embodiments, in addition to the first interfacing device 230 associated with the bucket 210 as described above, the MCC 100 may include a second interfacing device associated with the bucket 210 such as a second interfacing device 240 of the bucket 210 as depicted in FIGS. 2A-3B and FIGS. 5A-7. In some embodiments, the second interfacing device 240 of the bucket 210 may be associated with a third operation and may be operable by the industrial robot to perform the third operation on the bucket 210. The third operation associated with the second interfacing device 240 of the bucket 210 may be different from the first operation and the second operation associated with the first interfacing device 230 of the bucket 210. In some embodiments, the second interfacing device 240 may include an interface in which the interface of the second interfacing device 240 and the interface of the first interfacing device 230 may be compatible with the same end effector of the industrial robot.

As an example, the second interfacing device 240 may be a bucket latch of the bucket 210, in which the bucket latch may be unlocked to enable the bucket 210 to be opened and may be locked to prevent the bucket 210 from being opened. In some embodiments, to open the bucket 210, the bucket latch of the bucket 210 may first be unlocked and the bucket 210 may then be moved in a translation motion to the opened position of the bucket 210. When the bucket 210 is in the opened position of the bucket 210, the objects stored in the bucket 210 may be accessible as described herein.

In some embodiments, the second interfacing device 240 (e.g., the bucket latch of the bucket 210) may include an interface 242 as depicted in FIGS. 2A-3B and FIGS. 5A-7. As depicted in FIGS. 2A-3B and FIGS. 5A-7, the interface 242 of the second interfacing device 240 may be implemented in the form of a socket that has a predefined geometry to receive an end effector (or a tool device) of the industrial robot. In some embodiments, the interface 242 of the second interfacing device 240 and the interface 232 of the first interfacing device 230 may be identical to one another with the interface 242 of the second interfacing device 240 having the same geometry (e.g., the hexagon shape) and the same size as the interface 232 of the first interfacing device 230. As a result, the industrial robot may operate the first interfacing device 230 and the second interfacing device 240 using the same end effector (or the same tool device) of the industrial robot. This implementation is advantageous, because it reduces the number of end effectors (or tool devices) that the industrial robot may use to interact with different interfacing devices 130 associated with the bucket 210. As described herein, instead of or in addition to an end effector that is a part of the industrial robot (e.g., the end effector may be positioned at a distal end of a robotic arm of the industrial robot), the industrial robot may use a tool device (e.g., a screwdriver, etc.) that is not a part of the industrial robot to operate the interfacing devices 130 associated with the bucket 210 and/or other interfacing devices 130 of the MCC 100.

In some embodiments, the industrial robot may operate or manipulate the second interfacing device 240 associated with the bucket 210 in a manner similar to the manner in which the industrial robot operates or manipulates the first interfacing device 230 associated with the bucket 210 as described herein. For example, the industrial robot may couple its end effector (or the tool device) to the second interfacing device 240 at the interface 242 of the second interfacing device 240 (also referred to herein as the interface of the second interfacing device 240). The industrial robot may then rotate the end effector in a first rotation direction (e.g., the clockwise direction) to rotate the interface of the second interfacing device 240 in the first rotation direction, thereby unlocking the second interfacing device 240. Additionally or alternatively, the industrial robot may rotate the end effector in a second rotation direction (e.g., the counterclockwise direction) to rotate the interface of the second interfacing device 240 in the second rotation direction, thereby locking the second interfacing device 240.

Thus, to operate the second interfacing device 240, the industrial robot may rotate the interface of the second interfacing device 240 to unlock or lock the second interfacing device 240. As described herein, the second interfacing device 240 may be the bucket latch of the bucket 210. With the second interfacing device 240 that only requires the industrial robot to rotate the interface of the second interfacing device 240 as described above, the number of DOF for the industrial robot to operate the second interfacing device 240 may be reduced to 1 DOF, as compared to a higher number of DOF for the industrial robot to operate a bucket latch that requires the industrial robot to push in an interface of the bucket latch and rotate the interface of the bucket latch at the same time. As the number of DOF required for the industrial robot to operate or manipulate the second interfacing device 240 is reduced, the number of axes of movement associated with the industrial robot may be reduced. As a result, the structure and/or the configuration of the industrial robot may be simplified and the operations of the industrial robot may also be simplified.

In some embodiments, other implementations may also apply to the MCC 100 to simplify the operations performed by the industrial robot on the MCC 100 and/or on the components of the MCC 100. For example, the number of interfacing devices 130 with which the industrial robot needs to interact to perform a particular operation on the MCC 100 or on a component of the MCC 100 may be minimized. This implementation is advantageous, because it reduces the number of tasks to be completed by the industrial robot to perform the particular operation. As an example, for the bucket 210 associated the MCC 100, the number of bucket latches associated with the bucket 210 to be operated or manipulated by the industrial robot may be limited to one bucket latch instead of multiple bucket latches to simplify the operations of unlocking or locking the bucket latch of the bucket 210.

In some embodiments, in addition to the first interfacing device 230 and the second interfacing device 240 associated with the bucket 210 as described above, the MCC 100 may include a third interfacing device associated with the bucket 210. The third interfacing device of the bucket 210 may be associated with a given operation and may be operable by the industrial robot to perform the given operation on the bucket 210. In some embodiments, the given operation associated with the third interfacing device of the bucket 210 may be different from the first operation and the second operation associated with the first interfacing device 230 of the bucket 210 and may be different from the third operation associated with the second interfacing device 240 of the bucket 210.

In some embodiments, the third interfacing device of the bucket 210 may include an attachable interface that is removably attached to the third interfacing device. The attachable interface of the third interfacing device may be compatible with the same end effector of the industrial robot as the interface of the first interfacing device 230 and the interface of the second interfacing device 240. For example, the attachable interface that is removably attached to the third interfacing device may be a socket that has the same geometry (e.g., the hexagon shape) and the same size as the interface 232 of the first interfacing device 230 and the interface 242 of the second interfacing device 240. Accordingly, the industrial robot may operate the first interfacing device 230, the second interfacing device 240, and/or the third interfacing device of the bucket 210 using the same end effector (or the same tool device) of the industrial robot. This implementation is advantageous, because it enables the third interfacing device of the bucket 210 (e.g., a handle or a lever of the bucket 210) that has a different interface from the first interfacing device 230 and the second interfacing device 240 to be flexibly adapted so that the first interfacing device 230, the second interfacing device 240, and the third interfacing device of the bucket 210 may be operated or manipulated by the industrial robot using the same end effector (or the same tool device) of the industrial robot.

Figure 7:
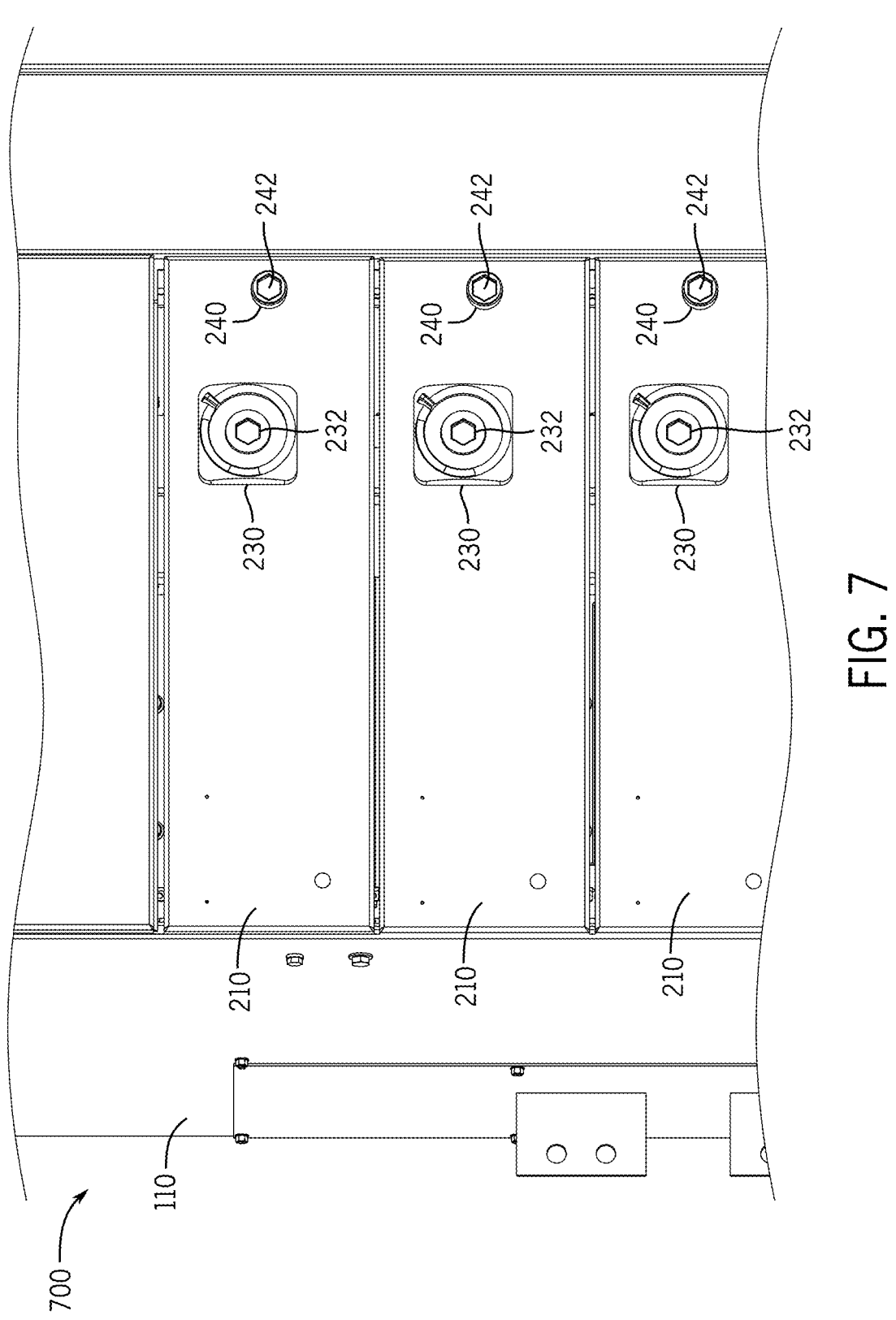
FIG. 7 illustrates example interfacing devices of a motor control cabinet.

In some embodiments, the same interface may be implemented for the interfacing devices 130 associated with various components of the MCC 100. For example, FIG. 7 shows a diagram 700 illustrating multiple buckets 210 associated with the MCC 100. As depicted in FIG. 7, for each bucket 210 associated with the MCC 100, the first interfacing device 230 that may be operated to disconnect power to the bucket 210 or switch the bucket 210 to a predefined mode among one or more predefined modes of the bucket 210, the second interfacing device 240 that is the bucket latch of the bucket 210 and may be unlocked to enable the bucket 210 to be opened or may be locked to prevent the bucket 210 from being opened, the screw head 226 of the leadscrew 220 that may be operated to move the bucket 210 relative to the section 110 of the MCC 100, and/or other interfacing devices 130 of the bucket 210 may have the same interface. For example, the interfaces of these interfacing devices 130 may have the same geometry (e.g., the hexagon shape) and the same size. In some embodiments, this common interface may be implemented not only for the interfacing devices 130 of one bucket 210 but also for the interfacing devices 130 of different buckets 210. Accordingly, the industrial robot may interact with the interfacing devices 130 of the same bucket 210 or the interfacing devices 130 of different buckets 210 using the same end effector (or the tool device) of the industrial robot. This implementation is advantageous, because it eliminates the need for the industrial robot to switch between different end effectors (or different tool devices) when the industrial robot interacts with different interfacing devices 130 of the same bucket 210 or with the interfacing devices 130 of different buckets 210. As a result, the structure and/or the configuration of the industrial robot may be simplified and the operations of the industrial robot may also be simplified.

In some embodiments, to further simplify and facilitate the operations of the industrial robot when the industrial robot interacts with the MCC 100 and/or one or more components of the MCC 100, the MCC 100 may include one or more wireless power connections and/or one or more wireless data connections instead of using physical cables for power connections and/or data connections of the MCC 100. This implementation is advantageous, because it eliminates the need for the industrial robot to physically interact with the physical cables (e.g., plug or unplug the physical cables) to connect or disconnect a power connection or a data connection of the MCC 100 when needed. Instead, the industrial robot may transmit to a control system of the MCC 100 a request to connect or disconnect the wireless power connection or the wireless data connection of the MCC 100. Additionally or alternatively, the MCC 100 may include a physical cable (e.g., a Single Pair Ethernet (SPE) cable) in which both power and data is communicated through the physical cable. This implementation is advantageous, because it reduces the number of physical cables with which the industrial robot may interact to connect or disconnect the power connection or the data connection of the MCC 100.

Thus, the MCC 100 may be implemented with one or more components and/or device features that are compatible with the industrial robot and/or capable of facilitating the interaction of the industrial robot with the MCC 100 as described herein. For example, as described herein, the compartment 120 in the section 110 of the MCC 100 may be implemented in the form of a bucket (e.g., the bucket 210) that is movable along the axis relative to the section 110 in the translation motion. This implementation may enable the industrial robot to move the bucket 210 forward and backward along the axis between the closed position and the opened position of the bucket 210 with one DOF, thereby reducing the number of axes of movement associated with the industrial robot. As a result, the structure and/or the configuration of the industrial robot may be simplified and the operations of the industrial robot may also be simplified.

As another example, the MCC 100 may include a plurality of slider bearings and one or more slider bearings among the plurality of slider bearings may include the bucket receiving extension 310 and the additional bucket receiving extension 310 in which the bucket 210 may be placed. As described herein, the plurality of slider bearings may provide support for the bucket 210 when the bucket 210 is placed in the bucket receiving extension 310 and the additional bucket receiving extension 310 implemented on the one or more slider bearings (e.g., the second slider bearing and the fourth slider bearing) of the MCC 100 and at least a portion of the bucket 210 is located outside of the section 110. This implementation is advantageous, because it eliminates the need for the industrial robot to support a portion of the weight of the bucket 210 or the entire weight of the bucket 210 when the industrial robot moves the bucket 210 relative to the section 110 and a portion of the bucket 210 or the entire bucket 210 is located outside of the section 110. As a result, the payload capacity required for the industrial robot may be reduced.

In addition, when the industrial robot moves the bucket 210 relative to the section 110, a slide of a slider bearing may slide along another slide of the slider bearing or along another slide of a different slider bearing among the plurality of slider bearings. As described herein, the sliding of the slides associated with these slider bearings may eliminate the need for the industrial robot to guide the bucket 210 with a specific angle to avoid the bucket 210 being stuck when the industrial robot moves the bucket 210 relative to the section 110. As a result, the operations of the industrial robot to move the bucket 210 forward or backward relative to the section 110 may be simplified.

Moreover, as described herein, the plurality of slider bearings may include one or more roller bearings and/or one or more ball bearings that are integrated into the slider bearings to reduce friction when the industrial robot moves the bucket 210 and the slides of the slider bearings move relative to one another. As a result, the reaction force provided by the industrial robot to move the bucket 210 relative to the section 110 may be reduced. Furthermore, as described herein, the bucket 210 may be made of lightweight material to reduce the weight of the bucket 210. As a result, the reaction forces and/or torques provided by the industrial robot to support the bucket 210 or to transport the bucket 210 between various locations may be reduced. Accordingly, the performance requirement for the motor(s) of the industrial robot may be reduced.

As another example, one or more alignment features may be implemented for the bucket receiving extension 310 and the additional bucket receiving extension 310 in which the bucket 210 may be placed. As described herein, the alignment features (e.g., chamfers, fillets, etc.) may be implemented for the slots 502 of the bucket receiving extension 310 and the additional bucket receiving extension 310 and may be implemented on the inner edges of the bucket receiving extension 310 and the additional bucket receiving extension 310. When the industrial robot places the bucket 210 in the bucket receiving extension 310 and the additional bucket receiving extension 310, the bucket 210 may be misaligned with the bucket receiving extension 310, the additional bucket receiving extension 310, and/or the gap therebetween and the bucket 210 may be in contact with an alignment feature among these alignment features. In this case, the alignment feature may guide the bucket 210 to a correct position where the bucket 210 needs to be placed, thereby correcting the misalignment of the bucket 210 with the bucket receiving extension 310, the additional bucket receiving extension 310, and/or the gap therebetween. This implementation is advantageous, because it increases the tolerance for misalignment of the bucket 210 when the industrial robot places the bucket 210 in the bucket receiving extension 310 and the additional bucket receiving extension 310. As a result, the accuracy requirement for the industrial robot may be reduced.

As another example, the MCC 100 may include an interfacing device 130 in which different operations may be integrated in the interfacing device 130 and the industrial robot may operate or manipulate the interfacing device 130 to perform the different operations on the MCC 100. For example, the different operations may be performed on a component of the MCC 100 such as the bucket 210 associated with the MCC 100. As described herein, each operation among the different operations may be performed on the MCC 100 when the industrial robot operates the interfacing device 130 to switch the interfacing device 130 to a device state corresponding to that operation. This implementation may enable the industrial robot to operate the same interfacing device 130 to perform the different operations on the MCC 100, thereby reducing the number of interfacing devices 130 with which the industrial robot may interact on the MCC 100 and also reducing the number of end effectors (or tool devices) that the industrial robot may use to interact with the MCC 100. As a result, the structure and/or the configuration of the industrial robot may be simplified and the operations of the industrial robot may also be simplified.

As another example, the interfacing device 130 of the MCC 100 may be positioned at the front side of the MCC 100. For example, the interfacing device 130 may be associated with a component of the MCC 100 such as the bucket 210 and the interfacing device 130 may be positioned on the front surface of the bucket 210. The front surface of the bucket 210 may be located at the front side of the MCC 100 when the bucket 210 is placed in the section 110 of the MCC 100. Accordingly, when the bucket 210 is placed in the section 110 of the MCC 100, the industrial robot may operate or manipulate the interfacing device 130 on the front surface of the bucket 210 without the need to get access to the space inside the bucket 210. As a result, the number of tasks to be completed by the industrial robot to interact with the interfacing device 130 may be reduced and the operations of the industrial robot may be simplified.

As another example, the interface of the interfacing device 130 may be configured to simplify the operations of the industrial robot in interacting with interfacing device 130. For example, the interface of the interfacing device 130 (e.g., the first interfacing device 230 associated with the bucket 210) may be implemented in the form of the socket that has the predefined geometry (e.g., the hexagon shape). As described herein, to interact with the interfacing device 130, the industrial robot may insert the end effector (or the tool device) of the industrial robot to the socket in a straight movement to couple the end effector to the interface of the interfacing device 130. The industrial robot may then rotate the end effector to rotate the interface of the interfacing device 130, thereby operating the interfacing device 130. Accordingly, the number of DOF for the industrial robot to couple to the interfacing device 130 and operate the interfacing device 130 may be reduced, as compared to an implementation in which the interface of the interfacing device 130 is formed as a handle and the industrial robot needs to grasp and turn the handle or another implementation in which the interfacing device 130 requires the industrial robot to push in and rotate the interface of the interfacing device 130 at the same time. As the number of DOF for the industrial robot to couple to the interfacing device 130 and operate the interfacing device 130 is reduced, the number of axes of movement associated with the industrial robot may be reduced. As a result, the structure and/or the configuration of the industrial robot may be simplified and the operations of the industrial robot may also be simplified.

As another example, the interface of the interfacing device 130 (e.g., the first interfacing device 230 associated with the bucket 210) may include an alignment feature (e.g., a chamfer, a fillet, etc.). As described herein, when the industrial robot couples the end effector (or the tool device) of the industrial robot to the interfacing device 130, the end effector of the industrial robot may be misaligned with the interface of the interfacing device 130 and the end effector of the industrial robot may be in contact with the alignment feature implemented for the interface of the interfacing device 130. In this case, the alignment feature may guide the end effector of the industrial robot to a position within the interface of the interfacing device 130 to fit the end effector of the industrial robot in the interface of the interfacing device 130, thereby correcting the misalignment between the end effector of the industrial robot and the interface of the interfacing device 130. This implementation is advantageous, because it increases the tolerance for misalignment between the end effector of the industrial robot and the interface of the interfacing device 130 when the industrial robot couples the end effector of the industrial robot to the interfacing device 130. As a result, the accuracy requirement for the industrial robot may be reduced.

As another example, the number interfacing devices 130 with which the industrial robot may interact to perform a particular operation on the MCC 100 or on a component of the MCC 100 such as the bucket 210 may be minimized. For example, the number of bucket latches implemented on the bucket 210 may be limited to one bucket latch instead of multiple bucket latches to simplify the operations of unlocking or locking the bucket latch of the bucket 210. This implementation may reduce the number of tasks to be completed by the industrial robot to perform the particular operation on the MCC 100 or on the component of the MCC 100 such as the bucket 210, and thus the operations of the industrial robot may be simplified.

As another example, the MCC 100 may include multiple interfacing devices 130 in which the interfaces of multiple interfacing devices 130 may be compatible with the same end effector of the industrial robot. As described herein, an interface of an interfacing device 130 among these interfacing devices 130 may be a permanent interface of the interfacing device 130 or an attachable interface that is removably attached to interfacing device 130. As described herein, the interface of these interfacing devices 130 may be identical to one another with the same shape and size. Accordingly, the industrial robot may operate these interfacing devices 130 using the same end effector (or the same tool device) of the industrial robot, and thus the number of end effectors (or tool devices) that the industrial robot may use to interact with the MCC 100 may be reduced. As a result, the structure and/or the configuration of the industrial robot may be simplified and the operations of the industrial robot may also be simplified.

As another example, the MCC 100 may include one or more wireless power connections and/or one or more wireless data connections instead of using physical cables to implement the power connections and the data connections for the MCC 100. Additionally or alternatively, the power connections and the data connections of the MCC 100 may be implemented using common physical cable(s) such as SPE cable(s). These implementations are advantageous, because they eliminate the physical cables or reduce the number of physical cables with which the industrial robot may interact to connect or disconnect the power connections and/or the data connections of the MCC 100 when needed. As a result, the operations of the industrial robot may be simplified.

It should be understood that the components and the device features implemented for the MCC 100 as described herein are merely examples and other implementations of these components and device features are also possible and contemplated. As described herein, these components and device features may simplify the structure and/or the configuration of the industrial robot, simplify the operations of the industrial robot, reduce the payload capacity of the industrial robot, reduce the performance requirement for the motor(s) of the industrial robot, and/or reduce the accuracy requirement for the industrial robot when the industrial robot interacts with the MCC 100 or the components of the MCC 100. As a result, various operations on the MCC 100 may be effectively performed by the industrial robot even if the industrial robot is a typical robot or a standard robot that is not modified or adapted and/or the industrial robot has a relatively low level of accuracy. Accordingly, the industrial robot may be used to autonomously perform various operations on the MCC 100 in place of the human workers. The implementations of the components and the device features on the MCC 100 as described herein may also facilitate the human workers in interacting with the MCC 100 when needed. It should be understood that the components and the device features described herein may not only be implemented on a motor control cabinet such as the MCC 100 but may also be implemented on other industrial machines so that the operations on these industrial machines are performable by the industrial robot.

Thus, the systems and methods described herein may enable and facilitate autonomous interaction of an industrial robot with an industrial machine. As an example implementation of the systems and methods described herein, the industrial machine may be implemented in the form of a cabinet (e.g., a motor control cabinet or a different type of industrial cabinet) that includes one or more buckets and the industrial robot may use a bucket manipulating device to autonomously interact with a bucket of the cabinet. In some embodiments, the bucket manipulating device may be implemented as a part of the industrial robot. For example, the bucket manipulating device may be coupled to a robotic arm of the industrial robot as an end effector at a distal end of the robotic arm of the industrial robot. Additionally or alternatively, the bucket manipulating device may not be a part of the industrial robot and the industrial robot may use the bucket manipulating device as a tool device to interact with the bucket.

Figure 8A:
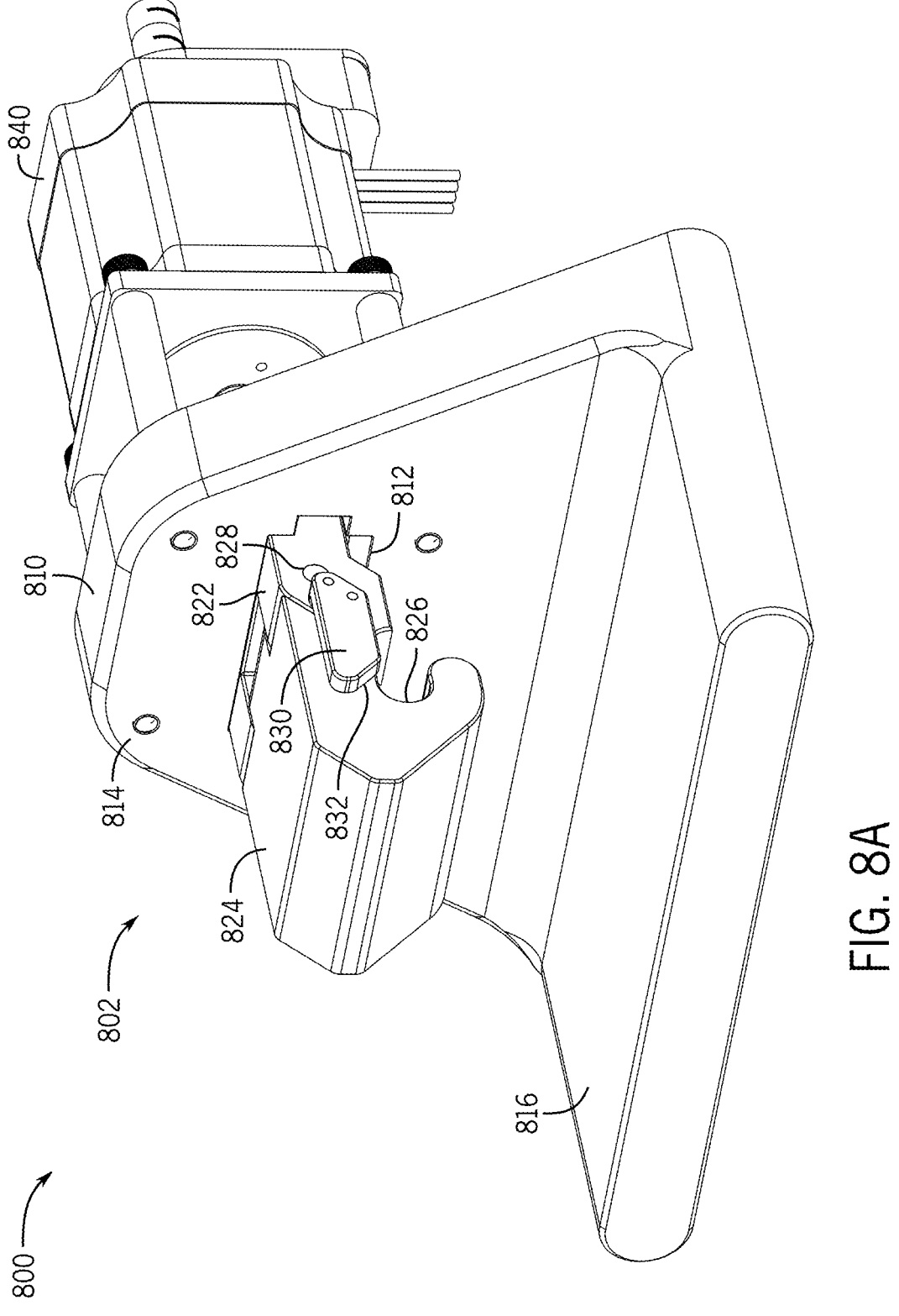
FIGS. 8A-8C illustrate an example bucket manipulating device in which a latching system of the bucket manipulating device is in a protruded state and a coupling portion of the latching system does not rotate relative to a base portion of the latching system.
Figure 8B:
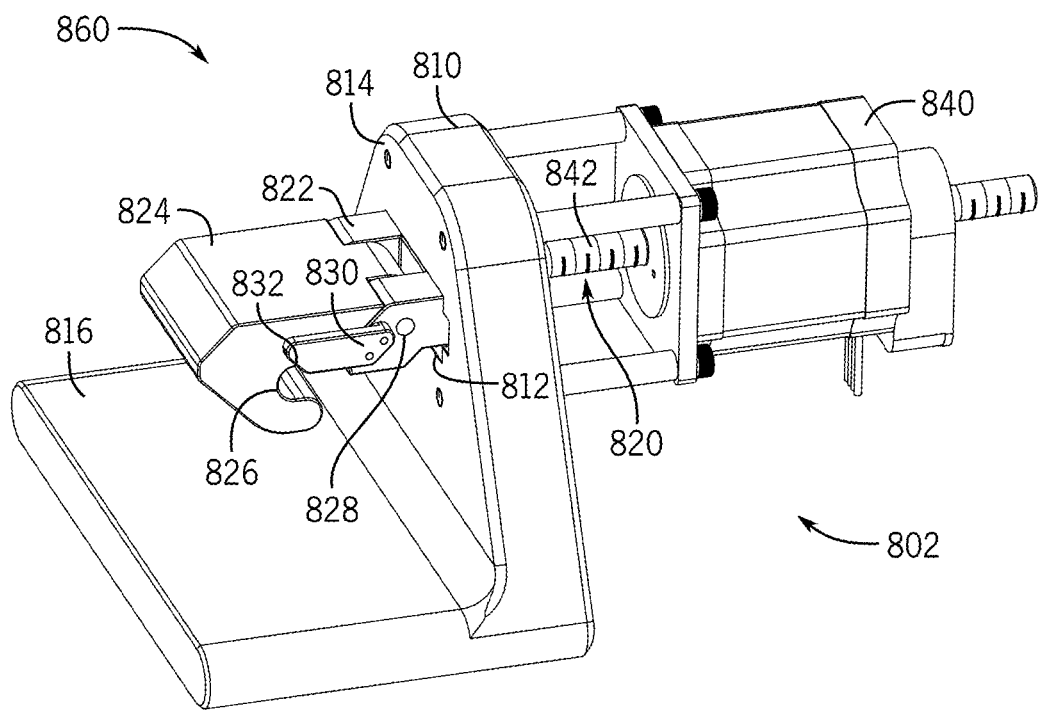
Figure 8C:
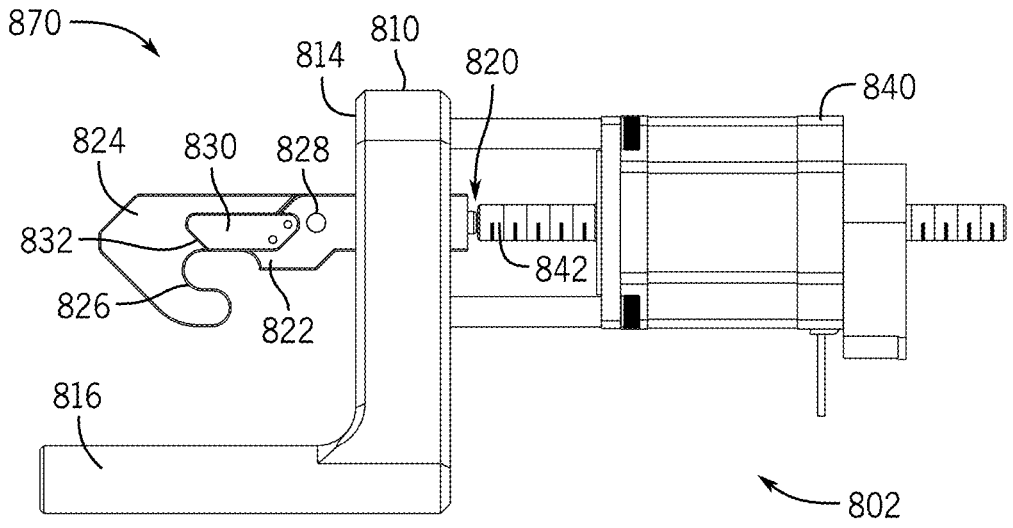
Figure 9A:
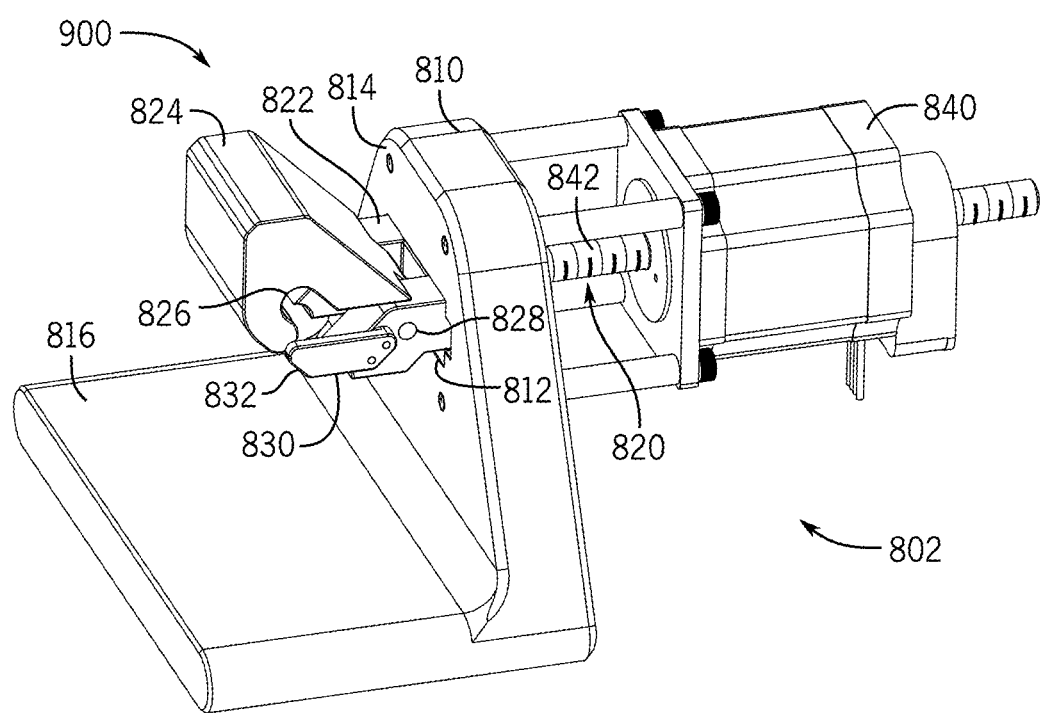
FIGS. 9A and 9B illustrate an example bucket manipulating device in which a latching system of the bucket manipulating device is in a protruded state and a coupling portion of the latching system rotates relative to a base portion of the latching system.
Figure 9B:
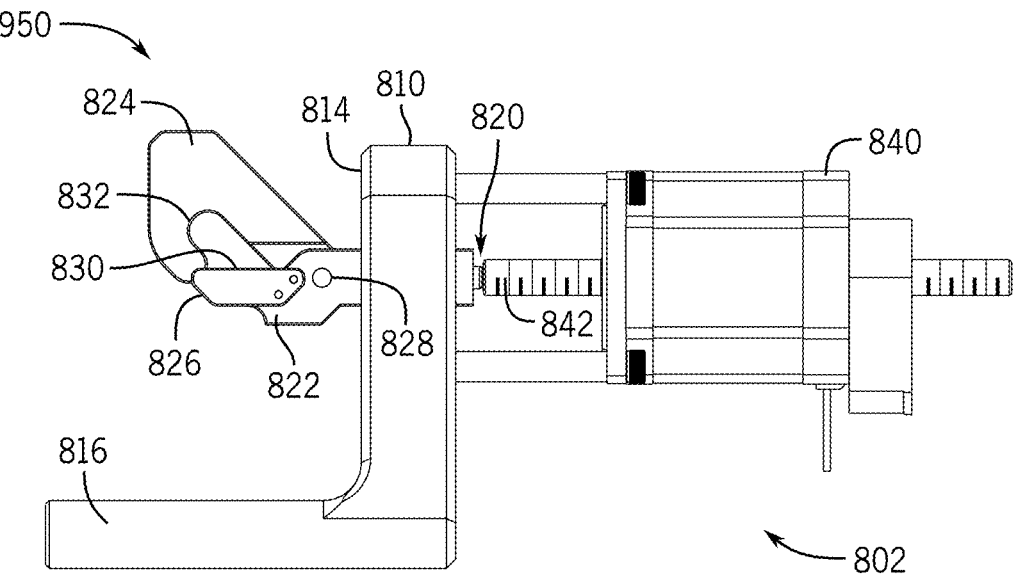
Figure 10A:
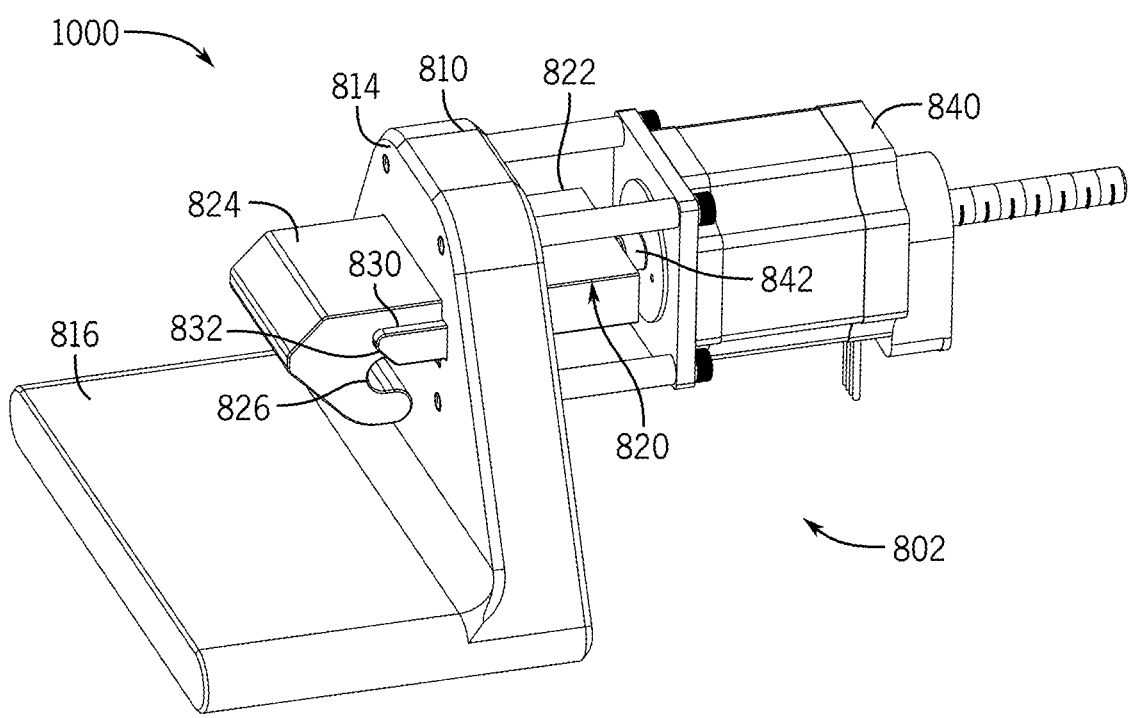
FIGS. 10A and 10B illustrate an example bucket manipulating device in which a latching system of the bucket manipulating device is in a retracted state.
Figure 10B:
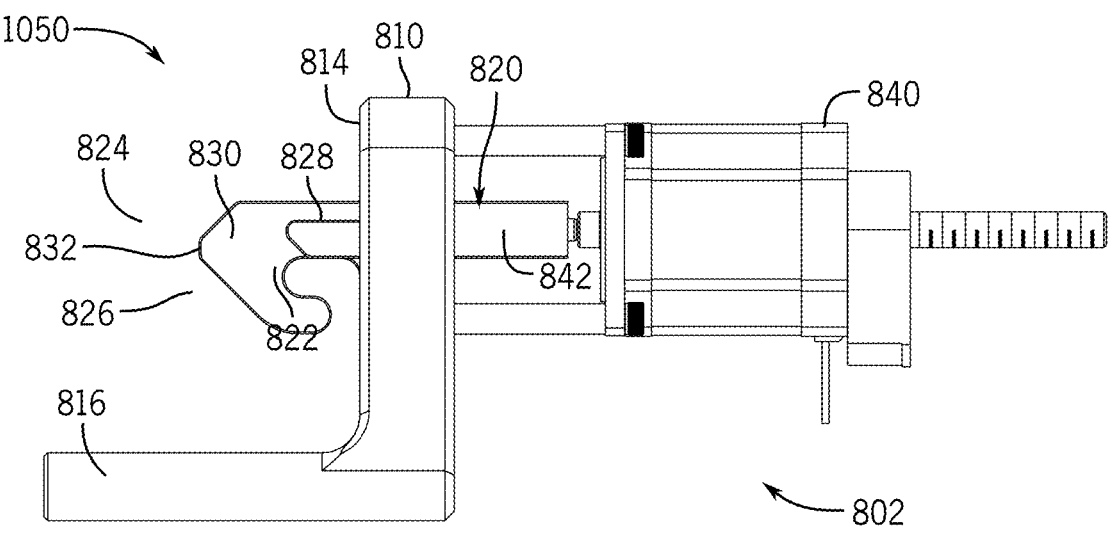

An example bucket manipulating device 802 is illustrated in FIGS. 8A-10B. As depicted in diagrams 800, 860, 870 of FIGS. 8A-8C, diagrams 900 and 950 of FIGS. 9A-9B, and diagrams 1000 and 1050 of FIGS. 10A-10B, the bucket manipulating device 802 may include a main body 810 and a latching system 820 that is movable in a translation motion between a protruded state and a retracted state relative to the main body 810. For example, as depicted in FIG. 8A, the main body 810 may include an opening 812 through which the latching system 820 may translate forward or backward between the protruded state of the latching system 820 and the retracted state of the latching system 820. FIGS. 8A-8C and FIGS. 9A-9B illustrate the bucket manipulating device 802 with the latching system 820 in the protruded state. FIGS. 10A-10B illustrate the bucket manipulating device 802 with the latching system 820 in the retracted state. In some embodiments, when the latching system 820 moves to its protruded state, the latching system 820 may move forward and away from the main body 810. When the latching system 820 moves to its retracted state, the latching system 820 may move backward and towards the main body 810.

In some embodiments, the main body 810 may include a front surface 814 as depicted in FIGS. 8A-10B. The front surface 814 of the main body 810 may be located opposite to a bucket when the bucket manipulating device 802 is coupled to the bucket with the latching system 820 coupled to a handle of the bucket. In some embodiments, a portion of the latching system 820 that is located in front of the front surface 814 of the main body 810 when the latching system 820 is in the protruded state as depicted in FIGS. 8A-8C and FIGS. 9A-9B may be larger than a portion of the latching system 820 that is located in front of the front surface 814 of the main body 810 when the latching system 820 is in the retracted state as depicted in FIGS. 10A-10B.

In some embodiments, the latching system 820 of the bucket manipulating device 802 may include a base portion 822 and a coupling portion 824. The coupling portion 824 may include a slot 826 as depicted in FIGS. 8A-10B. In some embodiments, the coupling portion 824 may be movable relative to the base portion 822 to couple to the handle of the bucket when the latching system 820 is in the protruded state. In some embodiments, the bucket may be associated with a section of a cabinet (e.g., a motor control cabinet or a different type of industrial cabinet). For example, the bucket may be placeable in the section of the cabinet and may be movable relative to the section of the cabinet in a translation motion. In some embodiments, the bucket may include a front surface and the handle of the bucket may be positioned on the front surface of the bucket. The front surface of the bucket may be located at a front side of the cabinet when the bucket is placed in the section of the cabinet.

In some embodiments, the base portion 822 and the coupling portion 824 of the latching system 820 may be coupled to one another via a hinge 828 as depicted in FIGS. 8A-8C and FIGS. 9A-9B. FIGS. 8A-8C illustrate the bucket manipulating device 802 with the latching system 820 in the protruded state and with the coupling portion 824 in a default position in which the coupling portion 824 does not rotate relative to the base portion 822. As depicted in FIGS.

8A-8C, when the latching system 820 is in the protruded state, the hinge 828 may be located outside the main body 810 of the bucket manipulating device 802, and therefore the coupling portion 824 may be rotatable around the hinge 828 relative to the base portion 822. FIGS. 9A-9B illustrate the bucket manipulating device 802 with the latching system 820 in the protruded state and the coupling portion 824 rotates around the hinge 828 relative to the base portion 822. For example, the coupling portion 824 may rotate upward relative to the base portion 822 as depicted in FIGS. 9A-9B.

In some embodiments, when the bucket manipulating device 802 is located proximate to the handle of the bucket, the coupling portion 824 may rotate upward relative to the base portion 822 to rotate over the handle of the bucket. The coupling portion 824 may then rotate downward relative to the base portion 822 so that the handle of the bucket may be located within the slot 826 of the coupling portion 824. In some embodiments, when the handle of the bucket is located within the slot 826 of the coupling portion 824, the coupling portion 824 may be considered as being coupled to the handle of the bucket. In some embodiments, when the coupling portion 824 is coupled to the handle of the bucket and the latching system 820 including the coupling portion 824 moves from the protruded state to the retracted state, the coupling portion 824 may be moved away from the bucket towards the main body 810 of the bucket manipulating device 802. In this case, the coupling portion 824 may move the handle of the bucket with the coupling portion 824 due to the relative position of the handle of the bucket relative to the coupling portion 824 and the moving direction of the latching system 820 including the coupling portion 824. Accordingly, the handle of the bucket may be moved away from the bucket towards the main body 810 of the bucket manipulating device 802. In other words, the handle of the bucket may be pulled forward relative to the bucket towards the main body 810 of the bucket manipulating device 802.

FIGS. 10A-10B illustrate the bucket manipulating device 802 in which the latching system 820 is in the retracted state. In some embodiments, when the latching system 820 is in the retracted state, the hinge 828 may be located within the main body 810 of the bucket manipulating device 802 instead of outside the main body 810 of the bucket manipulating device 802. For example, when the latching system 820 is in the retracted state, a part of the base portion 822 and a part of the coupling portion 824 may fit in the opening 812 of the main body 810 with the hinge 828 via which the base portion 822 and the coupling portion 824 are coupled to one another being located within the opening 812. Accordingly, the rotation of the coupling portion 824 around the hinge 828 relative to the base portion 822 may be prevented, and thus the coupling portion 824 may not be rotatable around the hinge 828 relative to the base portion 822 when the latching system 820 is in the retracted state. In some embodiments, when the coupling portion 824 is coupled to the handle of the bucket and the latching system 820 is in the retracted state, the coupling portion 824 may be prevented from rotating relative to the base portion 822 with the hinge 828 located within the main body 810 of the bucket manipulating device 802 as described above. As a result of this implementation, the bucket may be held securely by the bucket manipulating device 802 when the coupling portion 824 is coupled to the handle of the bucket and the latching system 820 is in the retracted state, and thus the bucket may be transported safely between different locations by the bucket manipulating device 802.

In some embodiments, the latching system 820 of the bucket manipulating device 802 may be coupled to a motor 840 as depicted in FIGS. 8A-10B. The motor 840 may be configured to move the latching system 820 in the translation motion between the protruded state and the retracted state relative to the main body 810. In some embodiments, the motor 840 may actuate a leadscrew and the leadscrew may include a screw shaft 842 coupled to a nut. As depicted in FIGS. 8C, 9B, 10B, the screw shaft 842 of the leadscrew may be attached to the base portion 822 of the latching system 820 as a part of the latching system 820 and the nut of the leadscrew (not shown) may be coupled to the motor 840. In some embodiments, when the motor 840 operates, the motor 840 may rotate the nut. When the nut rotates, the screw shaft 842 coupled to the nut may translate in a forward direction or a backward direction depending on a rotation direction (e.g., a clockwise direction or a counterclockwise direction) of the nut, thereby causing the latching system 820 to move forward or backward in the translation motion between the protruded state of the latching system 820 and the retracted state of the latching system 820.

Figure 11A:
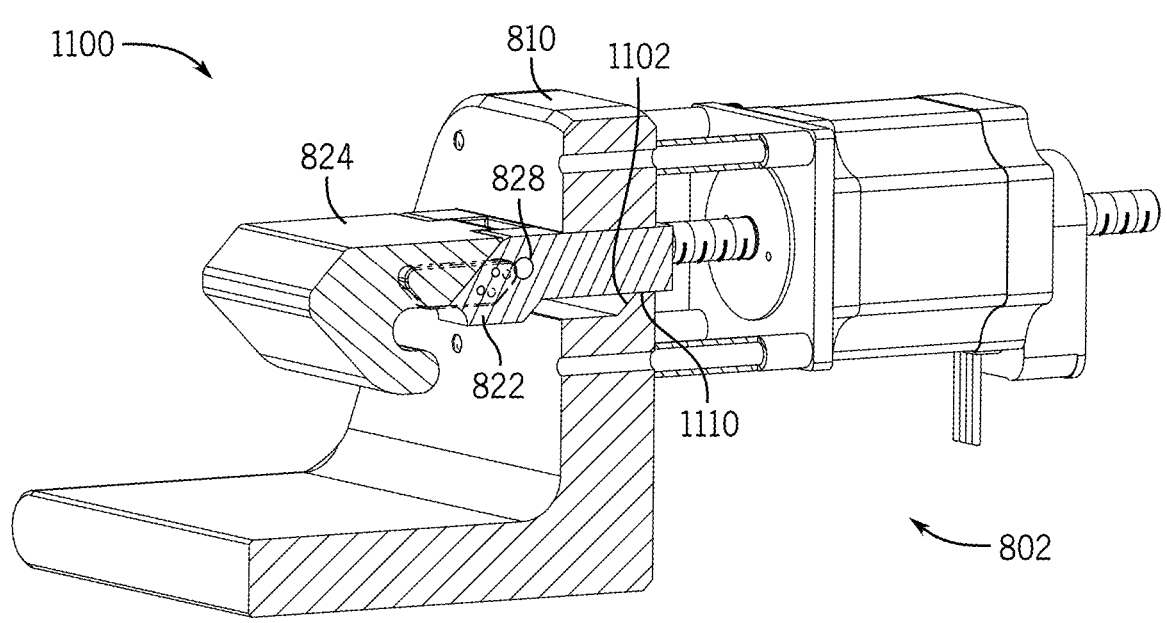
FIGS. 11A and 11B illustrate cross-section views of an example bucket manipulating device in which a latching system of the bucket manipulating device is in a protruded state and a coupling portion of the latching system does not rotate relative to a base portion of the latching system.
Figure 11B:
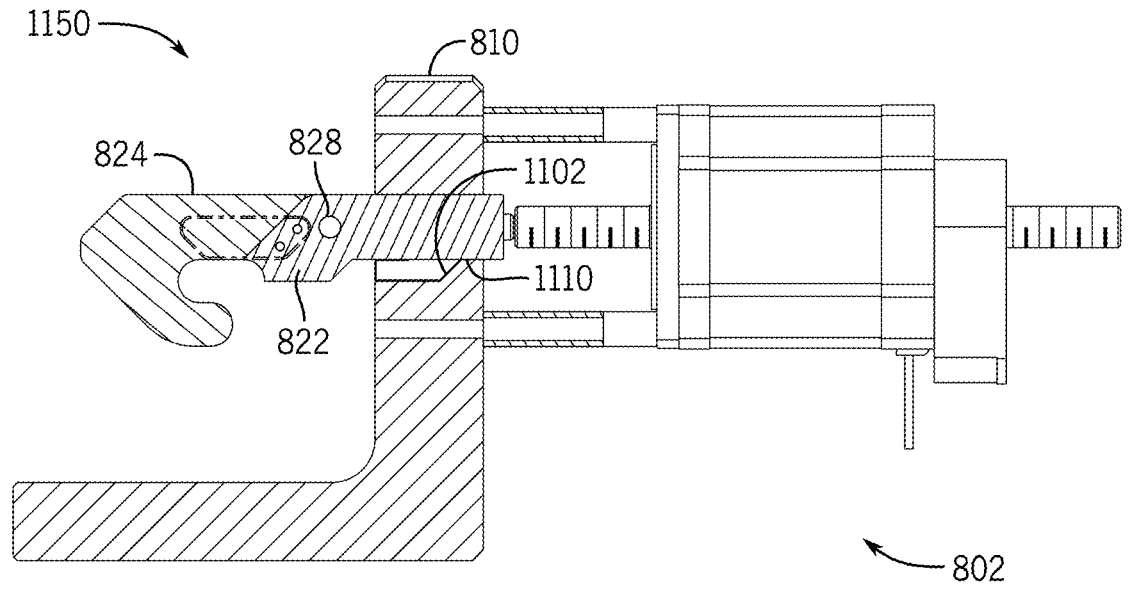
Figure 12A:
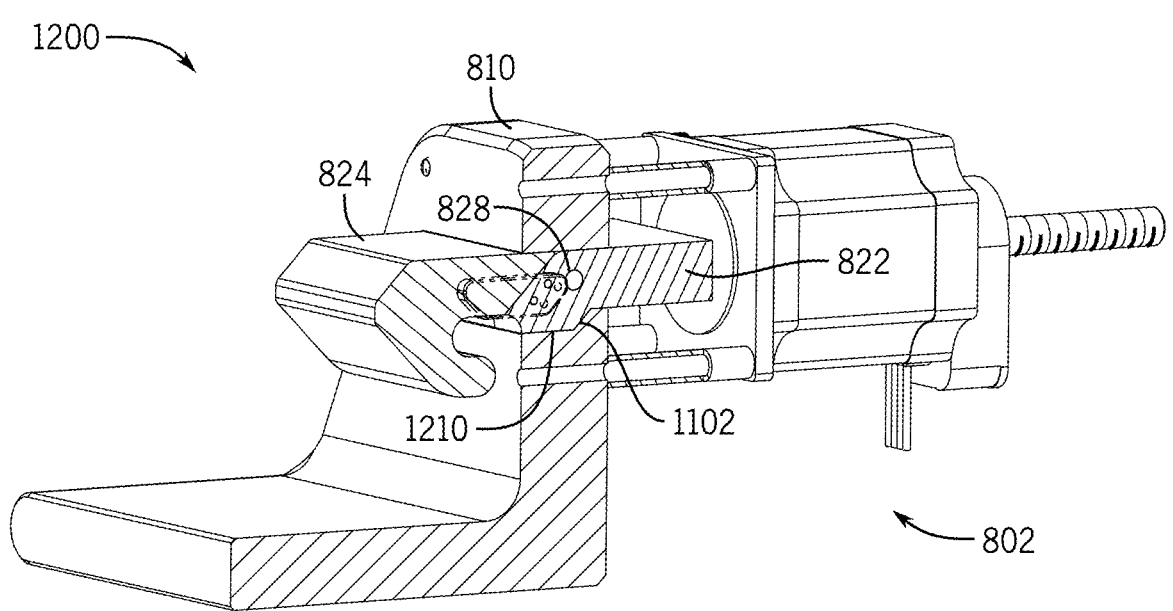
FIGS. 12A and 12B illustrate cross-section views of an example bucket manipulating device in which a latching system of the bucket manipulating device is in a retracted state.
Figure 12B:
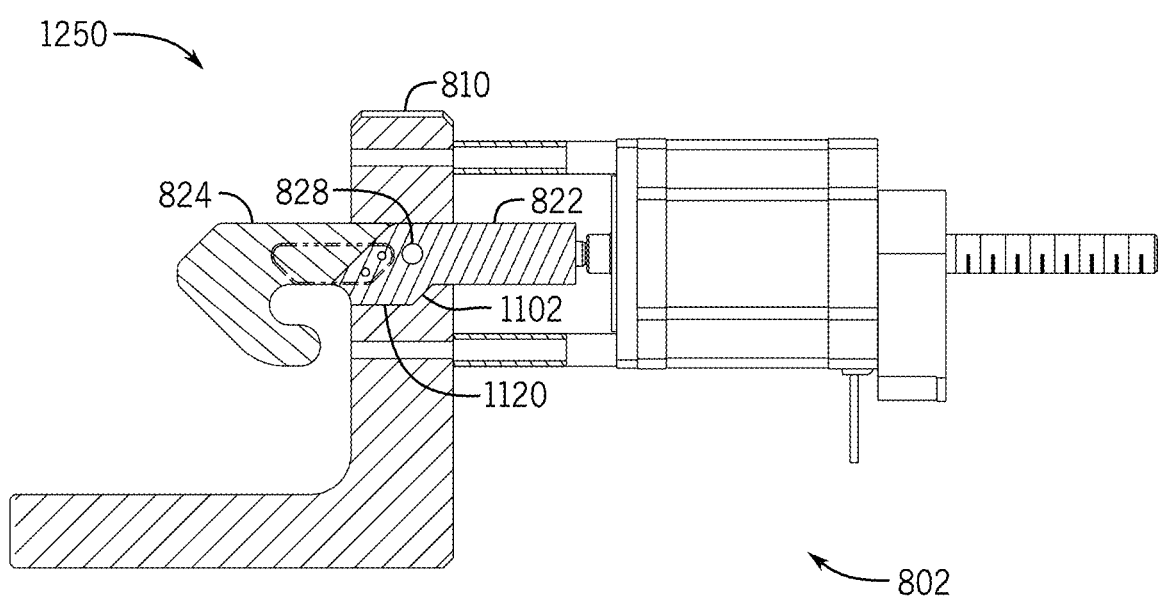

Thus, as described herein, the latching system 820 of the bucket manipulating device 802 may move between its protruded state and its retracted state relative to the main body 810 of the bucket manipulating device 802 in the translation motion. In some embodiments, the main body 810 may include an inner slope associated with the retracted state of the latching system 820. An example inner slope 1102 of the main body 810 is illustrated in FIGS. 11A-11B and FIGS. 12A-12B. FIGS. 11A-11B show diagrams 1100 and 1150 illustrating cross-section views of the bucket manipulating device 802 when the latching system 820 is in the protruded state and the coupling portion 824 of the latching system 820 does not rotate relative to the base portion 822 of the latching system 820. FIGS. 12A-12B show diagrams 1200 and 1250 illustrating cross-section views of the bucket manipulating device 802 when the latching system 820 is in the retracted state.

In some embodiments, the inner slope 1102 may be configured to stop a movement of the latching system 820 from the protruded state to the retracted state when the latching system 820 reaches the retracted state and the base portion 822 of the latching system 820 is in contact with the inner slope 1102. For example, the inner slope 1102 may be formed within the main body 810 of the bucket manipulating device 802 at a position associated with the retracted state of the latching system 820. When the latching system 820 is not in the retracted state, the base portion 822 of the latching system 820 may not be in contact with the inner slope 1102. When the latching system 820 is in the retracted state, the base portion 822 of the latching system 820 may be in contact with the inner slope 1102. Accordingly, when the latching system 820 reaches the retracted state while moving from the protruded state to the retracted state, the base portion 822 of the latching system 820 may be in contact with the inner slope 1102 and the inner slope 1102 may stop the movement of the latching system 820. Thus, the inner slope 1102 may stop the movement of the latching system 820 when the latching system 820 reaches the retracted state while moving from the protruded state to the retracted state.

In some embodiments, the base portion 822 of the latching system 820 may be situated on an inner surface of the main body 810. In some embodiments, when the latching system 820 is in the protruded state, the base portion 822 of the latching system 820 may be in contact with a first area 1110 of the inner surface as depicted in FIGS. 11A-11B. When the latching system 820 is in the retracted state, the base portion 822 of the latching system 820 may be in contact with a second area 1210 of the inner surface as depicted in FIGS. 12A-12B. As depicted in FIGS. 11A-11B and FIGS. 12A-12B, the first area 1110 of the inner surface that is in contact with the base portion 822 of the latching system 820 when the latching system 820 is in the protruded state may be smaller than the second area 1210 of the inner surface that is in contact with the base portion 822 of the latching system 820 when the latching system 820 is in the retracted state.

In some embodiments, the bucket manipulating device 802 may carry the bucket with the coupling portion 824 of the latching system 820 coupled to the handle of the bucket and the latching system 820 in the retracted state. For example, to carry the bucket, when the latching system 820 is in the protruded state, the coupling portion 824 of the latching system 820 may rotate relative to the base portion 822 of the latching system 820 to couple to the handle of the bucket as described herein. After the coupling portion 824 of the latching system 820 is coupled to the handle of the bucket, the latching system 820 may move from the protruded state to the retracted state, and thus the bucket may be securely held by the latching system 820 of the bucket manipulating device 802 as described herein. In some embodiments, the bucket manipulating device 802 may carry the bucket when the bucket is securely held by the latching system 820 of the bucket manipulating device 802.

In some embodiments, when the bucket manipulating device 802 carries the bucket with the coupling portion 824 of the latching system 820 coupled to the handle of the bucket and the latching system 820 in the retracted state as described above, an amount of weight of the bucket applied to the latching system 820 may be distributed via the second area 1210 of the inner surface that is in contact with the base portion 822 of the latching system 820 when the latching system 820 is in the retracted state. Thus, the amount of weight applied to the latching system 820 may be distributed over a larger area of the inner surface within the main body 810 of the bucket manipulating device 802 when the latching system 820 is in the retracted state as compared to when the latching system 820 is in the protruded state. This implementation is advantageous, because it reduces the amount of stress applied to the bucket manipulating device 802 when the bucket manipulating device 802 carries the bucket, and thus the rigidity and the durability of the bucket manipulating device 802 may be increased.

In some embodiments, the main body 810 of the bucket manipulating device 802 may include a supporting member 816 as depicted in FIGS. 8A-10B. As depicted in FIGS. 8A-10B, the supporting member 816 of the main body 810 may extend outward from the front surface 814 of the main body 810 to be in contact with the bucket when the coupling portion 824 of the latching system 820 is coupled to the handle of the bucket. Accordingly, when the bucket manipulating device 802 carries the bucket with the coupling portion 824 of the latching system 820 coupled to the handle of the bucket, the bucket manipulating device 802 may provide support to the bucket via one or more first contact points between the coupling portion 824 of the latching system 820 and the handle of the bucket and one or more second contact points between the supporting member 816 of the main body 810 and the bucket. In particular, when the coupling portion 824 of the latching system 820 is coupled to the handle of the bucket, the coupling portion 824 of the latching system 820 and the handle of the bucket may be in contact with one another via the first contact points, and the supporting member 816 of the main body 810 and the front surface of the bucket may be in contact with one another via the second contact points. Through the first contact points and the second contact points, the bucket manipulating device 802 may provide support to the bucket in which the support provided by the bucket manipulating device 802 may offset the moment(s) and the static force(s) caused by the weight of the bucket, thereby preventing the bucket from rotating and keeping the bucket balanced.

In some embodiments, the latching system 820 of the bucket manipulating device 802 may include a pair of guide panels 830 that are respectively attached to a first side and a second side of the main body 810 as depicted in FIGS. 8A-10B. As depicted in FIGS. 8A-10B, each guide panel 830 may include a front slope 832. The front slope 832 may be configured to guide the handle of the bucket to a position under the guide panel 830 to reposition the bucket manipulating device 802 relative to the handle of the bucket, for example, when the bucket manipulating device 802 is misaligned with the handle of the bucket and the front slope 832 of the guide panel 830 is in contact with the handle of the bucket.

Figure 13:
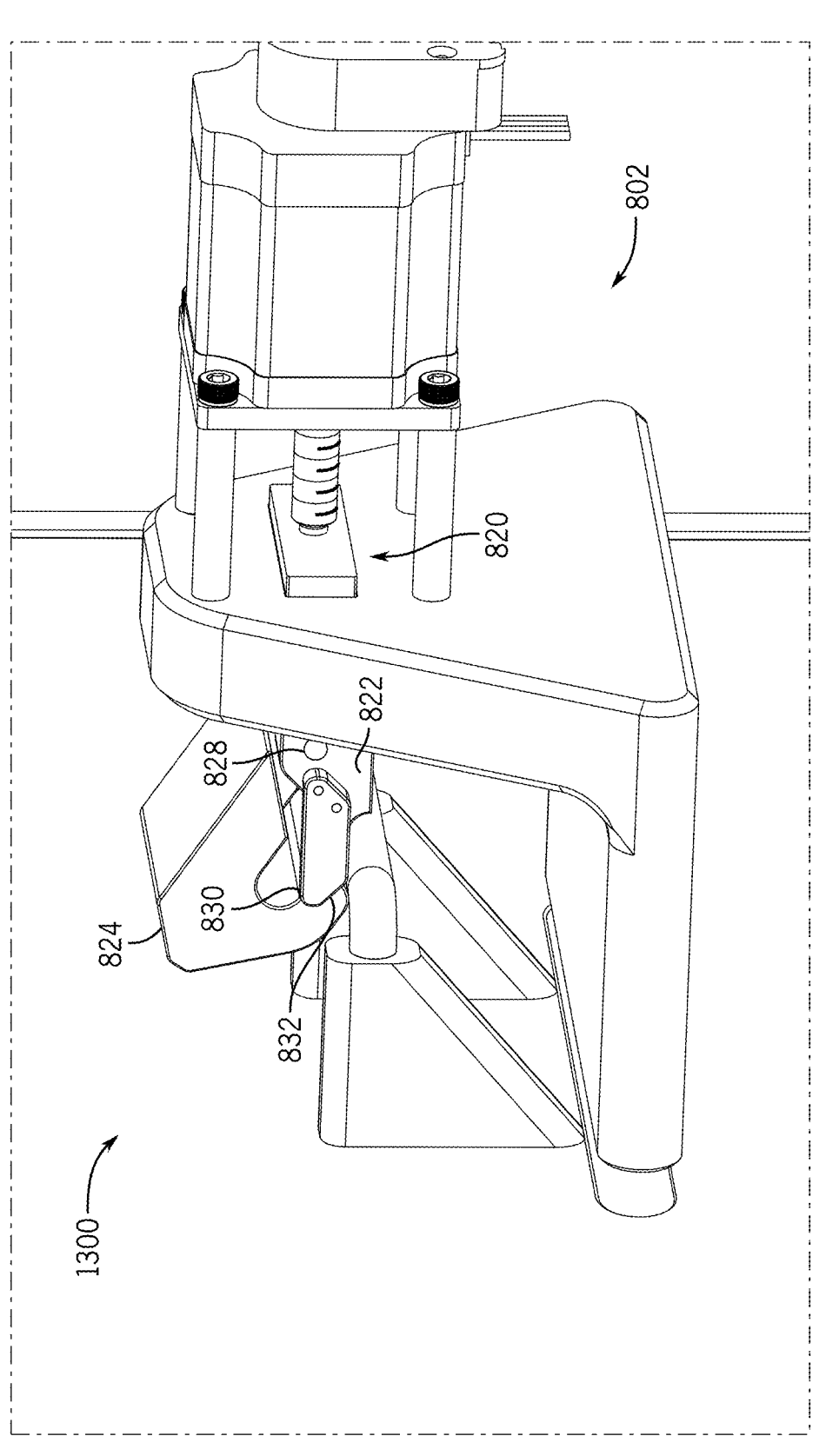
FIG. 13 illustrates an example bucket manipulating device and an example bucket when the bucket manipulating device is in a process of coupling to a handle of the bucket.

As an example, the bucket manipulating device 802 may approach the bucket to couple the coupling portion 824 of the latching system 820 to the handle of the bucket. FIG. 13 shows a diagram 1300 illustrating the bucket manipulating device 802 at a point in time during the process of coupling the coupling portion 824 of the latching system 820 to the handle of the bucket. In some embodiments, the bucket manipulating device 802 may be misaligned with the handle of the bucket. For example, the position of the bucket manipulating device 802 may be relatively lower than the position of the handle of the bucket, and therefore the front slope 832 of the guide panel 830 on the bucket manipulating device 802 may be in contact with the handle of the bucket. In this case, the front slope 832 of the guide panel 830 may guide the handle of the bucket to the position under the guide panel 830. When the front slope 832 of the guide panel 830 guides the handle of the bucket to the position under the guide panel 830, the bucket manipulating device 802 may be pushed upward relative to the ground surface by the handle of the bucket, and thus the bucket manipulating device 802 may be repositioned relative to the handle of the bucket and the misalignment between the bucket manipulating device 802 and the handle of the bucket may be corrected.

In some embodiments, when the handle of the bucket is at the position under the guide panel 830 of the bucket manipulating device 802, the guide panel 830 may be situated on the handle of the bucket as depicted in FIG. 13. Thus, the guide panel 830 may prevent the handle of the bucket from getting in the gap between the coupling portion 824 of the latching system 820 and the base portion 822 of the latching system 820 when the coupling portion 824 rotates relative to the base portion 822 to couple to the handle of the bucket. Accordingly, the guide panel 830 may prevent the handle of the bucket from interfering with the rotation movement of the coupling portion 824 relative to the base portion 822, and thus the operations of the latching system 820 in the bucket manipulating device 802 may be facilitated.

In some embodiments, the bucket manipulating device 802 described above may be used to interact with the bucket. For example, the bucket manipulating device 802 may be coupled to a robotic system such as an industrial robot as an end effector of the industrial robot, and the industrial robot may use the bucket manipulating device 802 to operate or manipulate the bucket. Additionally or alternatively, the bucket manipulating device 802 may not be implemented as a part of the industrial robot, and the industrial robot may use the bucket manipulating device 802 as a tool device to operate or manipulate the bucket. It should be understood that the bucket manipulating device 802 may also be used by a human worker to operate or manipulate the bucket.

Figure 14A:
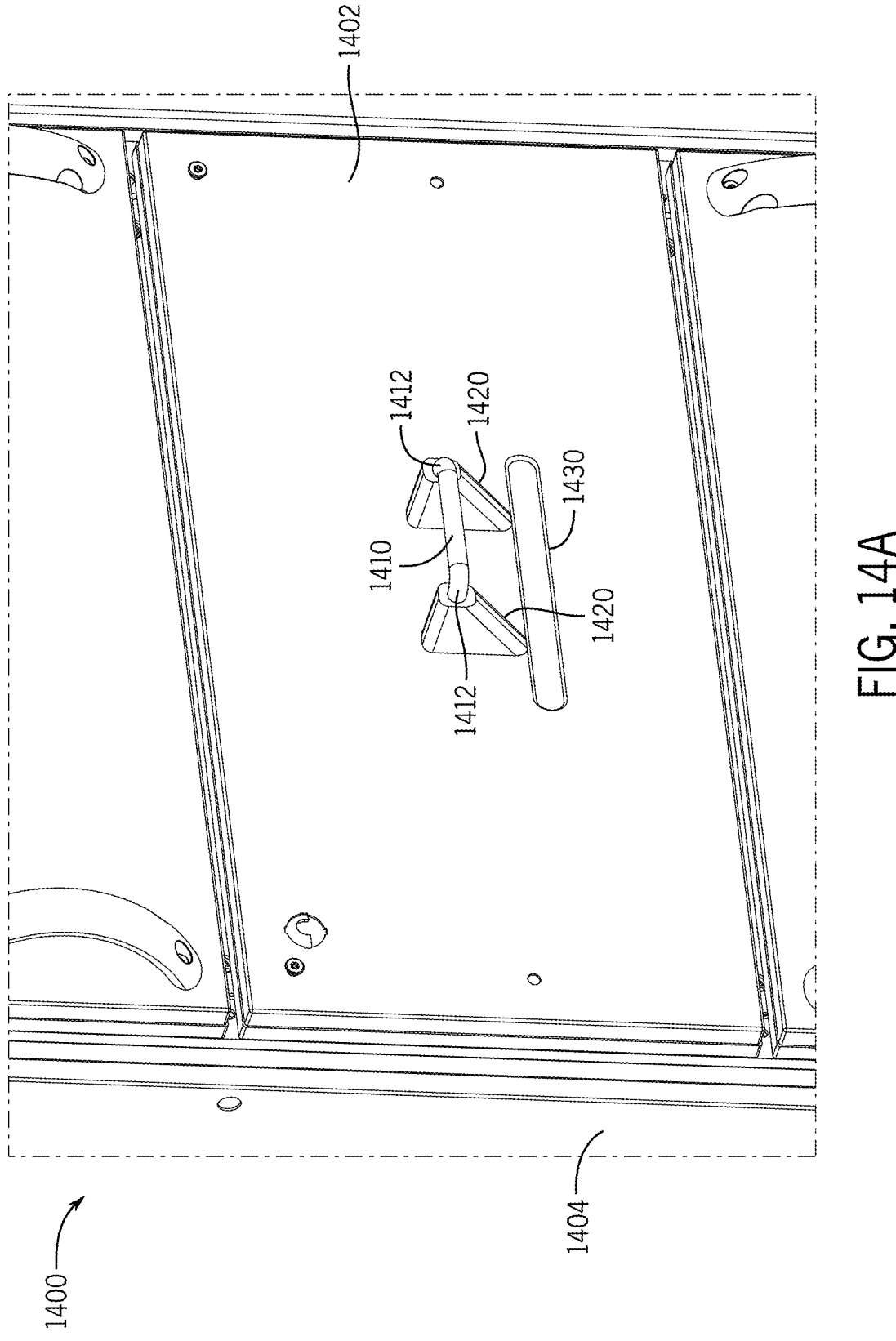
FIGS. 14A-14C illustrate an example bucket.
Figure 14B:
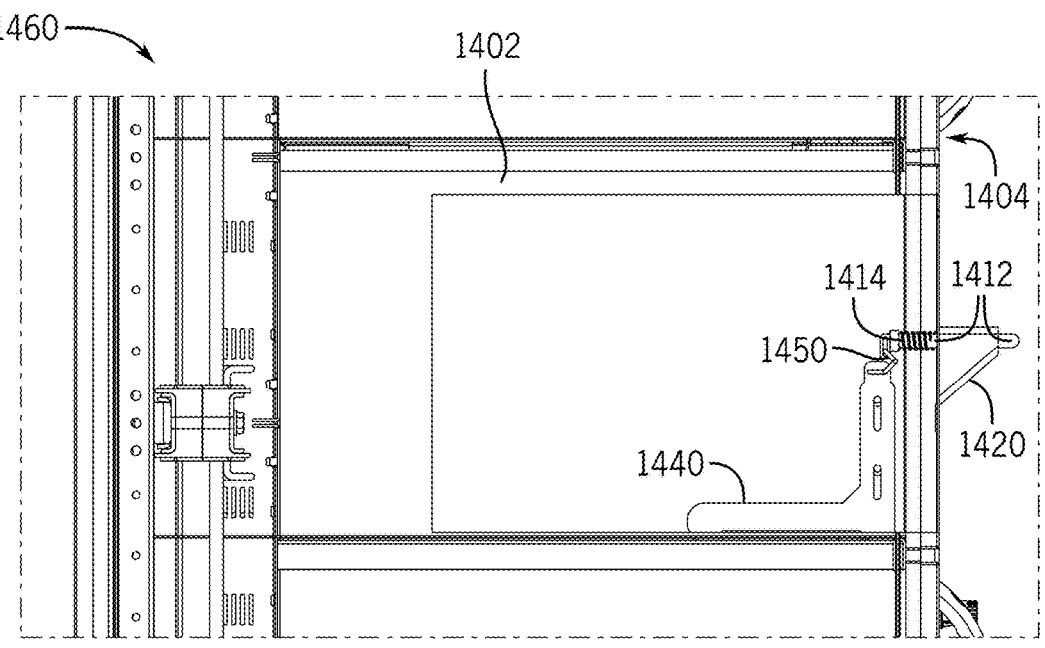
Figure 14C:
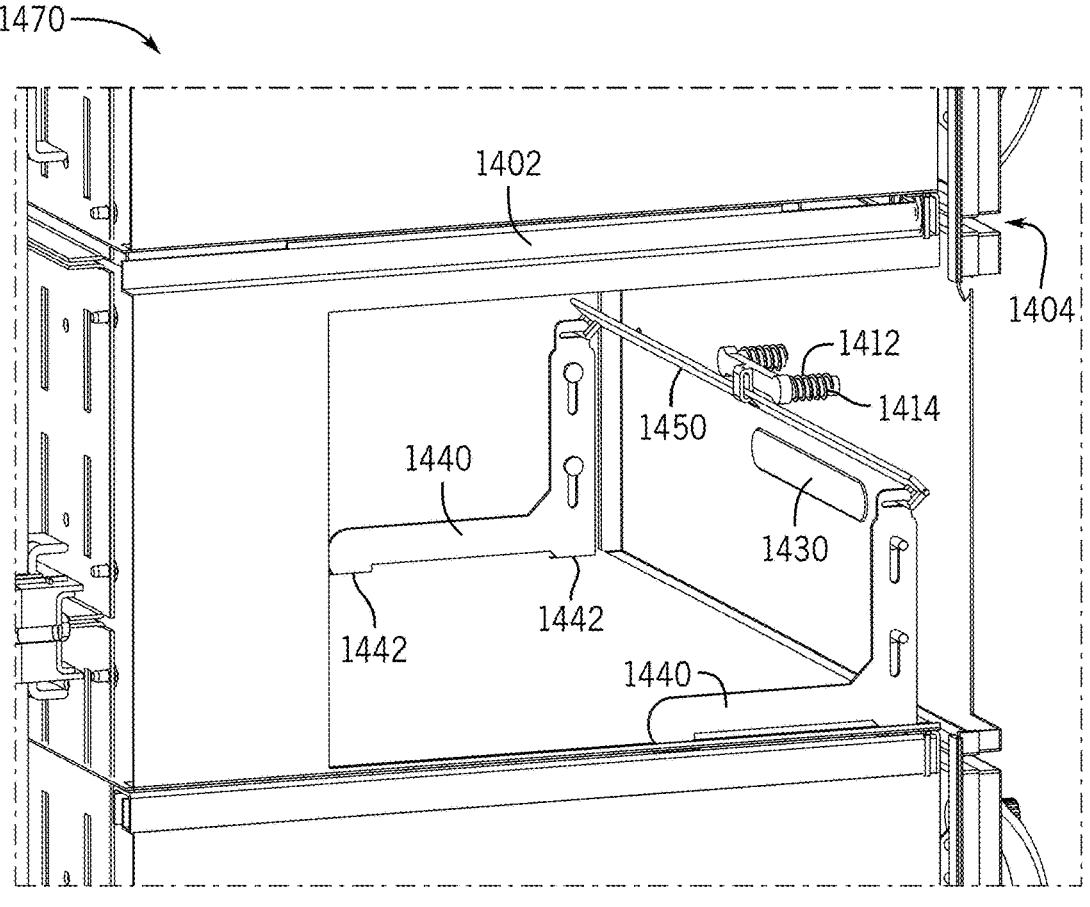

An example bucket 1402 that the bucket manipulating device 802 may be used to interact with is illustrated in FIGS. 14A-14C. As depicted in diagrams 1400, 1460, 1470 of FIGS. 14A-14C, the bucket 1402 may be associated with a section 1404 of a cabinet (e.g., a motor control cabinet or a different type of industrial cabinet). For example, the bucket 1402 may be placeable in the section 1404 of the cabinet and may be movable relative to the section 1404 of the cabinet in a translation motion. In some embodiments, the bucket 1402 may include a front surface. The front surface of the bucket 1402 may be located at a front side of the cabinet when the bucket 1402 is placed in the section 1404 of the cabinet as depicted in FIG. 14A.

In some embodiments, the bucket 1402 may include a handle 1410 positioned on the front surface of the bucket 1402. The handle 1410 of the bucket 1402 may be referred to herein as the handle of the bucket 1402 for simplification. As depicted in FIGS. 14A-14C, the handle of the bucket 1402 may include one or more handle bars 1412 that extend through the front surface of the bucket 1402 towards a space inside the bucket 1402. In some embodiments, each handle bar 1412 may be movable through the front surface of the bucket 1402 and a portion of the handle bar 1412 that is within the bucket 1402 may be placed inside a spring 1414 associated with the handle bar 1412 as depicted in FIGS. 14B-14C.

As depicted in FIGS. 14B-14C, the bucket 1402 may also include a pivot member 1450 located within the bucket 1402. The pivot member 1450 may be connected to the one or more handle bars 1412 of the handle of the bucket 1402 and may be coupled to one or more locking brackets 1440 of the bucket 1402. In some embodiments, the one or more locking brackets 1440 may be located inside the bucket 1402 and each locking bracket 1440 may be placeable in one or more corresponding slots 1442 within the bucket 1402. For example, as depicted in FIG. 14C, each slot 1442 may be located on a bottom surface of the bucket 1402 and may be configured to receive a locking bracket 1440 (e.g., the slot 1442 may receive an extrusion portion of the locking bracket 1440) corresponding to the slot 1442. In some embodiments, when the locking brackets 1440 are respectively placed in one or more slots 1442 among their corresponding slots 1442, the locking brackets 1440 may prevent the bucket 1402 from moving relative to the section 1404 of the cabinet, and thus the bucket 1402 may be in a locked state. On the other hand, when the locking brackets 1440 are removed from the one or more slots 1442 among their corresponding slots 1442, the bucket 1402 may be movable relative to the section 1404 of the cabinet, and thus the bucket 1402 may be in an unlocked state. Thus, when the bucket 1402 is in the locked state, the bucket 1402 may be unmovable relative to the section 1404 of the cabinet. When the bucket 1402 is in the unlocked state, the bucket 1402 may be movable relative to the section 1404 of the cabinet.

In some embodiments, when the coupling portion 824 of the latching system 820 in the bucket manipulating device 802 is coupled to the handle of the bucket 1402 and the latching system 820 moves from the protruded state of the latching system 820 to the retracted state of the latching system 820, the handle of the bucket 1402 may be moved forward relative to the bucket 1402 and may cause the bucket 1402 to transition from the locked state in which the bucket 1402 is unmovable relative to the section 1404 of the cabinet to the unlocked state in which the bucket 1402 is movable relative to the section 1404 of the cabinet. Additionally or alternatively, when the coupling portion 824 of the latching system 820 in the bucket manipulating device 802 is coupled to the handle of the bucket 1402 and the latching system 820 moves from the retracted state of the latching system 820 to the protruded state of the latching system 820, the handle of the bucket 1402 may be returned to a default position relative to the bucket 1402 and may cause the bucket 1402 to transition from the unlocked state in which the bucket 1402 is movable relative to the section 1404 of the cabinet to the locked state in which the bucket 1402 is unmovable relative to the section 1404 of the cabinet.

To illustrate, when the coupling portion 824 of the latching system 820 is coupled to the handle of the bucket 1402, the handle of the bucket 1402 may be located within the slot 826 of the coupling portion 824 as described herein. In addition, when the coupling portion 824 of the latching system 820 is coupled to the handle of the bucket 1402 and the latching system 820 moves from its protruded state to its retracted state, the latching system 820 including the coupling portion 824 may move away from the bucket 1402 towards the main body 810 of the bucket manipulating device 802 as described herein. In this case, the coupling portion 824 may move the handle of the bucket 1402 with the coupling portion 824 due to the relative position of the handle of the bucket 1402 relative to the coupling portion 824 and the moving direction of the latching system 820 including the coupling portion 824. Accordingly, the handle of the bucket 1402 may be moved away from the bucket 1402 towards the main body 810 of the bucket manipulating device 802 by the latching system 820 that includes the coupling portion 824 coupled to the handle of the bucket 1402. In other words, when the coupling portion 824 of the latching system 820 is coupled to the handle of the bucket 1402 and the latching system 820 moves from its protruded state to its retracted state, the latching system 820 may pull the handle of the bucket 1402 away from the bucket 1402, and thus the handle of the bucket 1402 may be moved forward relative to the bucket 1402.

In some embodiments, when the handle of the bucket 1402 is moved forward relative to the bucket 1402, the one or more handle bars 1412 of the handle of the bucket 1402 may be moved forward through the front surface of the bucket 1402 in the same direction. Due to the forward movement of the handle bars 1412, the springs 1414 associated with the handle bars 1412 may be compressed and the pivot member 1450 coupled to the handle bars 1412 may rotate upward relative to the bottom surface of the bucket 1402. In some embodiments, when the pivot member 1450 rotates upward relative to the bottom surface of the bucket 1402, the pivot member 1450 may lift up the locking brackets 1440 coupled to the pivot member 1450, and thus the locking brackets 1440 may be removed from one or more corresponding slots 1442 located on the bottom surface of the bucket 1402. In some embodiments, when the locking brackets 1440 are removed from the one or more corresponding slots 1442, the bucket 1402 may be in the unlocked state and may be movable relative to the section 1404 of the cabinet. Accordingly, the bucket 1402 may be moved forward or backward in the translation motion relative to the section 1404 of the cabinet.

In some embodiments, when the coupling portion 824 of the latching system 820 in the bucket manipulating device 802 is coupled to the handle of the bucket 1402 and the latching system 820 is in the retracted state, the latching system 820 may move from the retracted state of the latching system 820 to the protruded state of the latching system 820. When the coupling portion 824 of the latching system 820 in the bucket manipulating device 802 is coupled to the handle of the bucket 1402 and the latching system 820 moves from the retracted state of the latching system 820 to the protruded state of the latching system 820, the latching system 820 including the coupling portion 824 may move towards the bucket 1402, and therefore the latching system 820 including the coupling portion 824 may no longer pull the handle of the bucket 1402 away from the bucket 1402. As a result, the handle bars 1412 of the handle of the bucket 1402 may no longer be moved forward through the front surface of the bucket 1402, and therefore the springs 1414 associated with the handle bars 1412 may no longer be compressed. Instead, the springs 1414 associated with the handle bars 1412 may be uncompressed and the springs 1414 being uncompressed may cause the handle bars 1412 located within the springs 1414 to be retracted backward towards the space inside the bucket 1402.

In some embodiments, when the handle bars 1412 of the handle of the bucket 1402 are retracted backward towards the space inside the bucket 1402, the handle of the bucket 1402 may be returned to its default position relative to the bucket 1402. At this default position, the handle of the bucket 1402 may not be moved away from the bucket 1402, the handle bars 1412 of the handle of the bucket 1402 may not be moved forward through the front surface of the bucket 1402, and the springs 1414 associated with the handle bars 1412 may not be compressed. In other words, the default position of the handle of the bucket 1402 may be the position of the handle of the bucket 1402 relative to the bucket 1402 when the handle of the bucket 1402 is not operated or not interacted with by the bucket manipulating device 802.

In some embodiments, when the handle bars 1412 of the handle of the bucket 1402 are retracted backward towards the space inside the bucket 1402 and the handle of the bucket 1402 is returned to its default position relative to the bucket 1402, the pivot member 1450 coupled to the handle bars 1412 may rotate downward relative to the bottom surface of the bucket 1402. In some embodiments, when the pivot member 1450 rotates downward relative to the bottom surface of the bucket 1402, the pivot member 1450 may lower down the locking brackets 1440 coupled to the pivot member 1450, and thus the locking brackets 1440 may be placed in one or more corresponding slots 1442 located on the bottom surface of the bucket 1402. In some embodiments, when the locking brackets 1440 are placed in the one or more corresponding slots 1442, the bucket 1402 may be in the locked state and may be unmovable relative to the section 1404 of the cabinet. Accordingly, the bucket 1402 cannot be moved forward or backward in the translation motion relative to the section 1404 of the cabinet.

Thus, by coupling the coupling portion 824 of the latching system 820 in the bucket manipulating device 802 to the handle of the bucket 1402 and moving the latching system 820 of the bucket manipulating device 802 between the protruded state of the latching system 820 and the retracted state of the latching system 820, the bucket manipulating device 802 may cause the bucket 1402 to transition between the unlocked state in which the bucket 1402 is movable relative to the section 1404 of the cabinet and the locked state in which the bucket 1402 is unmovable relative to the section 1404 of the cabinet. This implementation is advantageous, because it enables the bucket manipulating device 802 to pull the handle of the bucket 1402 forward relative to the bucket 1402 to unlock the bucket 1402 so that the bucket 1402 is movable relative to the section 1404 of the cabinet, and also enables the bucket manipulating device 802 to stop pulling the handle of the bucket 1402 forward relative to the bucket 1402 to lock the bucket 1402 so that the bucket 1402 is unmovable relative to the section 1404 of the cabinet. Accordingly, the bucket manipulating device 802 may operate or manipulate the handle of the bucket 1402 to unlock the bucket 1402 and enable the bucket 1402 to move or to lock the bucket 1402 and prevent the bucket 1402 from moving. As a result, the operations of the bucket manipulating device 802 in operating the bucket 1402 and/or interacting with the bucket 1402 may be simplified.

In some embodiments, to further facilitate the operations of the bucket manipulating device 802 with the bucket 1402, the bucket 1402 may include a guide slope 1420 as depicted in FIGS. 14A and 14B. As depicted in FIGS. 14A and 14B, the guide slope 1420 may be positioned on the front surface of the bucket 1402 and under the handle of the bucket 1402. In some embodiments, the guide slope 1420 may be configured to guide the supporting member 816 of the main body 810 in the bucket manipulating device 802 (also referred to herein as the supporting member 816 of the bucket manipulating device 802) to a position under the guide slope 1420 of the bucket 1402 to reposition the bucket manipulating device 802 relative to the handle of the bucket 1402, for example, when the bucket manipulating device 802 is misaligned with the handle of the bucket 1402 and the supporting member 816 of the bucket manipulating device 802 is in contact with the guide slope 1420 of the bucket 1402.

Figure 15:
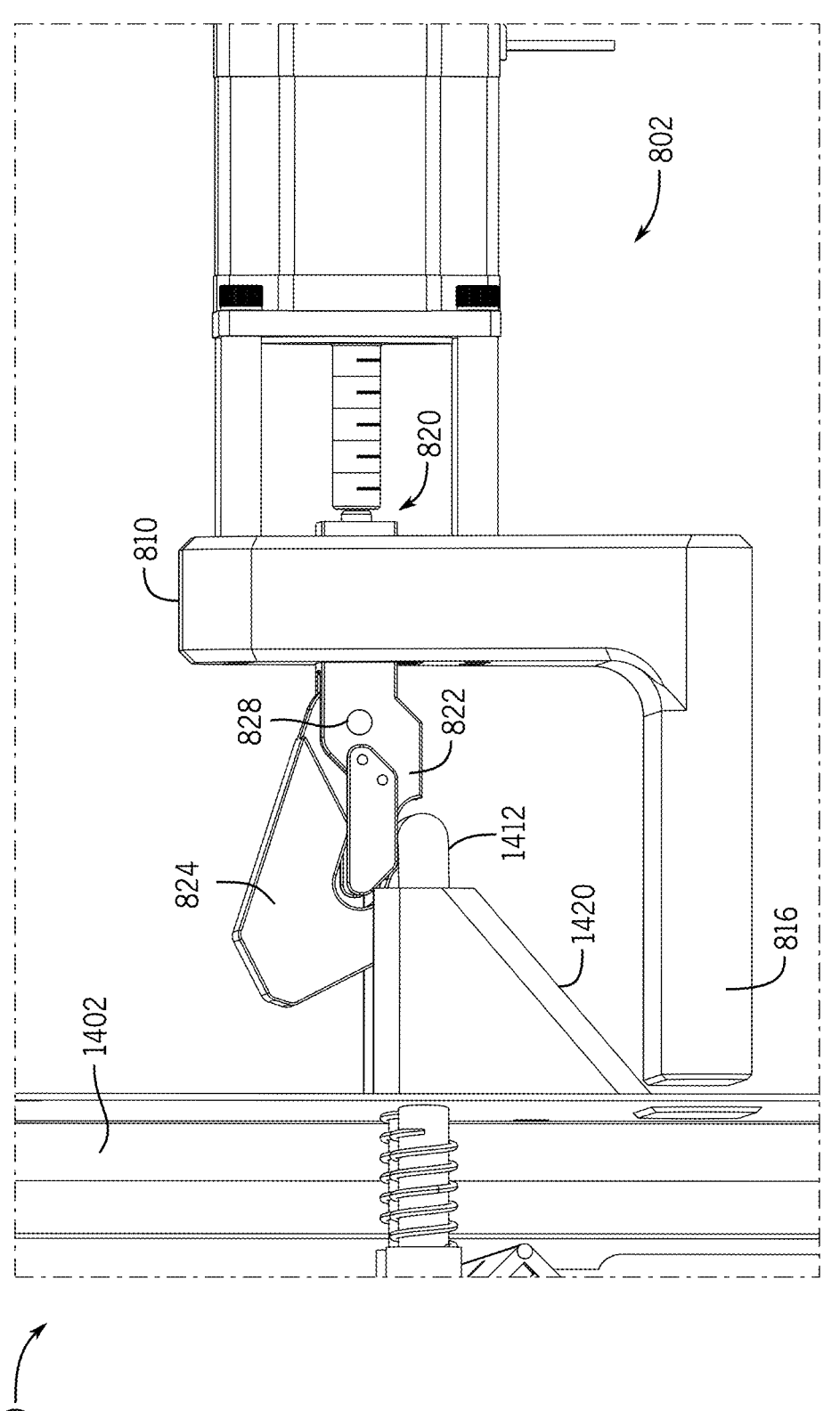
FIG. 15 illustrates an example bucket manipulating device and an example bucket when the bucket manipulating device is in a process of coupling to a handle of the bucket.

As an example, the bucket manipulating device 802 may approach the bucket 1402 to couple the coupling portion 824 of the latching system 820 in the bucket manipulating device 802 to the handle of the bucket 1402. FIG. 15 shows a diagram 1500 illustrating the bucket manipulating device 802 at a point in time during the process of coupling the coupling portion 824 of the latching system 820 to the handle of the bucket 1402. In some embodiments, the bucket manipulating device 802 may be misaligned with the handle of the bucket 1402. For example, the position of the bucket manipulating device 802 may be relatively higher than the position of the handle of the bucket 1402, and therefore the supporting member 816 of the bucket manipulating device 802 may be in contact with the guide slope 1420 of the bucket 1402. In this case, the guide slope 1420 of the bucket 1402 may guide the supporting member 816 of the bucket manipulating device 802 to the position under the guide slope 1420 of the bucket 1402. When the guide slope 1420 of the bucket 1402 guides the supporting member 816 of the bucket manipulating device 802 to the position under the guide slope 1420 of the bucket 1402, the bucket manipulating device 802 may be lowered down towards the ground surface, and thus the bucket manipulating device 802 may be repositioned relative to the handle of the bucket 1402 and the misalignment between the bucket manipulating device 802 and the handle of the bucket 1402 may be corrected.

In some embodiments, the bucket 1402 may also include an indented portion 1430 as depicted in FIGS. 14A and 14C. As depicted in FIGS. 14A and 14C, the indented portion 1430 may be formed on the front surface of the bucket 1402 and may be positioned under the guide slope 1420 of the bucket 1402 to receive the supporting member 816 of the bucket manipulating device 802 when the bucket manipulating device 802 is aligned with the handle of the bucket 1402. In some embodiments, the indented portion 1430 may be used as an indicator to align the bucket manipulating device 802 with the handle of the bucket 1402. For example, to align the bucket manipulating device 802 with the handle of the bucket 1402, the industrial robot (or the human worker) may position the bucket manipulating device 802 relative to the bucket 1402 such that the supporting member 816 of the bucket manipulating device 802 is aligned with the indented portion 1430 on the front surface of the bucket 1402 and the supporting member 816 of the bucket manipulating device 802 may fit in the indented portion 1430 of the bucket 1402 as depicted in FIG. 13. The implementation of the indented portion 1430 on the bucket 1402 is advantageous, because it facilitates the industrial robot and/or the human worker in aligning the bucket manipulating device 802 with the handle of the bucket 1402.

In some embodiments, the indented portion 1430 may itself include an alignment feature. For example, the indented portion 1430 may include a chamfer created on an edge of the indented portion 1430 as depicted in FIG. 14A. In some embodiments, when the supporting member 816 of the bucket manipulating device 802 is misaligned with the indented portion 1430 of the bucket 1402, the supporting member 816 of the bucket manipulating device 802 may be in contact with the alignment feature (e.g., the chamfer) of the indented portion 1430. In this case, the alignment feature of the indented portion 1430 may guide the supporting member 816 of the bucket manipulating device 802 to a position within the indented portion 1430 to fit the supporting member 816 of the bucket manipulating device 802 in the indented portion 1430, thereby correcting the misalignment between the supporting member 816 of the bucket manipulating device 802 and the indented portion 1430. The implementation of the alignment feature (e.g., the chamfer) for the indented portion 1430 is advantageous, because it facilitates the industrial robot and/or the human worker in aligning the supporting member 816 of the bucket manipulating device 802 with the indented portion 1430 on the bucket 1402 to align the bucket manipulating device 802 with the handle of the bucket 1402 as described above.

In some embodiments, the bucket manipulating device 802 described above may be used to operate or to interact with the bucket 1402. For example, the bucket manipulating device 802 may be used by the industrial robot (or the human worker) in unlocking the bucket 1402 to move the bucket 1402 relative to the section 1404 of the cabinet, locking the bucket 1402 to prevent the bucket 1402 from being moved relative to the section 1404 of the cabinet, carrying the bucket 1402 to transport the bucket 1402 between different locations, etc.

To illustrate, FIGS. 16A-16H show an example scenario in which the bucket manipulating device 802 is used to manipulate the bucket 1402 and interact with the bucket 1402. FIGS. 16A-16H are described in the context where the bucket manipulating device 802 is operated by the industrial robot. However, it should be understood that the human worker may operate the bucket manipulating device 802 to manipulate and interact with the bucket 1402 in a similar manner.

Figure 16A:
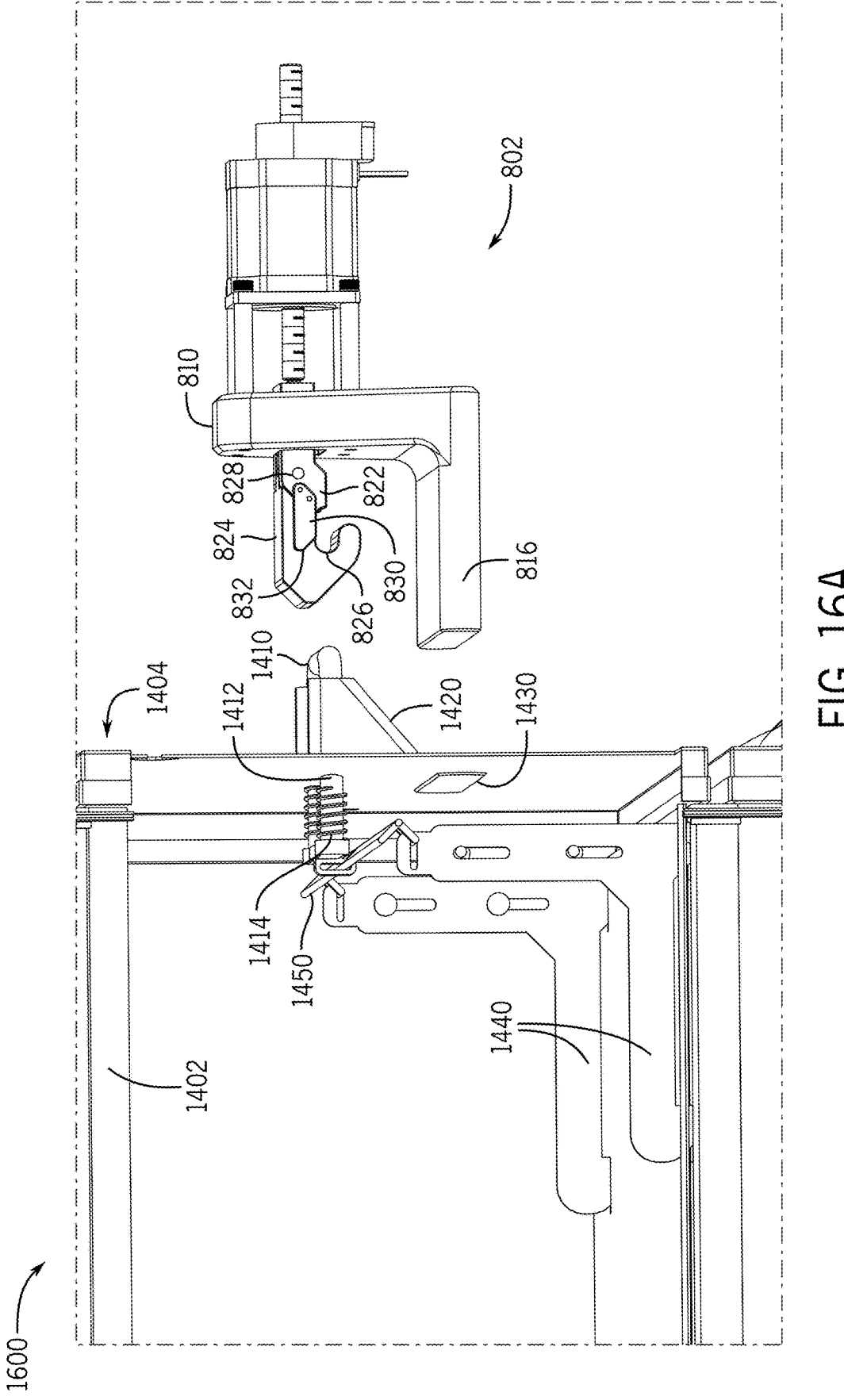
FIGS. 16A-16H illustrate example operations of a bucket manipulating device and a bucket when the bucket manipulating device interacts with the bucket.

As depicted in a diagram 1600 of FIG. 16A, the bucket 1402 may be placed in the section 1404 of the cabinet and the industrial robot may move the bucket manipulating device 802 towards the bucket 1402. In some embodiments, when the bucket manipulating device 802 is moved towards the bucket 1402, the latching system 820 of the bucket manipulating device 802 may be in the protruded state and the coupling portion 824 of the latching system 820 may be in its original position where the coupling portion 824 of the latching system 820 does not rotate relative to the base portion 822 of the latching system 820 as depicted in FIG. 16A.

As depicted in diagrams 1610, 1620, 1630, 1640 of FIGS. 16B-16E, when the bucket manipulating device 802 approaches the bucket 1402 and the bucket manipulating device 802 is located proximate to the bucket 1402 with the latching system 820 of the bucket manipulating device 802 in the protruded state, the industrial robot may operate the bucket manipulating device 802 to move the coupling portion 824 of the latching system 820 relative to the base portion 822 of the latching system 820 to couple the coupling portion 824 of the latching system 820 to the handle of the bucket 1402.

Figure 16B:
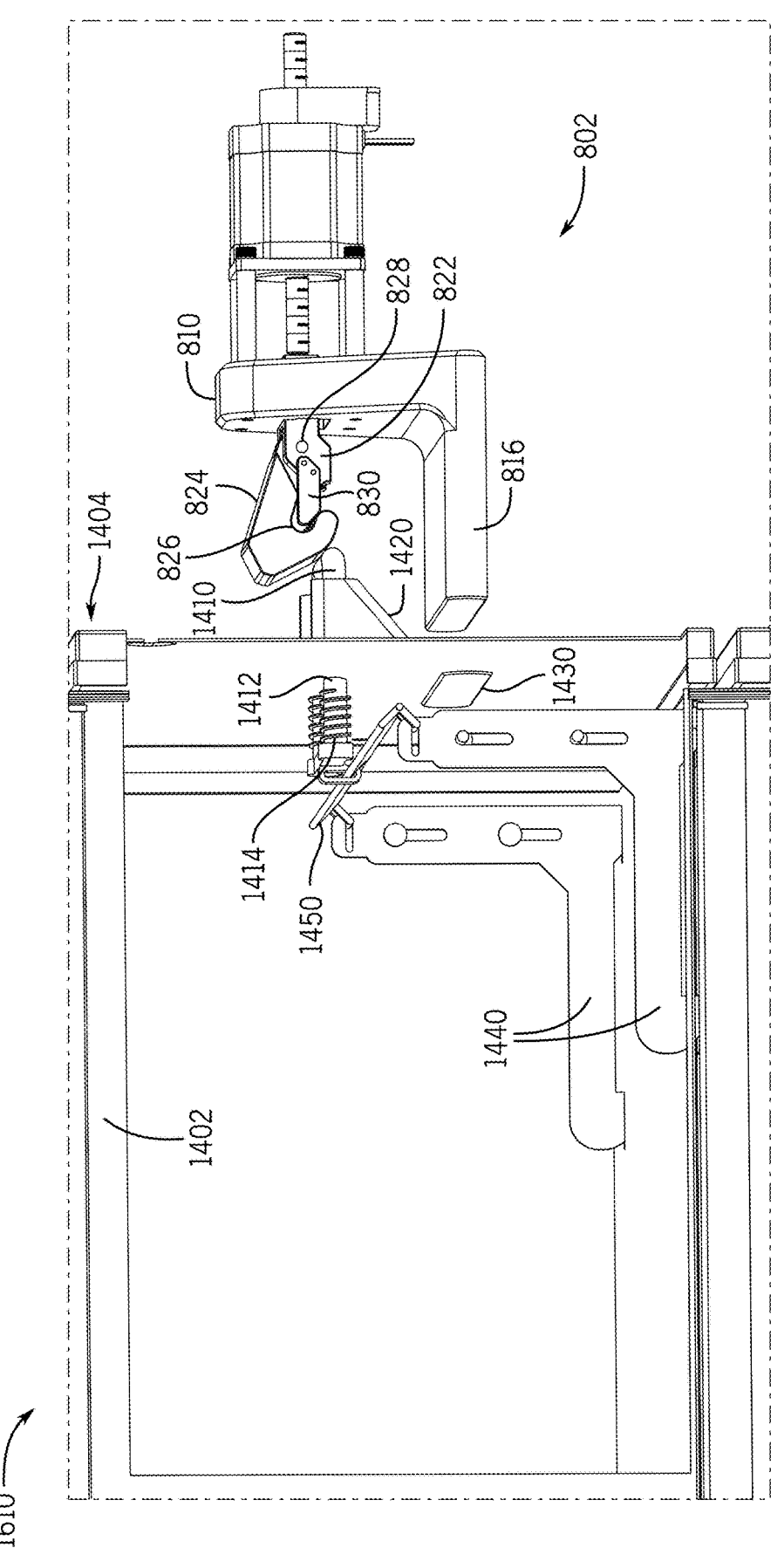
Figure 16C:
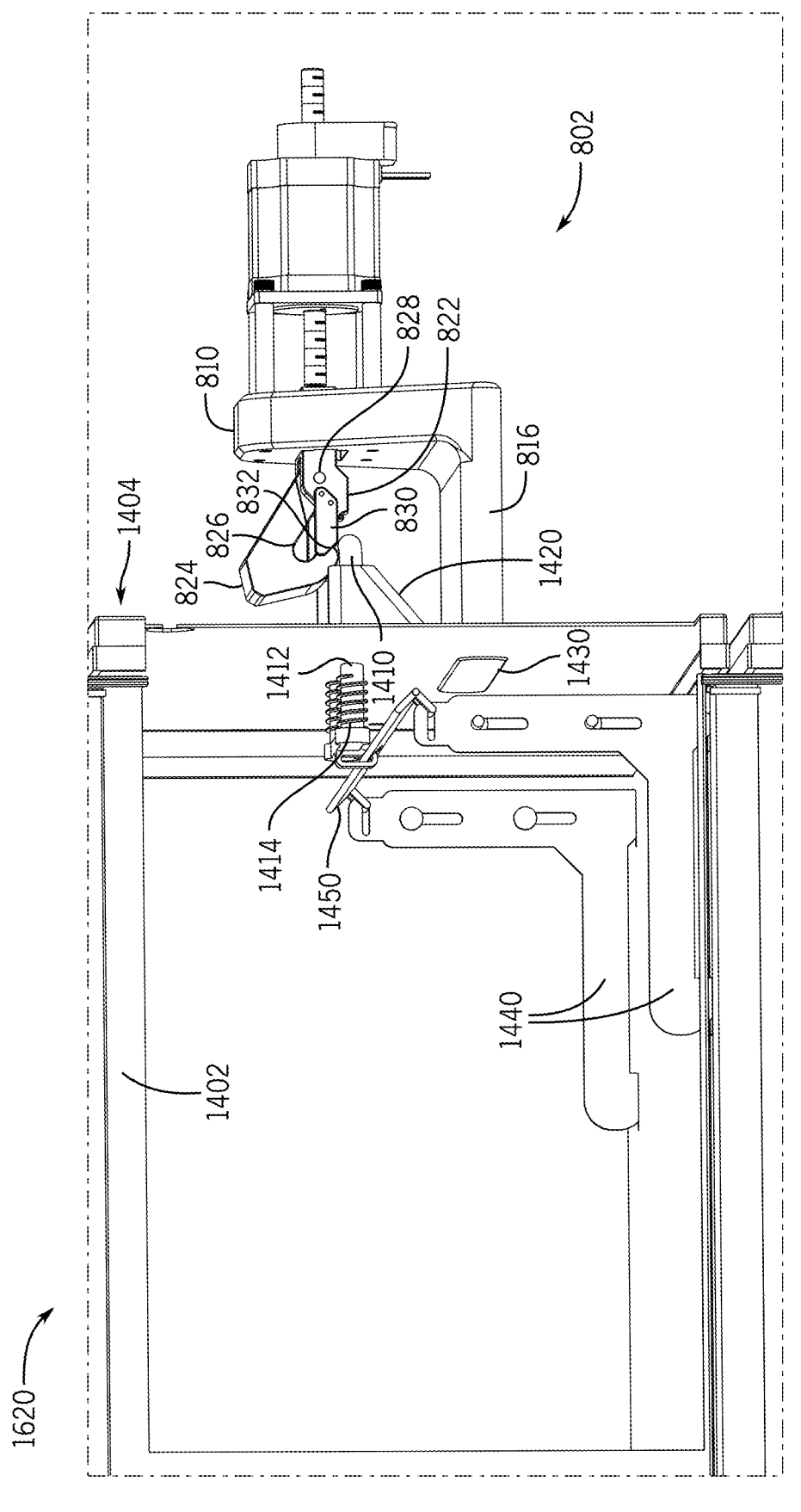
Figure 16D:
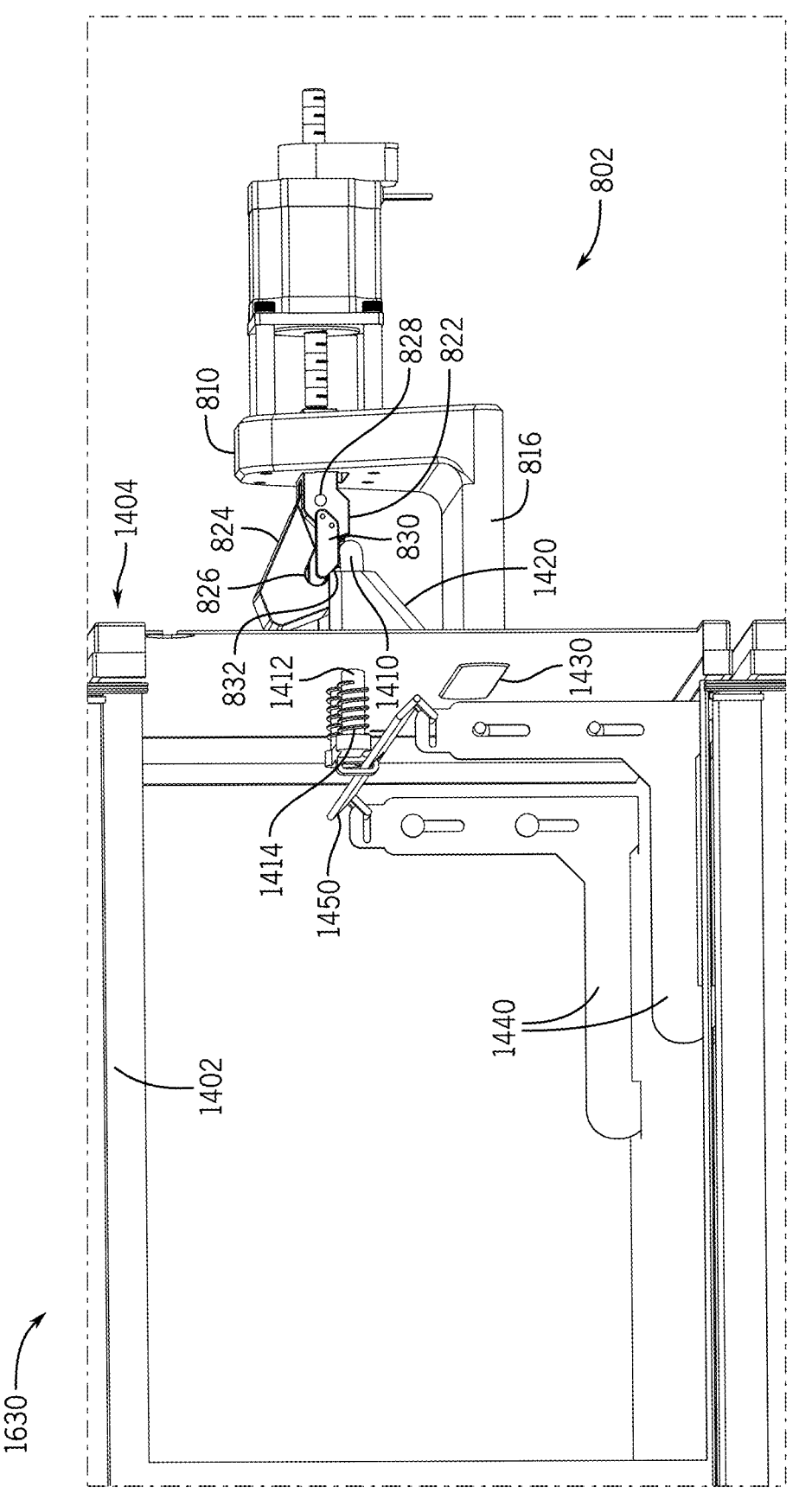
Figure 16E:
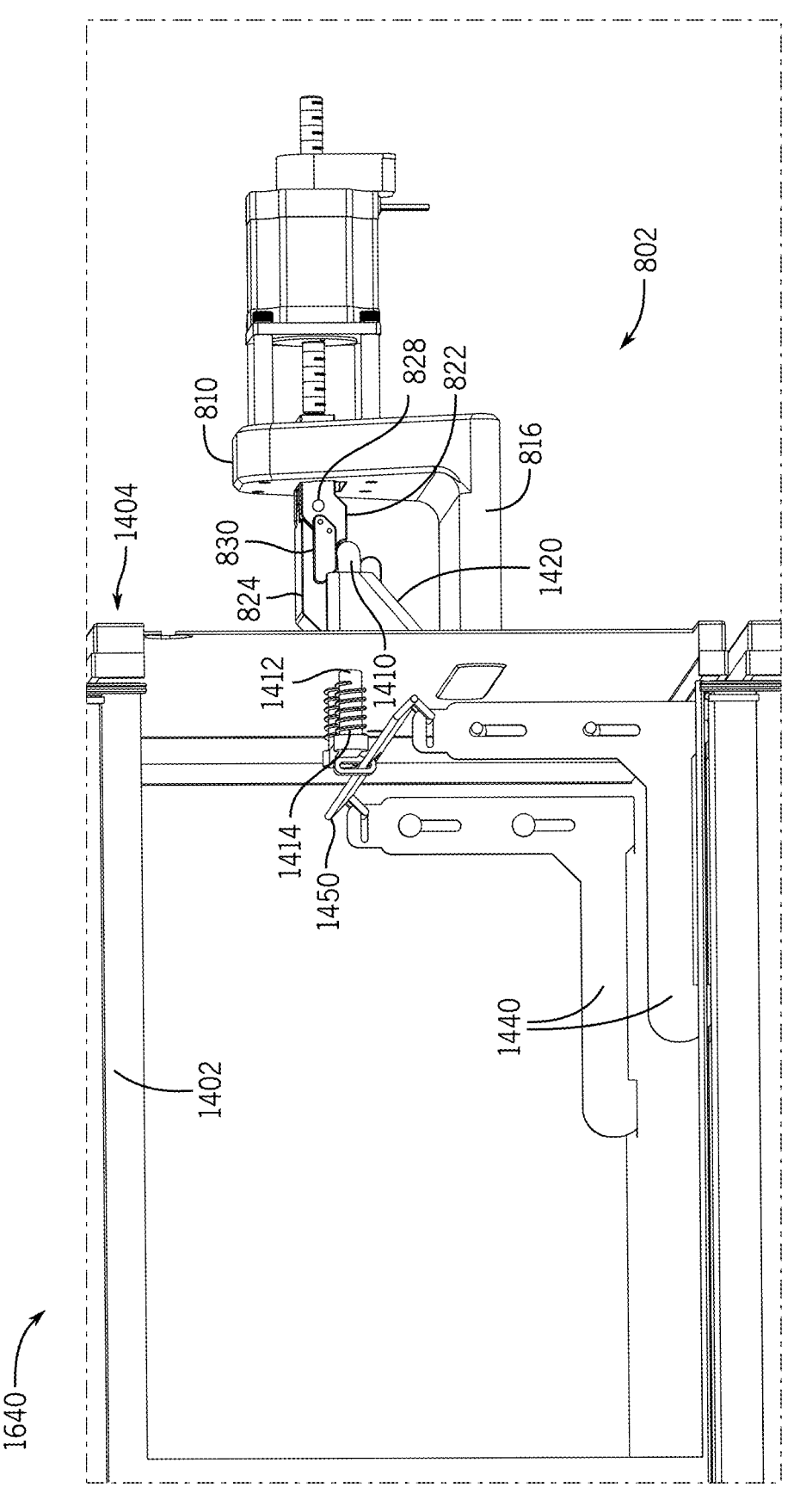

For example, to couple to the handle of the bucket 1402, the coupling portion 824 of the latching system 820 may rotate upward relative to the base portion 822 of the latching system 820 from the original position of the coupling portion 824 as depicted in FIGS. 16B and 16C. In some embodiments, the upward rotation of the coupling portion 824 relative to the base portion 822 may occur when the bucket manipulating device 802 is located proximate to the bucket 1402 such that when the coupling portion 824 rotates upward relative to the base portion 822, the coupling portion 824 may rotate over the handle of the bucket 1402. The coupling portion 824 may then rotate downward relative to the base portion 822 to return to the original position of the coupling portion 824 as depicted in FIGS. 16D and 16E. In some embodiments, when the downward rotation of the coupling portion 824 is completed and the coupling portion 824 reaches the original position of the coupling portion 824, the handle of the bucket 1402 may be located within the slot 826 of the coupling portion 824, and thus the coupling portion 824 may be coupled to the handle of the bucket 1402. Other implementations to couple the coupling portion 824 of the latching system 820 to the handle of the bucket 1402 are also possible and contemplated.

In some embodiments, due to the inaccuracy of the industrial robot in positioning the bucket manipulating device 802 relative to the bucket 1402, the bucket manipulating device 802 may be misaligned with the handle of the bucket 1402. As described herein, the misalignment between the bucket manipulating device 802 and the handle of the bucket 1402 may be corrected with the alignment features implemented on the bucket manipulating device 802 (e.g., the guide panels 830 of the bucket manipulating device 802, etc.) and/or the alignment features implemented on the bucket 1402 (e.g., the guide slope 1420 of the bucket 1402, etc.).

As an example, when the bucket manipulating device 802 is misaligned with the handle of the bucket 1402, the position of the bucket manipulating device 802 may be relatively lower than the position of the handle of the bucket 1402, and therefore the front slope 832 of the guide panel 830 on the bucket manipulating device 802 may be in contact with the handle of the bucket 1402. In this case, the front slope 832 of the guide panel 830 may guide the handle of the bucket 1402 to the position under the guide panel 830. When the front slope 832 of the guide panel 830 guides the handle of the bucket 1402 to the position under the guide panel 830, the bucket manipulating device 802 may be pushed upward relative to the ground surface by the handle of the bucket 1402. Thus, the bucket manipulating device 802 may be repositioned relative to the handle of the bucket 1402, and the misalignment between the bucket manipulating device 802 and the handle of the bucket 1402 in which the position of the bucket manipulating device 802 is relatively lower than the position of the handle of the bucket 1402 may be corrected.

As another example, when the bucket manipulating device 802 is misaligned with the handle of the bucket 1402, the position of the bucket manipulating device 802 may be relatively higher than the position of the handle of the bucket 1402, and therefore the supporting member 816 of the bucket manipulating device 802 may be in contact with the guide slope 1420 of the bucket 1402. In this case, the guide slope 1420 of the bucket 1402 may guide the supporting member 816 of the bucket manipulating device 802 to the position under the guide slope 1420 of the bucket 1402. When the guide slope 1420 of the bucket 1402 guides the supporting member 816 of the bucket manipulating device 802 to the position under the guide slope 1420 of the bucket 1402, the bucket manipulating device 802 may be lowered down towards the ground surface. Thus, the bucket manipulating device 802 may be repositioned relative to the handle of the bucket 1402, and the misalignment between the bucket manipulating device 802 and the handle of the bucket 1402 in which the position of the bucket manipulating device 802 is relatively higher than the position of the handle of the bucket 1402 may be corrected.

In some embodiments, when the bucket manipulating device 802 is aligned with the handle of the bucket 1402, the supporting member 816 of the bucket manipulating device 802 may be aligned with the indented portion 1430 of the bucket 1402, and the indented portion 1430 of the bucket 1402 may receive the supporting member 816 of the bucket manipulating device 802 as described herein. Accordingly, when the bucket manipulating device 802 is successfully coupled to the bucket 1402 with the coupling portion 824 of the latching system 820 coupled to the handle of the bucket 1402, the coupling portion 824 of the latching system 820 and the handle of the bucket 1402 may be in contact with one another via one or more first contact points, and the supporting member 816 of the bucket manipulating device 802 and the front surface (e.g., the indented portion 1430 on the front surface) of the bucket 1402 may be in contact with one another via one or more second contact points. In some embodiments, when the coupling portion 824 of the latching system 820 in the bucket manipulating device 802 is coupled to the handle of the bucket 1402 and the bucket 1402 is carried by the bucket manipulating device 802, the bucket manipulating device 802 may provide support for the bucket 1402 through the first contact points between the coupling portion 824 of the latching system 820 and the handle of the bucket 1402 and through the second contact points between the supporting member 816 of the bucket manipulating device 802 and the front surface (e.g., the indented portion 1430 on the front surface) of the bucket 1402 as described herein.

In some embodiments, when the coupling portion 824 of the latching system 820 in the bucket manipulating device 802 is coupled to the handle of the bucket 1402, the industrial robot may operate the bucket manipulating device 802 to move the latching system 820 from the protruded state of the latching system 820 to the retracted state of the latching system 820 to move the handle of the bucket 1402 forward relative to the bucket 1402 and cause the bucket 1402 to transition from the locked state (in which the bucket 1402 is unmovable relative to the section 1404 of the cabinet) to the unlocked state (in which the bucket 1402 is movable relative to the section 1404 of the cabinet).

Figure 16F:
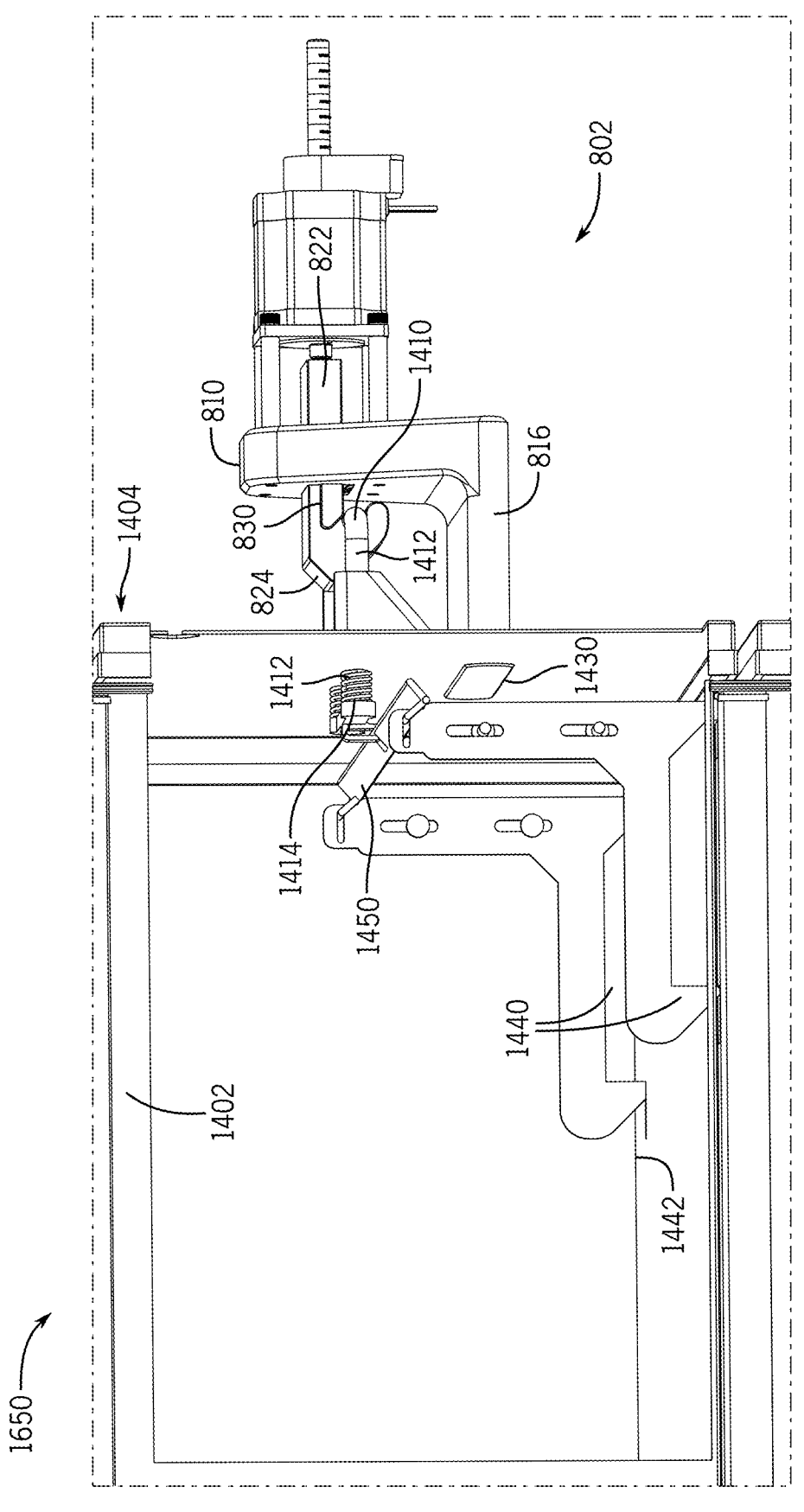

For example, as depicted in diagrams 1640 and 1650 of FIGS. 16E and 16F, when the coupling portion 824 of the latching system 820 is coupled to the handle of the bucket 1402 and the latching system 820 moves from its protruded state as depicted in FIG. 16E to its retracted state as depicted in FIG. 16F, the latching system 820 including the coupling portion 824 may move away from the bucket 1402 towards the main body 810 of the bucket manipulating device 802. In this case, the coupling portion 824 may move the handle of the bucket 1402 with the coupling portion 824 due to the relative position of the handle of the bucket 1402 relative to the coupling portion 824 (e.g., the handle of the bucket 1402 may be located within the slot 826 of the coupling portion 824) and the moving direction of the latching system 820 including the coupling portion 824. Accordingly, the handle of the bucket 1402 may be moved away from the bucket 1402 towards the main body 810 of the bucket manipulating device 802 by the latching system 820 that includes the coupling portion 824 coupled to the handle of the bucket 1402. In other words, when the coupling portion 824 of the latching system 820 is coupled to the handle of the bucket 1402 and the latching system 820 moves from its protruded state to its retracted state, the latching system 820 may pull the handle of the bucket 1402 away from the bucket 1402, and thus the handle of the bucket 1402 may be moved forward relative to the bucket 1402 as depicted in FIG. 16F.

As depicted in FIG. 16F, when the handle of the bucket 1402 is moved forward relative to the bucket 1402, the one or more handle bars 1412 of the handle of the bucket 1402 may be moved forward through the front surface of the bucket 1402 in the same direction. Due to the forward movement of the handle bars 1412, the springs 1414 associated with the handle bars 1412 may be compressed, and the pivot member 1450 located within the bucket 1402 and coupled to the handle bars 1412 may rotate upward relative to the bottom surface of the bucket 1402 as depicted in FIG. 16F. As depicted in FIG. 16F, when the pivot member 1450 rotates upward relative to the bottom surface of the bucket 1402, the pivot member 1450 may lift up the locking brackets 1440 coupled to the pivot member 1450 that are located inside the bucket 1402, and thus the locking brackets 1440 may be removed from one or more corresponding slots 1442 within the bucket 1402 that are located on the bottom surface of the bucket 1402. In some embodiments, when the locking brackets 1440 are removed from the one or more corresponding slots 1442, the bucket 1402 may be in the unlocked state and may be movable relative to the section 1404 of the cabinet. Accordingly, the bucket 1402 may be moved forward or backward in the translation motion relative to the section 1404 of the cabinet.

Figure 16G:
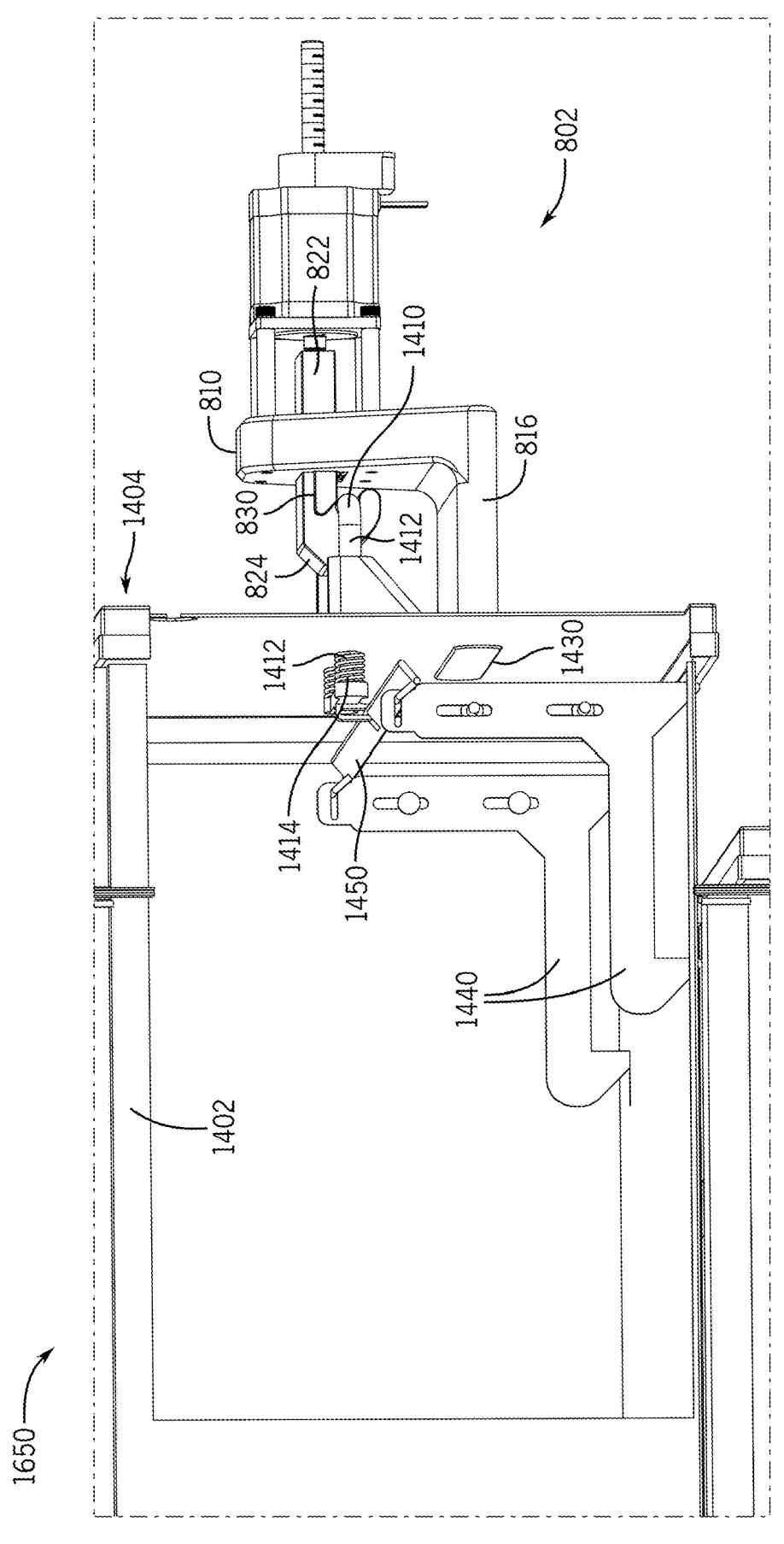

In some embodiments, when the coupling portion 824 of the latching system 820 is coupled to the handle of the bucket 1402 with the latching system 820 of the bucket manipulating device 802 in the retracted state and the bucket 1402 in the unlocked state as described above, the industrial robot may move the bucket 1402 relative to the section 1404 of the cabinet using the bucket manipulating device 802. For example, the bucket manipulating device 802 may be attached to a robotic arm of the industrial robot as an end effector of the industrial robot. The industrial robot may move the robotic arm of the industrial robot to move the bucket manipulating device 802 and the bucket 1402 coupled to the bucket manipulating device 802, thereby moving the bucket 1402 relative to the section 1404 of the cabinet. As an example, the industrial robot may move its robotic arm to move the bucket manipulating device 802 and the bucket 1402 coupled to the bucket manipulating device 802 away from the section 1404 of the cabinet as depicted in a diagram 1660 of FIG. 16G. As depicted in FIG. 16G, the industrial robot may move the bucket manipulating device 802 and the bucket 1402 to a position at which a portion of the bucket 1402 is located outside of the section 1404 of the cabinet. During this movement, the latching system 820 of the bucket manipulating device 802 may remain in the retracted state with the coupling portion 824 of the latching system 820 coupled to the handle of the bucket 1402 to keep pulling the handle of the bucket 1402 forward relative to the bucket 1402 and keep the bucket 1402 in the unlocked state, and thus the bucket 1402 may remain movable relative to the section 1404 of the cabinet while the industrial robot moves the bucket manipulating device 802 and the bucket 1402 coupled to the bucket manipulating device 802.

In some embodiments, when the bucket manipulating device 802 is coupled to the bucket 1402 and a portion of the bucket 1402 is located outside of the section 1404 of the cabinet, the bucket manipulating device 802 may support a portion of the weight of the bucket 1402. Similarly, when the bucket manipulating device 802 is coupled to the bucket 1402 and the entire bucket 1402 is located outside of the section 1404 of the cabinet, the bucket manipulating device 802 may support the entire weight of the bucket 1402. For example, when the bucket manipulating device 802 is coupled to the bucket 1402 and a portion of the bucket 1402 or the entire bucket 1402 is located outside of the section 1404 of the cabinet, the bucket manipulating device 802 may carry the bucket 1402 with the coupling portion 824 of the latching system 820 in the bucket manipulating device 802 coupled to the handle of the bucket 1402 and the latching system 820 in the retracted state. In some embodiments, when the bucket manipulating device 802 carries the bucket 1402, the bucket manipulating device 802 may provide support for the bucket 1402. For example, the bucket manipulating device 802 may provide support for the bucket 1402 through the first contact points between the coupling portion 824 of the latching system 820 and the handle of the bucket 1402 and through the second contact points between the supporting member 816 of the bucket manipulating device 802 and the front surface of the bucket 1402 as described herein. As described herein, the support provided by the bucket manipulating device 802 may offset the moment(s) and the static force(s) caused by the weight of the bucket 1402, thereby preventing the bucket 1402 from rotating and keeping the bucket 1402 balanced.

In addition, as the bucket manipulating device 802 carries the bucket 1402 with the latching system 820 of the bucket manipulating device 802 in the retracted state, the portion of the latching system 820 (e.g., the portion of the coupling portion 824 and the portion of the base portion 822 in the latching system 820) that includes the hinge 828 via which the coupling portion 824 and the base portion 822 are coupled to one another may be located within the main body 810 of the bucket manipulating device 802 as described herein. Accordingly, the coupling portion 824 of the latching system 820 may be prevented from rotating relatively to the base portion 822 of the latching system 820 and the bucket manipulating device 802 may hold the bucket 1402 securely with the latching system 820 when the bucket manipulating device 802 carries the bucket 1402 as described herein. In some embodiments, the industrial robot may use the bucket manipulating device 802 to carry the bucket 1402 and transport the bucket 1402. For example, the industrial robot may use the bucket manipulating device 802 to move the bucket 1402 out of the section 1404 of the cabinet in the manner described above. When the bucket 1402 is moved (partially or entirely) out of the section 1404 of the cabinet, the industrial robot may use the bucket manipulating device 802 to carry the bucket 1402 and transport the bucket 1402 to a different location.

In some embodiments, when the coupling portion 824 of the latching system 820 is coupled to the handle of the bucket 1402 and the latching system 820 is in the retracted state, the bucket 1402 may be in the unlocked state and may be movable relative to the section 1404 of the cabinet as described herein. In some embodiments, when the coupling portion 824 of the latching system 820 is coupled to the handle of the bucket 1402 and the latching system 820 is in the retracted state, the industrial robot may operate the bucket manipulating device 802 to move the latching system 820 from the retracted state of the latching system 820 to the protruded state of the latching system 820. When the coupling portion 824 of the latching system 820 is coupled to the handle of the bucket 1402 and the latching system 820 is moved from the retracted state to the protruded state, the handle of the bucket 1402 may be returned to its default position relative to the bucket 1402, thereby causing the bucket 1402 to transition from the unlocked state to the locked state.

Figure 16H:
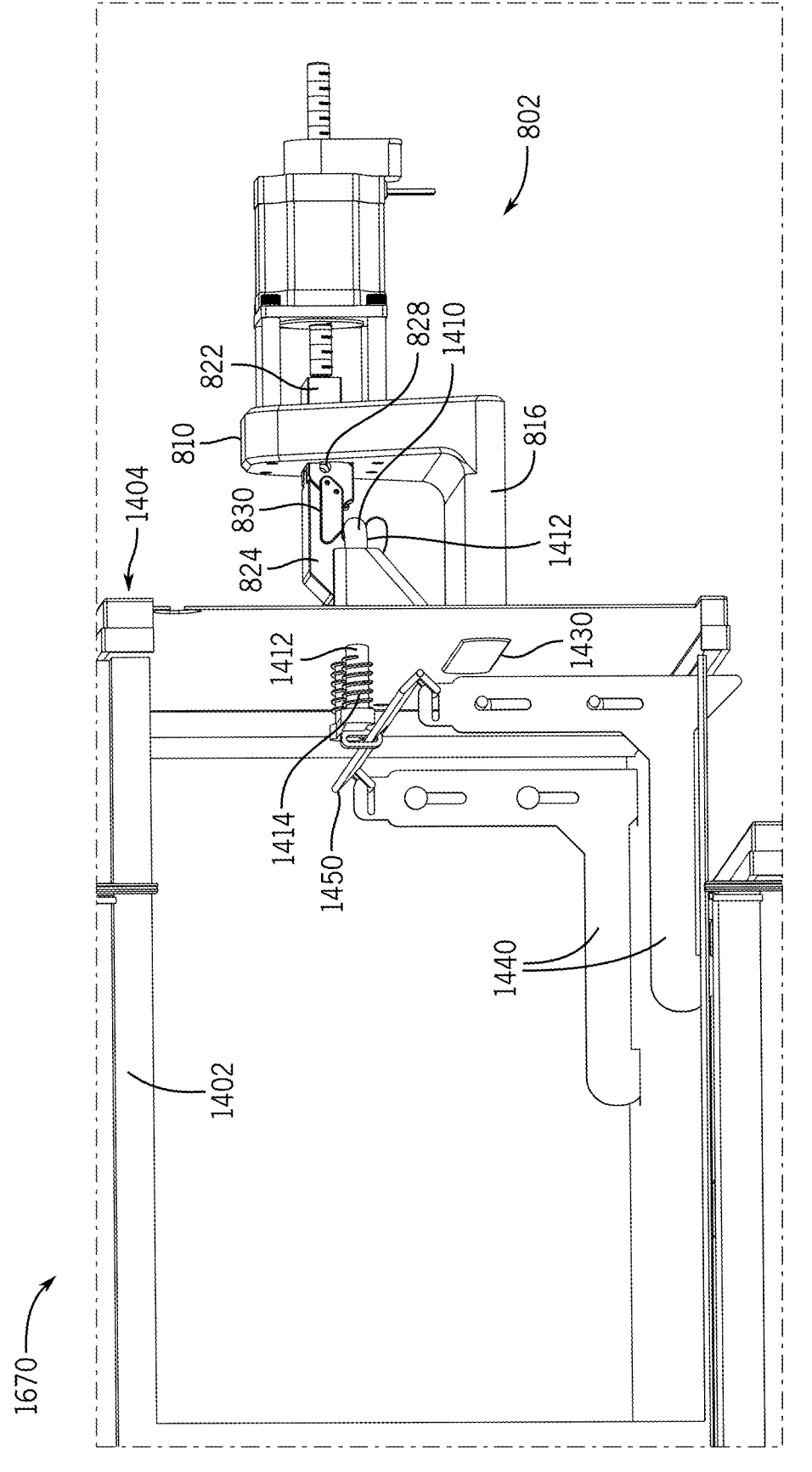

For example, as depicted in diagrams 1660 and 1670 of FIGS. 16G and 16H, when the coupling portion 824 of the latching system 820 is coupled to the handle of the bucket 1402 and the latching system 820 moves from its retracted state as depicted in FIG. 16G to its protruded state as depicted in FIG. 16H, the latching system 820 including the coupling portion 824 may move away from the main body 810 of the bucket manipulating device 802 towards the bucket 1402. Thus, the handle of the bucket 1402 may no longer be moved away from the bucket 1402 towards the main body 810 of the bucket manipulating device 802 by the latching system 820 that includes the coupling portion 824 coupled to the handle of the bucket 1402. In other words, when the coupling portion 824 of the latching system 820 is coupled to the handle of the bucket 1402 and the latching system 820 moves from its retracted state to its protruded state, the latching system 820 may no longer pull the handle of the bucket 1402 away from the bucket 1402, and thus the handle of the bucket 1402 may no longer be moved forward relative to the bucket 1402 as depicted in FIG. 16H.

As depicted in FIG. 16H, when the handle of the bucket 1402 is no longer moved forward relative to the bucket 1402, the one or more handle bars 1412 of the handle of the bucket 1402 may no longer be moved forward through the front surface of the bucket 1402 in that direction, and therefore the springs 1414 associated with the handle bars 1412 may no longer be compressed. Instead, the springs 1414 associated with the handle bars 1412 may be uncompressed and the springs 1414 being uncompressed may cause the handle bars 1412 located within the springs 1414 to be retracted backward towards the space inside the bucket 1402 as depicted in FIG. 16H. In some embodiments, when the handle bars 1412 of the handle of the bucket 1402 are retracted backward towards the space inside the bucket 1402, the handle of the bucket 1402 may be returned to its default position relative to the bucket 1402, and the pivot member 1450 located within the bucket 1402 and coupled to the handle bars 1412 may rotate downward relative to the bottom surface of the bucket 1402 as depicted in FIG. 16H. As depicted in FIG. 16H, when the pivot member 1450 rotates downward relative to the bottom surface of the bucket 1402, the pivot member 1450 may lower down the locking brackets 1440 coupled to the pivot member 1450 that are located inside the bucket 1402, and thus the locking brackets 1440 may be placed in one or more corresponding slots 1442 within the bucket 1402 that are located on the bottom surface of the bucket 1402. In some embodiments, when the locking brackets 1440 are placed in the one or more corresponding slots 1442, the bucket 1402 may be in the locked state and may be unmovable relative to the section 1404 of the cabinet. Accordingly, the bucket 1402 cannot be moved forward or backward in the translation motion relative to the section 1404 of the cabinet.

Thus, as described herein, the bucket manipulating device 802 may be used to operate and/or interact with the bucket 1402. For example, the bucket manipulating device 802 may be used to unlock the bucket 1402 so that the bucket 1402 is movable relative to the section 1404 of the cabinet, lock the bucket 1402 so that the bucket 1402 is unmovable relative to the section 1404 of the cabinet, carry the bucket 1402 to transport the bucket 1402 between different locations, etc. As described herein, the bucket manipulating device 802 may cause the bucket 1402 to transition between the locked state and the unlocked state by moving the latching system 820 of the bucket manipulating device 802 between the protruded state of the latching system 820 and the retracted state of the latching system 820 when the latching system 820 is coupled to the bucket 1402 with the coupling portion 824 of the latching system 820 coupled to the handle of the bucket 1402. Thus, the operations to operate or manipulate the bucket 1402 may be simplified, thereby facilitating the industrial robot in autonomously interacting with the bucket 1402.

In addition, the bucket manipulating device 802 may include 1 motor (e.g., the motor 840) and 2 axes of movements. The 2 axes of movements associated with the bucket manipulating device 802 may include the translation movement (e.g., the translation of the latching system 820 between its protruded state and its retracted state) and the rotation movement (e.g., the rotation of the coupling portion 824 relative to the base portion 822 in the latching system 820). Thus, the bucket manipulating device 802 may have a simple device structure and configuration, and therefore the cost of the bucket manipulating device 802 may be reduced and the operations of the bucket manipulating device 802 may be simplified.

As described herein, the bucket manipulating device 802 may be used by a robotic system such as an industrial robot. For example, the bucket manipulating device 802 may be coupled to the industrial robot as an end effector of the industrial robot and the industrial robot may use the bucket manipulating device 802 to autonomously interact with the bucket 1402 in the manner described herein. Additionally or alternatively, the bucket manipulating device 802 may not be integrated in the industrial robot as part of the industrial robot. In this case, the industrial robot may use the bucket manipulating device 802 as a tool device to autonomously interact with the bucket 1402 in the manner described herein. In some embodiments, the bucket manipulating device 802 may also be used by a human worker to interact with the bucket 1402 in a similar manner.

The foregoing description has been presented for the purposes of illustration and description. It is not intended to be exhaustive or to limit the specification to the precise form disclosed. Many modifications and variations are possible in light of the above teaching. It is intended that the scope of the disclosure is not limited by this detailed description and the modifications and variations that fall within the spirit and scope of the appended claims are included. As will be understood by those familiar with the art, the specification may be embodied in other specific forms without departing from the spirit or essential characteristics thereof.

In particular and with regard to various functions performed by the above-described components, devices, circuits, systems, and/or the like, the terms (including a reference to a "means") used to describe such components are intended to correspond, unless otherwise indicated, to any component which performs the specified function of the described component (e.g., a functional equivalent), even if such component may not be structurally equivalent to the described structure, which illustrates exemplary aspects of the present disclosure. In this regard, it should also be recognized that the present disclosure includes a system as well as a computer-readable medium having computer-executable instructions for performing the acts and/or events of various methods described herein.

In addition, while a particular feature of the present disclosure may have been disclosed with respect to only one of several implementations, such feature may be combined with one or more other features of the other implementations as may be desired and advantageous for a given application. Furthermore, to the extent that the terms "includes," and "including" and variants thereof are used in either the detailed description or the claims, these terms are intended to be inclusive in a manner similar to the term "comprising."

In this application, the word "exemplary" and "example" are used to mean serving as an example, instance, or illustration. Any aspect or design described herein as "exemplary" or "example" is not necessarily to be construed as preferred or advantageous over other aspects or designs. Instead, the use of the word "exemplary" and "example" is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from a computer-readable device, carrier, or media. For example, computer readable media may include, but are not limited to, magnetic storage devices (e.g., hard disk, floppy disk, magnetic strips, etc.), optical disks (e.g., compact disk (CD), digital versatile disk (DVD), etc.), smart cards, and flash memory devices (e.g., card, stick, key drive, etc.).

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A motor control cabinet, implemented in a motor control center, on which an operation is performable by an industrial robot, comprising:

a bucket placeable in a section of the motor control cabinet, wherein the bucket is configured to contain one or more industrial devices and is movable along an axis relative to the section;

a first interfacing device associated with the bucket, wherein the first interfacing device is associated with a first operation and a second operation distinct from the first operation, and the first interfacing device is operable by the industrial robot to perform the first operation or the second operation on the bucket;

a second interfacing device associated with the bucket, wherein the second interfacing device is associated with a third operation and operable by the industrial robot to perform the third operation on the bucket, and an interface of the second interfacing device and an interface of the first interfacing device are compatible with a same end effector of the industrial robot; and a third interfacing device associated with the bucket, wherein the third interfacing device includes an attachable interface removably attached to the third interfacing device, and the attachable interface of the third interfacing device is compatible with the same end effector of the industrial robot as the interface of the second interfacing device and the interface of the first interfacing device.

2. The motor control cabinet of claim 1, wherein: the first interfacing device includes a first device state corresponding to the first operation and a second device state corresponding to the second operation, wherein the second operation is performable after the first operation is performed.

3. The motor control cabinet of claim 2, wherein: the first device state of the first interfacing device corresponds to the first operation to disconnect power to the bucket; and the first interfacing device is positioned on a front surface of the bucket.

4. The motor control cabinet of claim 1, wherein: the interface of the first interfacing device is configured to minimize a number of degrees of freedom (DOF) for the industrial robot to couple to the first interfacing device and operate the first interfacing device in interacting with the first interfacing device.

5. The motor control cabinet of claim 1, wherein: the interface of the first interfacing device is a socket that has a predefined geometry to receive the end effector of the industrial robot, wherein the interface of the first interfacing device is rotatable by the end effector of the industrial robot when the end effector of the industrial robot is coupled to the first interfacing device at the interface of the first interfacing device; and the interface of the first interfacing device and the interface of the second interfacing device are identical.

6. The motor control cabinet of claim 1, wherein: the interface of the first interfacing device includes an alignment feature, wherein the alignment feature is configured to increase a tolerance for misalignment between the end effector of the industrial robot and the interface of the first interfacing device when the industrial robot couples the end effector of the industrial robot to the first interfacing device at the interface of the first interfacing device.

7. The motor control cabinet of claim 6, wherein: the alignment feature includes one or more of a chamfer and a fillet created on an edge of the interface of the first interfacing device.

8. The motor control cabinet of claim 1, further comprising:
a first slider bearing including a first slide securely mounted to the section of the motor control cabinet and a second slide slidable along the first slide;
a second slider bearing including the second slide and a third slide slidable along the second slide, wherein the third slide includes a bucket receiving extension configured to receive the bucket; and
wherein the first slider bearing and the second slider bearing are configured to support the bucket when the bucket is placed in the bucket receiving extension and at least a portion of the bucket is outside of the section.

9. The motor control cabinet of claim 8, wherein: the first slider bearing includes a roller bearing positioned between the first slide and the second slide, wherein the roller bearing is in physical contact with the first slide and the second slide to reduce friction when the first slide and the second slide move relative to one another; and
the second slider bearing includes an additional roller bearing positioned between the second slide and the third slide, wherein the additional roller bearing is in physical contact with the second slide and the third slide to reduce friction when the second slide and the third slide move relative to one another.

10. The motor control cabinet of claim 8, wherein: the bucket receiving extension includes one or more slots in which each slot is configured to receive a protrusion of the bucket when the bucket is placed in the bucket receiving extension.

11. The motor control cabinet of claim 10, wherein: a slot of the bucket receiving extension includes an alignment feature that is configured to increase a tolerance for misalignment between a protrusion corresponding to the slot and the slot when the bucket is placed in the bucket receiving extension.

12. The motor control cabinet of claim 11, wherein: the alignment feature includes one or more of a chamfer and a fillet created at a corner between an upper edge of the bucket receiving extension and a vertical edge of the slot.

13. The motor control cabinet of claim 8, wherein: the bucket receiving extension includes one or more slots that are configured to receive one or more protrusions positioned on a first side of the bucket;
the bucket receiving extension includes an alignment feature that is configured to increase a tolerance for misalignment between the bucket and a gap between the bucket receiving extension and an additional bucket receiving extension, wherein the additional bucket receiving extension includes one or more slots that are configured to receive one or more protrusions positioned on a second side of the bucket.

14. The motor control cabinet of claim 13, wherein: the alignment feature includes a chamfer created on an inner edge of the bucket receiving extension, wherein the inner edge of the bucket receiving extension is opposite to an inner edge of the additional bucket receiving extension.

15. The motor control cabinet of claim 1, further comprising one or more of:
a wireless power connection or a wireless data connection; or
a physical cable in which both power and data is communicated through the physical cable.

16. A motor control cabinet, implemented in a motor control center, on which an operation is performable by an industrial robot, comprising:
a bucket placeable in a section of the motor control cabinet, wherein the bucket is configured to contain one or more industrial devices and is movable along an axis relative to the section;
a first interfacing device associated with the bucket, wherein the first interfacing device is associated with a first operation and a second operation distinct from the first operation, and the first interfacing device is operable by the industrial robot to perform the first operation or the second operation on the bucket; and
a second interfacing device associated with the bucket, wherein the second interfacing device is associated with a third operation and operable by the industrial robot to perform the third operation on the bucket, and an interface of the second interfacing device and an interface of the first interfacing device are compatible with a same end effector of the industrial robot, wherein the interface of the first interfacing device includes an alignment feature, wherein the alignment feature is configured to increase a tolerance for misalignment between the end effector of the industrial robot and the interface of the first interfacing device when the industrial robot couples the end effector of the industrial robot to the first interfacing device at the interface of the first interfacing device, and wherein the alignment feature includes one or more of a chamfer and a fillet created on an edge of the interface of the first interfacing device.

17. A motor control cabinet, implemented in a motor control center, on which an operation is performable by an industrial robot, comprising:

a bucket placeable in a section of the motor control cabinet, wherein the bucket is configured to contain one or more industrial devices and is movable along an axis relative to the section;

a first interfacing device associated with the bucket, wherein the first interfacing device is associated with a first operation and a second operation distinct from the first operation, and the first interfacing device is operable by the industrial robot to perform the first operation or the second operation on the bucket;

a second interfacing device associated with the bucket, wherein the second interfacing device is associated with a third operation and operable by the industrial robot to perform the third operation on the bucket, and an interface of the second interfacing device and an interface of the first interfacing device are compatible with a same end effector of the industrial robot a first slider bearing including a first slide securely mounted to the section of the motor control cabinet and a second slide slidable along the first slide; and a second slider bearing including the second slide and a third slide slidable along the second slide, wherein the third slide includes a bucket receiving extension configured to receive the bucket, and wherein the first slider bearing and the second slider bearing are configured to support the bucket when the bucket is placed in the bucket receiving extension and at least a portion of the bucket is outside of the section.

18. The motor control cabinet of claim 17, wherein:

the first slider bearing includes a roller bearing positioned between the first slide and the second slide, wherein the roller bearing is in physical contact with the first slide and the second slide to reduce friction when the first slide and the second slide move relative to one another; and the second slider bearing includes an additional roller bearing positioned between the second slide and the third slide, wherein the additional roller bearing is in physical contact with the second slide and the third slide to reduce friction when the second slide and the third slide move relative to one another.

19. The motor control cabinet of claim 17, wherein the bucket receiving extension includes one or more slots in which each slot is configured to receive a protrusion of the bucket when the bucket is placed in the bucket receiving extension.

20. The motor control cabinet of claim 19, wherein a slot of the bucket receiving extension includes an alignment feature that is configured to increase a tolerance for misalignment between a protrusion corresponding to the slot and the slot when the bucket is placed in the bucket receiving extension.

* * * * *